US012369319B2

(12) United States Patent
Tobioka

(10) Patent No.: US 12,369,319 B2
(45) Date of Patent: Jul. 22, 2025

(54) THREE-DIMENSIONAL MEMORY DEVICE CONTAINING DUAL-DEPTH DRAIN-SELECT-LEVEL ISOLATION STRUCTURES AND METHODS FOR FORMING THE SAME

(71) Applicant: SANDISK TECHNOLOGIES LLC, Addison, TX (US)

(72) Inventor: Akihiro Tobioka, Nagoya (JP)

(73) Assignee: Sandisk Technologies, Inc., Milpitas, CA (US)

(*) Notice: Subject to any disclaimer, the term of this patent is extended or adjusted under 35 U.S.C. 154(b) by 556 days.

(21) Appl. No.: 17/804,184

(22) Filed: May 26, 2022

(65) Prior Publication Data

US 2023/0389308 A1 Nov. 30, 2023

(51) Int. Cl.

| | |
|---|---|
| ***H10B 41/35*** | (2023.01) |
| ***G11C 16/04*** | (2006.01) |
| ***H01L 23/522*** | (2006.01) |
| ***H01L 23/528*** | (2006.01) |
| ***H10B 41/10*** | (2023.01) |

(Continued)

(52) U.S. Cl.
CPC ......... *H10B 41/35* (2023.02); *G11C 16/0483* (2013.01); *H01L 23/5226* (2013.01); *H01L 23/5283* (2013.01); *H10B 41/10* (2023.02); *H10B 41/27* (2023.02); *H10B 43/10* (2023.02); *H10B 43/27* (2023.02); *H10B 43/35* (2023.02)

(58) Field of Classification Search
CPC ........ H10B 41/35; H10B 41/10; H10B 41/27; H10B 43/10; H10B 43/27; H10B 43/35; H10B 43/50; G11C 16/0483; H01L 23/5226; H01L 23/5283
USPC .......................................................... 257/314
See application file for complete search history.

(56) References Cited

U.S. PATENT DOCUMENTS 9,601,502 B2 3/2017 Sano et al.
9,960,181 B1 5/2018 Cui et al.
(Continued)

OTHER PUBLICATIONS

U.S. Appl. No. 17/081,458, filed Oct. 27, 2020, SanDisk Technologies LLC.
(Continued)

*Primary Examiner* — Norman D Richards
*Assistant Examiner* — Laura M Dykes
(74) *Attorney, Agent, or Firm* — THE MARBURY LAW GROUP PLLC

(57) ABSTRACT

A three-dimensional memory device includes an alternating stack of insulating layers and electrically conductive layers, memory openings vertically extending through the alternating stack, and memory opening fill structures located within a respective one of the memory openings. Composite drain-select-level isolation structures divide each drain-select-level electrically conductive layer into a respective plurality of electrically conductive strips. Each drain-select-level isolation structure includes a respective first drain-select-level isolation material portion vertically extending through each drain-select-level electrically conductive layers and a respective set of second drain-select-level isolation material portions vertically extending through each of the drain-select-level electrically conductive layers and at least a topmost dummy electrically conductive layer that underlies the drain-select-level electrically conductive layers.

7 Claims, 61 Drawing Sheets

(51) Int. Cl.

| | |
|---|---|
| ***H10B 41/27*** | (2023.01) |
| ***H10B 43/10*** | (2023.01) |
| ***H10B 43/27*** | (2023.01) |
| ***H10B 43/35*** | (2023.01) |

(56) References Cited

U.S. PATENT DOCUMENTS

| | | | | |
|---|---|---|---|---|
| 10,056,399 | B2 | 8/2018 | Costa et al. | |
| 10,622,367 | B1 | 4/2020 | Nishikawa et al. | |
| 10,861,873 | B2 | 12/2020 | Kim et al. | |
| 10,872,899 | B2 | 12/2020 | Kim et al. | |
| 10,903,237 | B1 | 1/2021 | Hosoda et al. | |
| 11,081,443 | B1 | 8/2021 | Mizutani et al. | |
| 11,322,483 | B1 | 5/2022 | Ogawa et al. | |
| 2015/0349109 | A1 * | 12/2015 | Lee | H01L 21/76816 257/314 |
| 2018/0182771 | A1 | 6/2018 | Costa et al. | |
| 2019/0252397 | A1 | 8/2019 | Sakamoto et al. | |
| 2020/0185408 | A1 * | 6/2020 | Song | H10B 41/50 |
| 2021/0143177 | A1 | 5/2021 | Shin et al. | |
| 2021/0249432 | A1 | 8/2021 | Eom | |
| 2021/0327805 | A1 | 10/2021 | Lee | |
| 2021/0335801 | A1 | 10/2021 | Yang et al. | |
| 2021/0366808 | A1 | 11/2021 | Cui et al. | |
| 2021/0366920 | A1 | 11/2021 | Tokita et al. | |
| 2021/0366924 | A1 | 11/2021 | Tokita et al. | |
| 2022/0005818 | A1 | 1/2022 | Tanaka et al. | |
| 2022/0005824 | A1 | 1/2022 | Tanaka et al. | |
| 2022/0045089 | A1 | 2/2022 | Mizutani et al. | |
| 2022/0045096 | A1 * | 2/2022 | Ryu | H10B 43/10 |
| 2022/0139441 | A1 | 5/2022 | Ogawa et al. | |
| 2023/0309307 | A1 * | 9/2023 | Baek | H10B 43/10 |

OTHER PUBLICATIONS

U.S. Appl. No. 17/226,321, filed Apr. 9, 2021, SanDisk Technologies LLC.

U.S. Appl. No. 17/397,678, filed Aug. 9, 2021, SanDisk Technologies LLC.

U.S. Appl. No. 17/397,777, filed Aug. 9, 2021, SanDisk Technologies LLC.

U.S. Appl. No. 17/397,846, filed Aug. 9, 2021, SanDisk Technologies LLC.

U.S. Appl. No. 17/556,298, filed Dec. 20, 2021, SanDisk Technologies LLC.

U.S. Appl. No. 17/663,951, filed May 18, 2022, SanDisk Technologies LLC.

U.S. Appl. No. 17/684,922, filed Mar. 2, 2022, SanDisk Technologies LLC.

U.S. Appl. No. 17/715,662, filed Apr. 7, 2022, SanDisk Technologies LLC.

ISR—Notification of Transmittal of The International Search Report and Written Opinion of the International Searching Authority for International Patent Application No. PCT/US2023/020564, mailed Aug. 23, 2023, 7 pages.

* cited by examiner

THREE-DIMENSIONAL MEMORY DEVICE CONTAINING DUAL-DEPTH DRAIN-SELECT-LEVEL ISOLATION STRUCTURES AND METHODS FOR FORMING THE SAME

FIELD

The present disclosure relates generally to the field of semiconductor devices and specifically to a three-dimensional memory device including dual-depth drain-select-level isolation structures and methods of making the same.

BACKGROUND

Three-dimensional memory devices may include memory stack structures. The memory stack structures extend through an alternating stack of insulating layers and electrically conductive layers. The memory stack structures include vertical stacks of memory elements provided at levels of the electrically conductive layers.

SUMMARY

According to an aspect of the present disclosure, a three-dimensional memory device is provided, which comprises: an alternating stack of insulating layers and electrically conductive layers that is laterally bounded by a first backside trench fill structure and a second backside trench fill structure, wherein the electrically conductive layers comprise, from bottom to top, word-line-level electrically conductive layers, dummy electrically conductive layers, and drain-select-level electrically conductive layers comprising a respective plurality of drain-select-level electrically conductive strips that are laterally spaced apart by composite drain-select-level isolation structures; memory openings vertically extending through the alternating stack; and memory opening fill structures located within a respective one of the memory openings and comprising a respective vertical semiconductor channel and a respective vertical stack of memory elements, wherein each of the composite drain-select-level isolation structures comprises: a respective first drain-select-level isolation material portion that vertically extends through each of the drain-select-level electrically conductive layers and has a respective bottom surface above a horizontal plane including a top surface of a topmost dummy electrically conductive layer of the dummy electrically conductive layers; and a respective set of second drain-select-level isolation material portions vertically extending through each of the drain-select-level electrically conductive layers and through at least the topmost dummy electrically conductive layer.

According to another aspect of the present disclosure, a method of forming a three-dimensional memory device is provided, which comprises: forming a combination of an alternating stack of insulating layers and electrically conductive layers and memory stack structures that vertically extend through the alternating stack, wherein each of the memory stack structures comprises a respective vertical semiconductor channel and a respective vertical stack of memory elements, and wherein the electrically conductive layers comprise, from bottom to top, word-line-level electrically conductive layers, dummy electrically conductive layers, and drain-select-level electrically conductive layers; forming discrete cavities through the drain-select-level electrically conductive layers by performing a first anisotropic etch process after formation of a first patterned etch mask over the alternating stack, wherein the first anisotropic etch process comprises an alternating sequence of multiple iterations of a first anisotropic selective etch step that etches a material of the insulating layers selective to a material of the drain-elect-level electrically conductive layers and a second anisotropic selective etch step that etches the material of the drain-select-level electrically conductive layers selective to the material of the insulating layers, and wherein the first anisotropic etch process etches through portions of each of the drain-select-level electrically conductive layers that are not masked by the first patterned etch mask; forming first drain-select-level isolation material portions in the discrete cavities; forming line trenches through the drain-select-level electrically conductive layers and through at least one dummy electrically conductive layer of the dummy electrically conductive layers by performing a second anisotropic etch process having an etch chemistry that simultaneously etches the material of the insulating layers and the material of the drain-select-level electrically conductive layers; and forming second drain-select-level isolation material portions in the line trenches to form composite drain-select-level isolation structures, wherein each of the composite drain-select-level isolation structures comprises a respective first drain-select-level isolation material portion and a respective set of second drains-select-level isolation material portions.

DETAILED DESCRIPTION

Figure 1A:
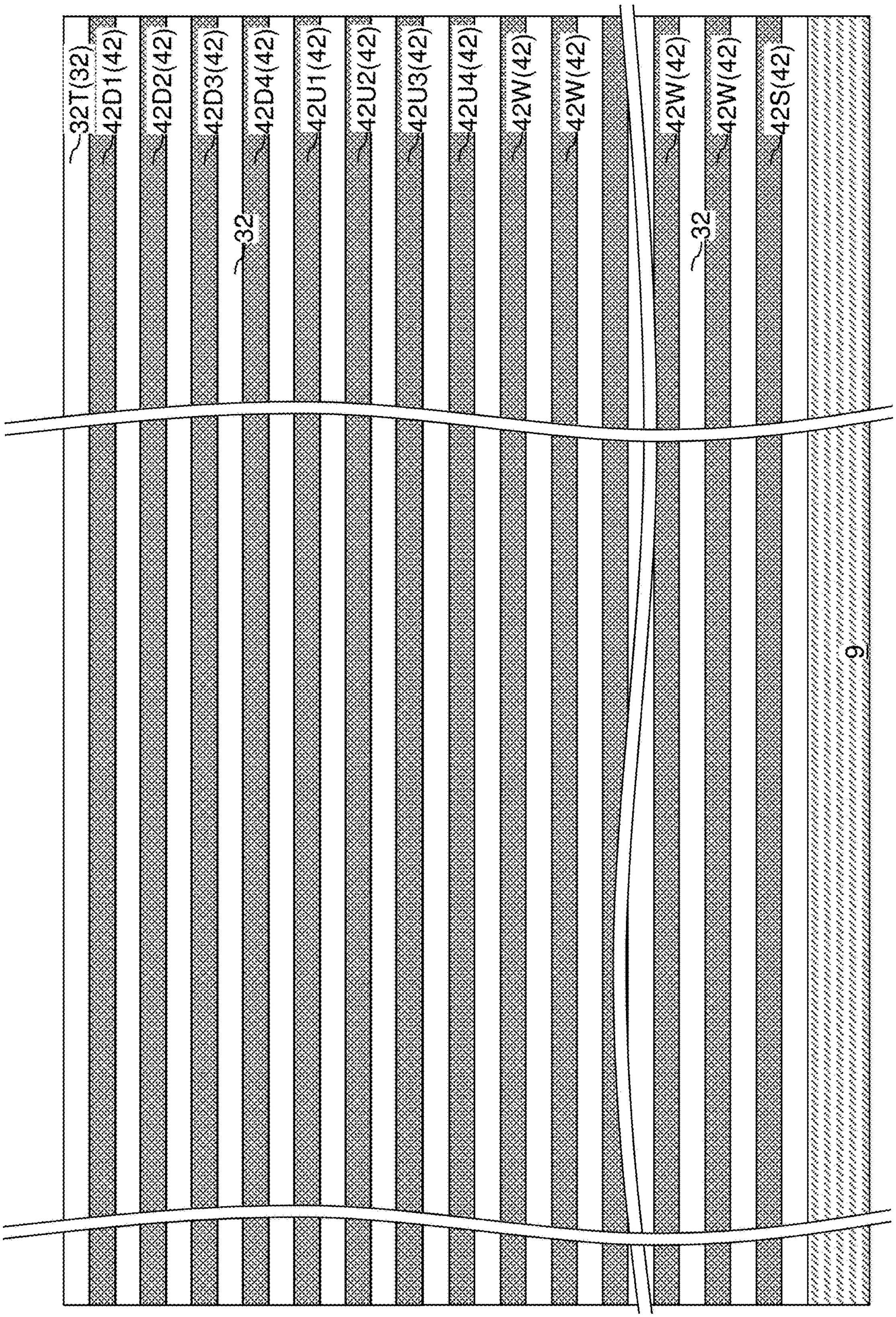
FIG. 1A is a vertical cross-sectional view of an exemplary structure after formation of an alternating stack of insulating layers and sacrificial material layers according to an embodiment of the present disclosure.

Embodiments of the present disclosure are directed to a three-dimensional memory device including dual-depth drain-select-level isolation structures and methods of making the same, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^{5}$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
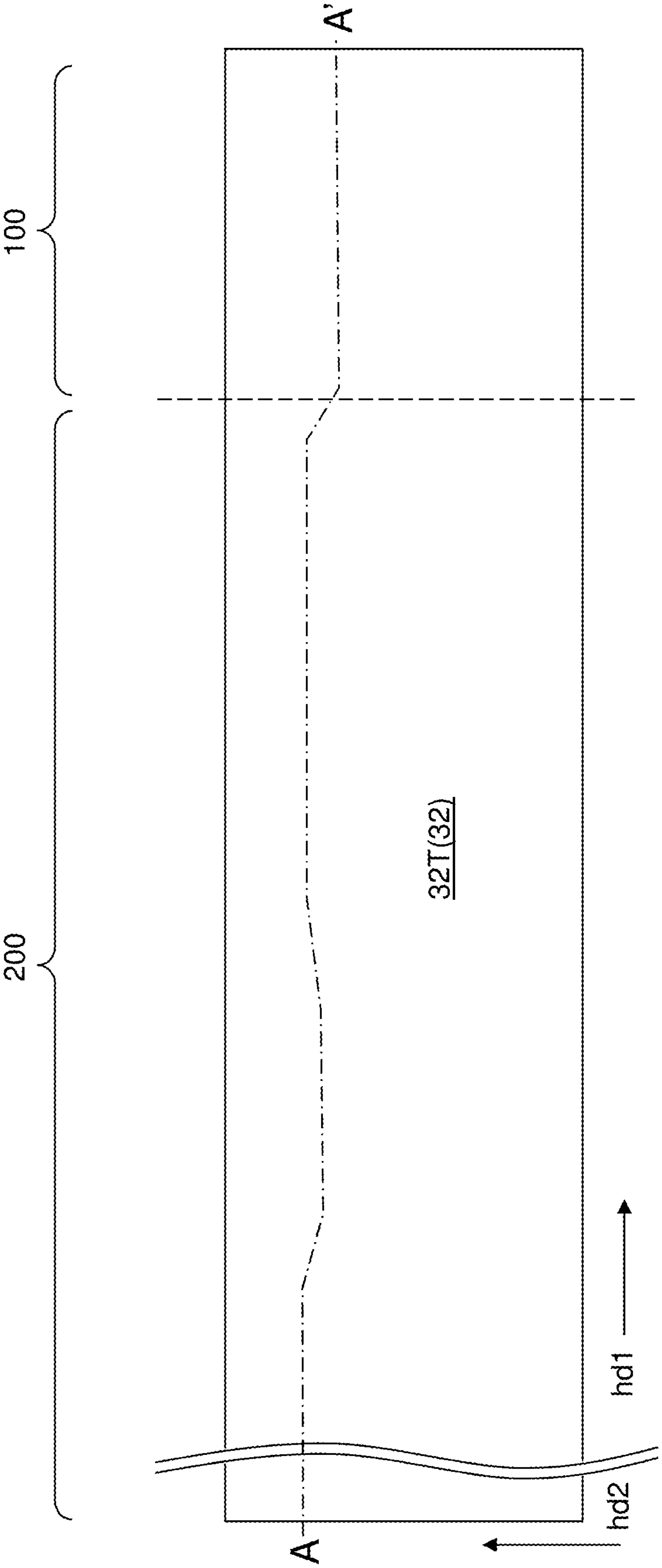
FIG. 1B is a top-down view of the exemplary structure of FIG. 1A. The vertical plane A-A' is the vertical cross-sectional plane of FIG. 1A.

Referring to FIGS. 1A and 1B, an exemplary structure according to an embodiment of the present disclosure is illustrated. The exemplary structure comprises a semiconductor material layer 9. The semiconductor material layer 9 may comprise a portion of a semiconductor substrate (e.g., a doped well in a semiconductor substrate, such as a silicon wafer), or may be formed over a semiconductor substrate by depositing or bonding a layer of a semiconductor material. The semiconductor material layer 9 may be single crystalline or polycrystalline. The semiconductor material layer 9 includes a semiconductor material such as silicon. The semiconductor material layer 9 may be doped with dopants of a first conductivity type, which may be p-type or n-type.

A stack of an alternating plurality of insulating layers 32 and sacrificial material layers 42 can be formed over the semiconductor material layer 9. The insulating layers 32 include an insulating material such as silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the insulating layers 32 can comprise, and/or consist essentially of, silicon oxide.

The sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can comprise, and/or consist essentially of, silicon nitride.

Figure 2A:
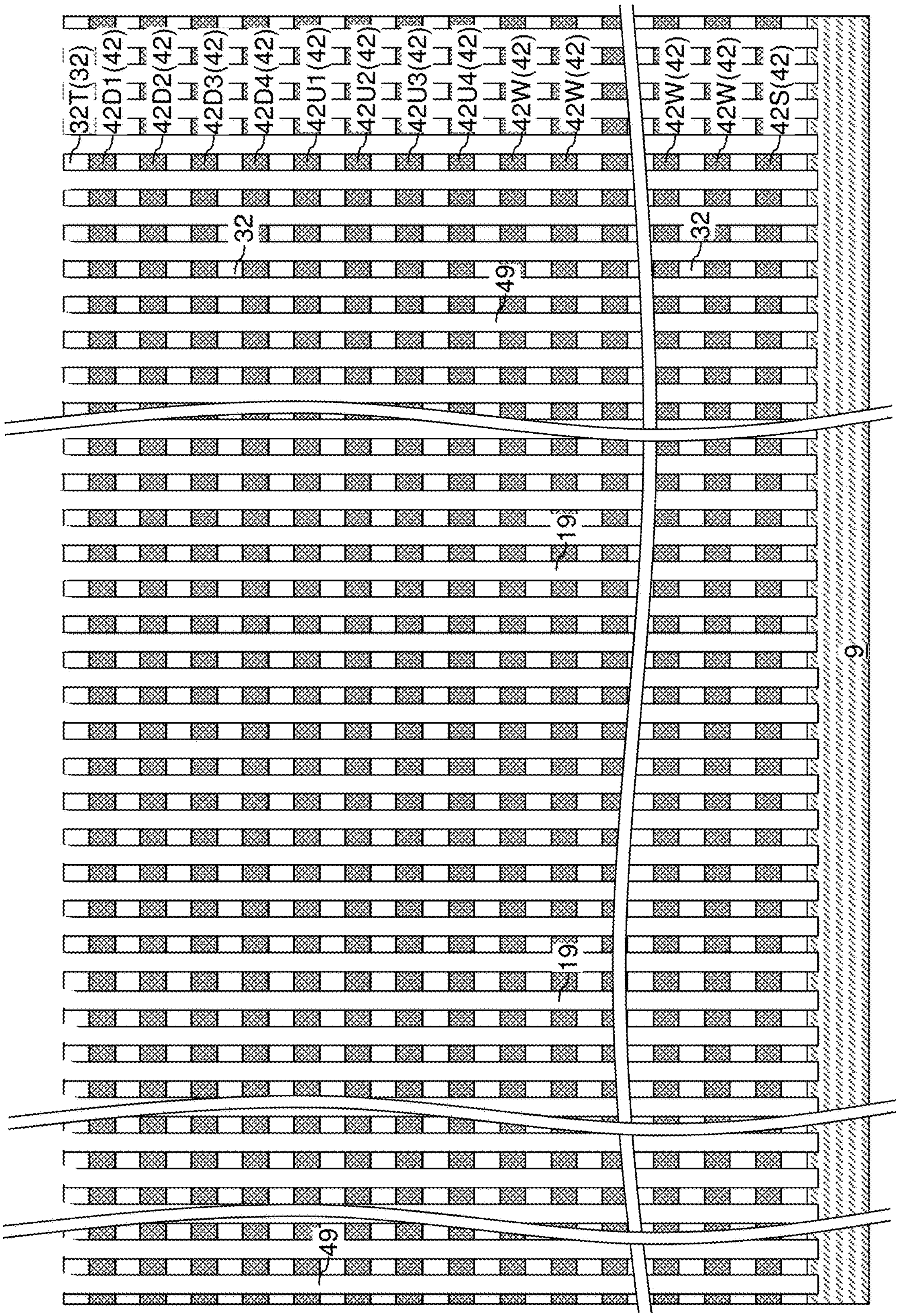
FIG. 2A is a vertical cross-sectional view of an exemplary structure after formation of memory openings and support openings according to an embodiment of the present disclosure.

The sacrificial material layers 42 may comprise different types of layers that are subsequently replaced with different types of electrically conductive layers. In one embodiment, the sacrificial material layers 42 may comprise a source-select-level sacrificial material layer 42S, word-line-level sacrificial material layers 42W, dummy sacrificial material layers 42U, and drain-select-level sacrificial material layers 42D. While one source-select-level sacrificial material layer 42S, a plurality of word-line-level sacrificial material layers 42W, 4 dummy sacrificial material layers 42U, and 4 drain-select-level sacrificial material layers 42D are illustrated in FIG. 2A, embodiments are expressly contemplated herein in which the total number of the drain-select-level sacrificial material layers 42D is in a range from 1 to 16 (such as from 2 to 8), and the total number of the dummy sacrificial material layers 42U is in a range from 1 to 16 (such as from 2 to 8). Furthermore, plural source-select-level sacrificial material layers 42S (e.g., two to six layers) may be provided in an alternative embodiment.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42. The topmost layer of the alternating stack (32, 42) may be a topmost insulating layer 32T, which is a topmost layer among the insulating layers 32.

While sacrificial material layers 42 that are subsequently replaced with electrically conductive layers are described above, embodiments are expressly contemplated herein in which the sacrificial material layers are formed as electrically conductive layers. In this case, steps for replacing the spacer material layers with electrically conductive layers can be omitted.

Figure 1C:
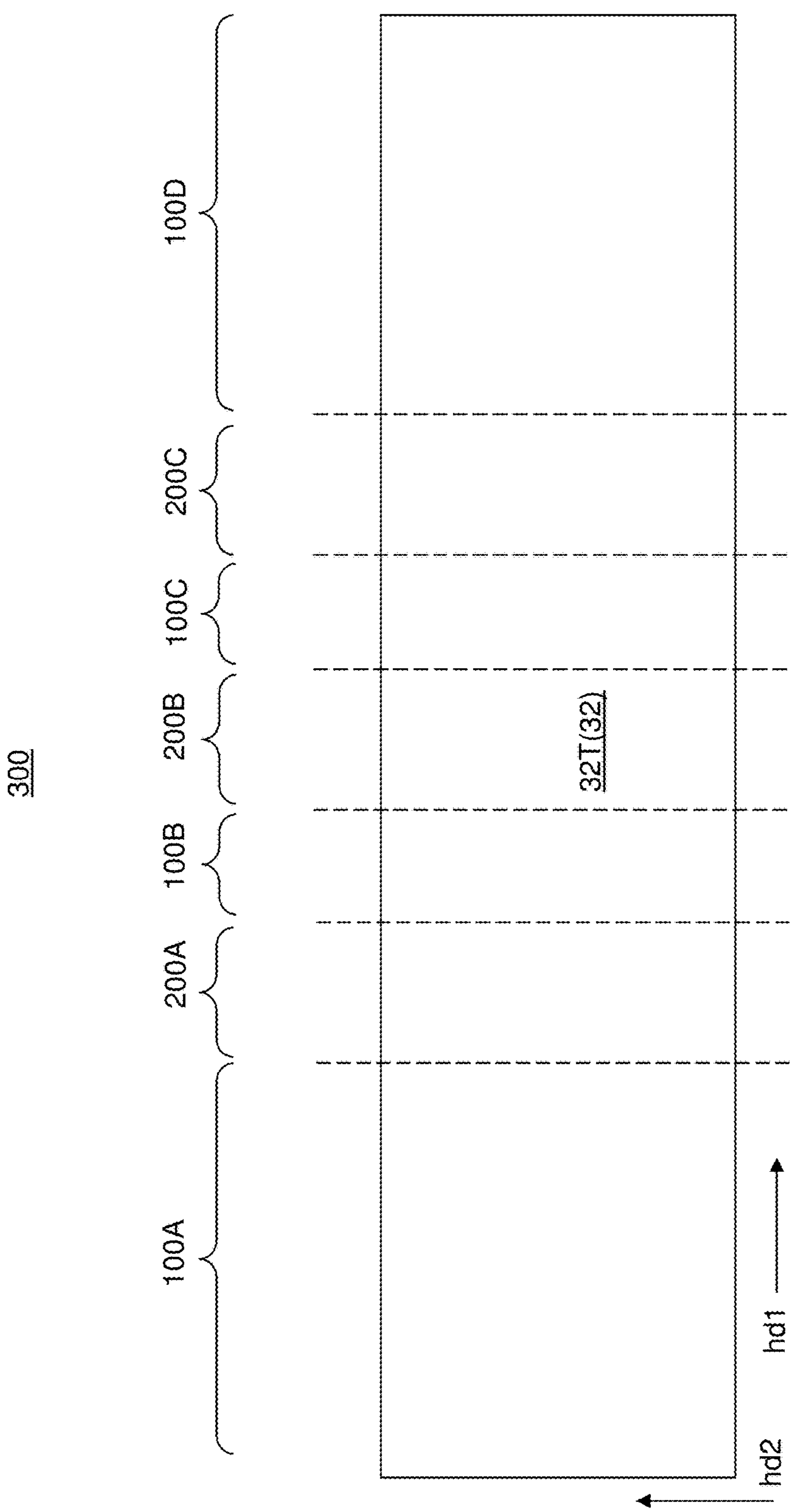
FIG. 1C is a top down view of a memory plane containing the exemplary structure of FIG. 1B.

FIG. 1C illustrates an embodiment memory plane 300 containing the first exemplary structure of FIGS. 1A and 1B. The memory plane 300 may include plural memory array regions (100A, 100B, 100C, 100D) and contact regions (200A, 200B, 200C) which laterally alternate along the first horizontal direction hd1. Alternative memory planes 300 having other region configurations may also be used.

Figure 2B:
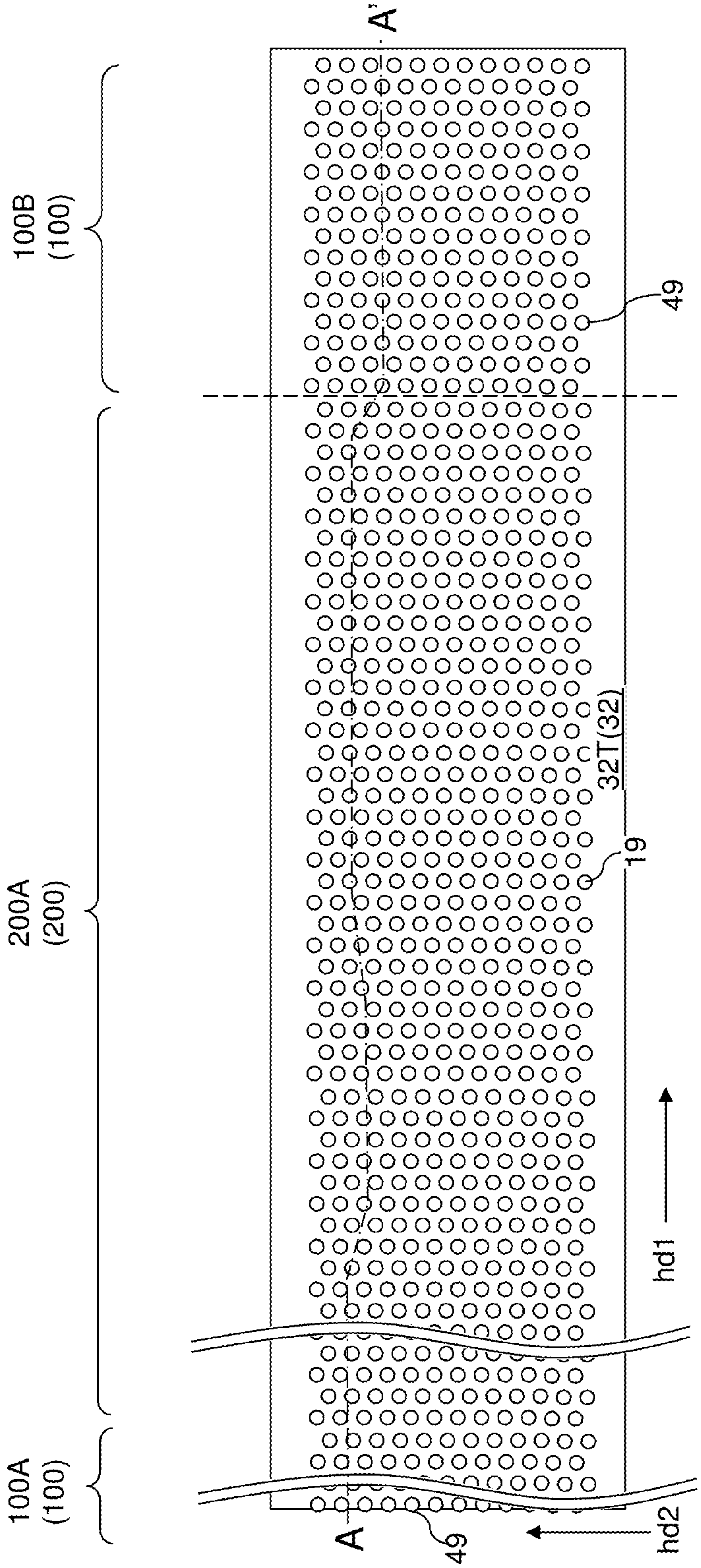
FIG. 2B is a top-down view of the exemplary structure of FIG. 2A. The vertical plane A-A' is the vertical cross-sectional plane of FIG. 2A.

Referring to FIGS. 2A and 2B, a lithographic material stack (not shown) including at least a photoresist layer can be formed over the topmost insulating layer 32T, and can be lithographically patterned to form openings therein. The openings include a first set of openings formed over one or more memory array regions 100 and a second set of openings formed over one or more contact regions 200. In one embodiment, the memory array regions 100 may comprise at least a first memory array region 100A and a second memory array region 100B that are laterally spaced apart along a first horizontal direction (e.g., word line direction) hd1. The contact region 200 (which may correspond to contact region 200A shown in FIG. 1C) may be located between the first memory array region 100A and the second array region 100B along the first horizontal direction, as shown in FIG. 1C. The pattern of the openings may include rows of openings that laterally extend along the first horizontal direction hd1. The rows of the openings in the lithographic material stack may be laterally spaced apart along the second horizontal direction (e.g., bit line direction) hd2.

The pattern in the lithographic material stack can be transferred through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed in the memory array regions 100. The support openings 19 are formed in the contact region 200.

The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 9. In one embodiment, an overetch into the semiconductor material layer 9 may be optionally performed after the top surface of the semiconductor material layer 9 is physically exposed at a bottom of each memory opening 49 and each support opening 19. The overetch may be performed prior to, or after, removal of the lithographic material stack. In other words, the recessed surfaces of the semiconductor material layer 9 may be vertically offset from the un-recessed top surfaces of the semiconductor material layer 9 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 9.

Each of the memory openings 49 and the support openings 19 may include a sidewall (or a plurality of sidewalls) that extends substantially perpendicular to the topmost surface of the substrate. A two-dimensional array of memory openings 49 can be formed in each memory array region 100. A two-dimensional array of support openings 19 can be formed in the contact region 200.

Figure 3A:
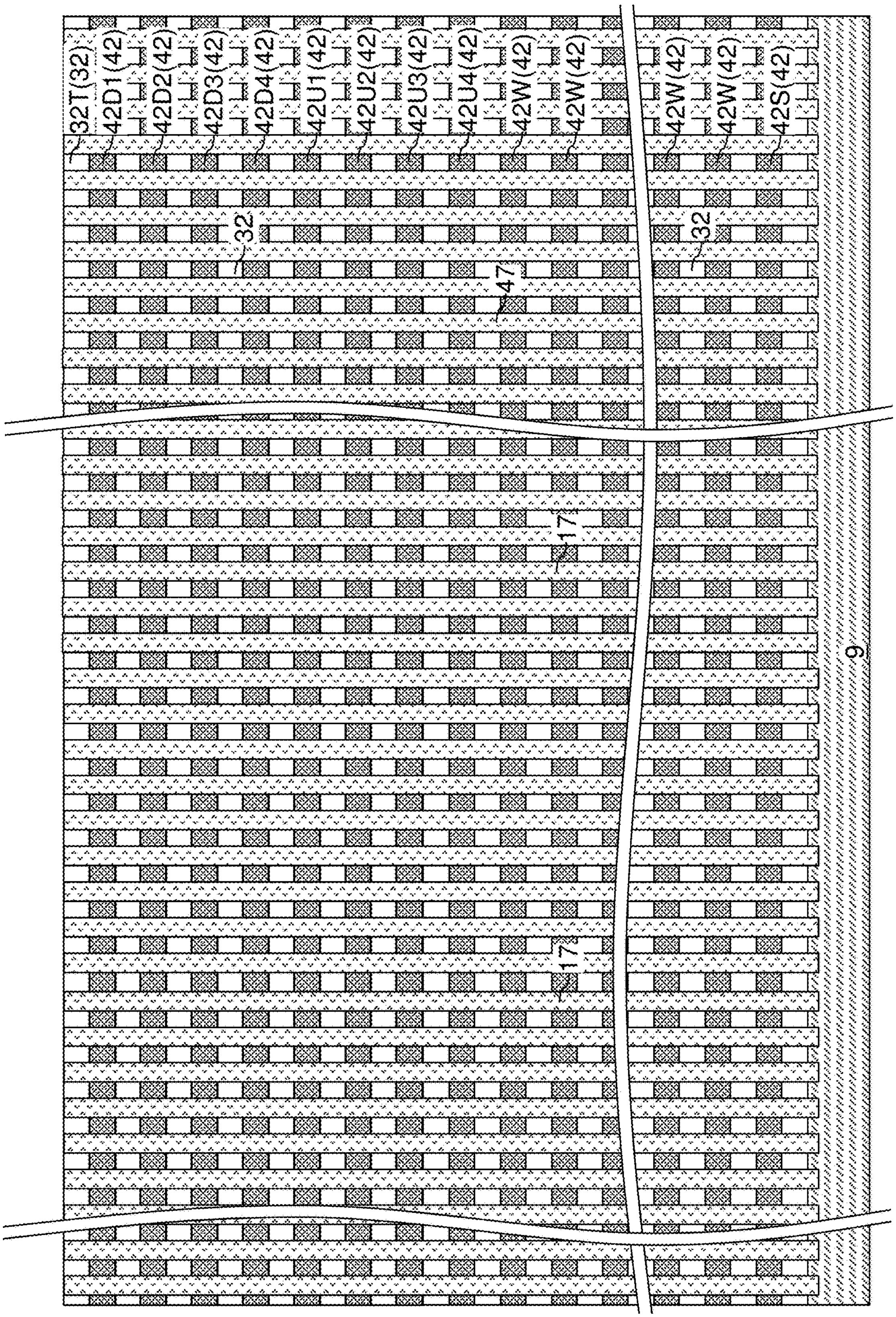
FIG. 3A is a vertical cross-sectional view of the exemplary structure after formation of sacrificial memory opening fill structures and sacrificial support opening fill structures according to an embodiment of the present disclosure.
Figure 3B:
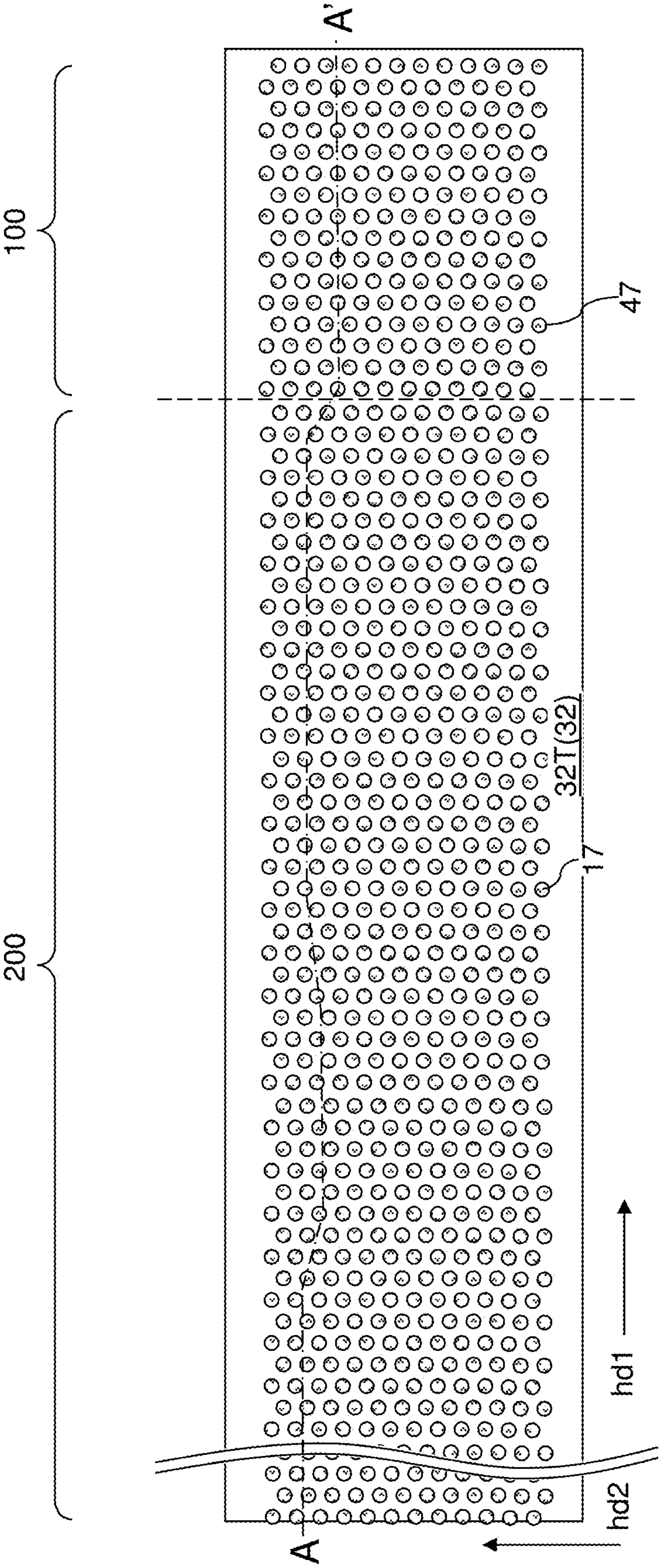
FIG. 3B is a top-down view of the exemplary structure of FIG. 3A. The vertical plane A-A' is the vertical cross-sectional plane of FIG. 3A.

Referring to FIGS. 3A and 3B, a sacrificial fill material can be deposited in the memory openings 49 and the support openings 19. The sacrificial fill material may be any material that may be removed selective to the materials of the insulating layers 32, the sacrificial material layers 42, and the semiconductor material layer 9. For example, the sacrificial fill material may comprise a carbon-based material such as amorphous carbon or diamond-like carbon, a semiconductor material such as a silicon-germanium alloy or amorphous silicon, or a dielectric material such as borosilicate glass or organosilicate glass. Optionally, a thin etch stop liner (not shown) may be employed to facilitate subsequent selective removal of the sacrificial fill material. Excess portions of the sacrificial fill material may be removed from above the horizontal plane including the top surface of the topmost insulating layer 32T. Each remaining portion of the sacrificial fill material filling a memory opening 49 constitutes a sacrificial memory opening fill structure 47. Each remaining portion of the sacrificial fill material filling a support opening 19 constitutes a sacrificial support opening fill structure 17.

Figure 4A:
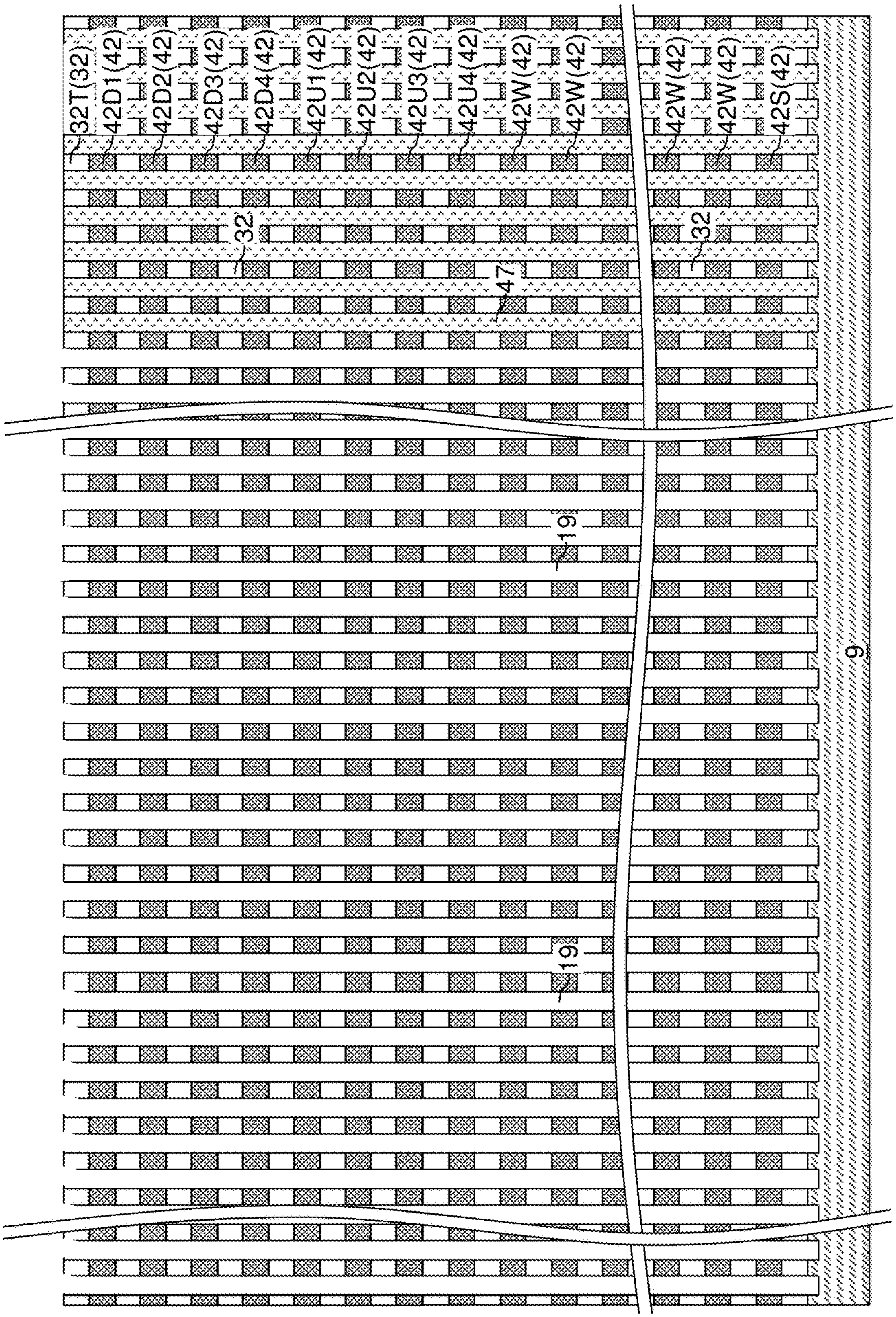
FIG. 4A is a vertical cross-sectional view of the exemplary structure after removal of sacrificial support opening fill structures according to an embodiment of the present disclosure.
Figure 4B:
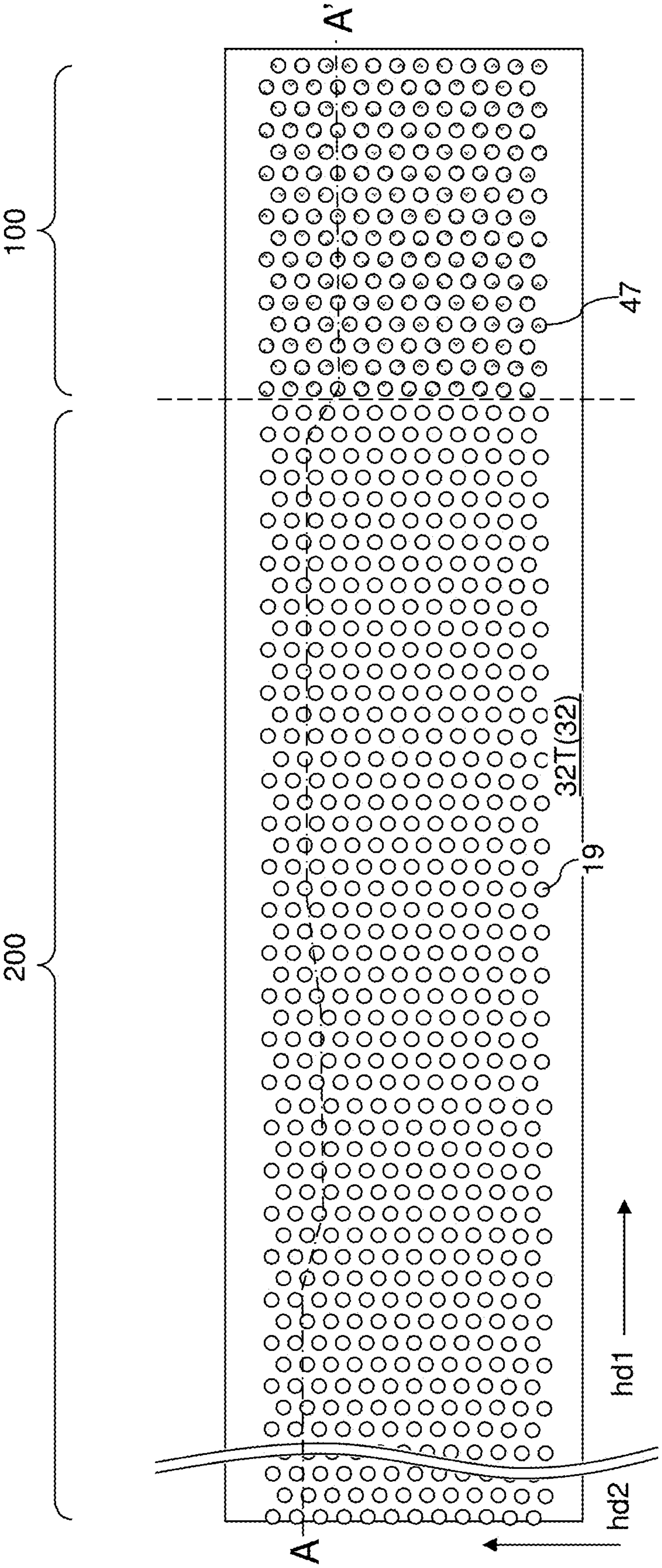
FIG. 4B is a top-down view of the exemplary structure of FIG. 4A. The vertical plane A-A' is the vertical cross-sectional plane of FIG. 4A.

Referring to FIGS. 4A and 4B, a photoresist layer (not shown) can be applied over the exemplary structure, and can be lithographically patterned to cover the memory array regions 100 while not covering the contact regions 200. The sacrificial support opening fill structures 17 can be removed by removing the sacrificial fill material within the areas that are not covered by the photoresist layer. The sacrificial fill material may be removed, for example, by ashing or by performing an etch process such as a wet etch process. Cavities are formed in the support openings 19. The photoresist layer can be removed, for example, by ashing.

Figure 5A:
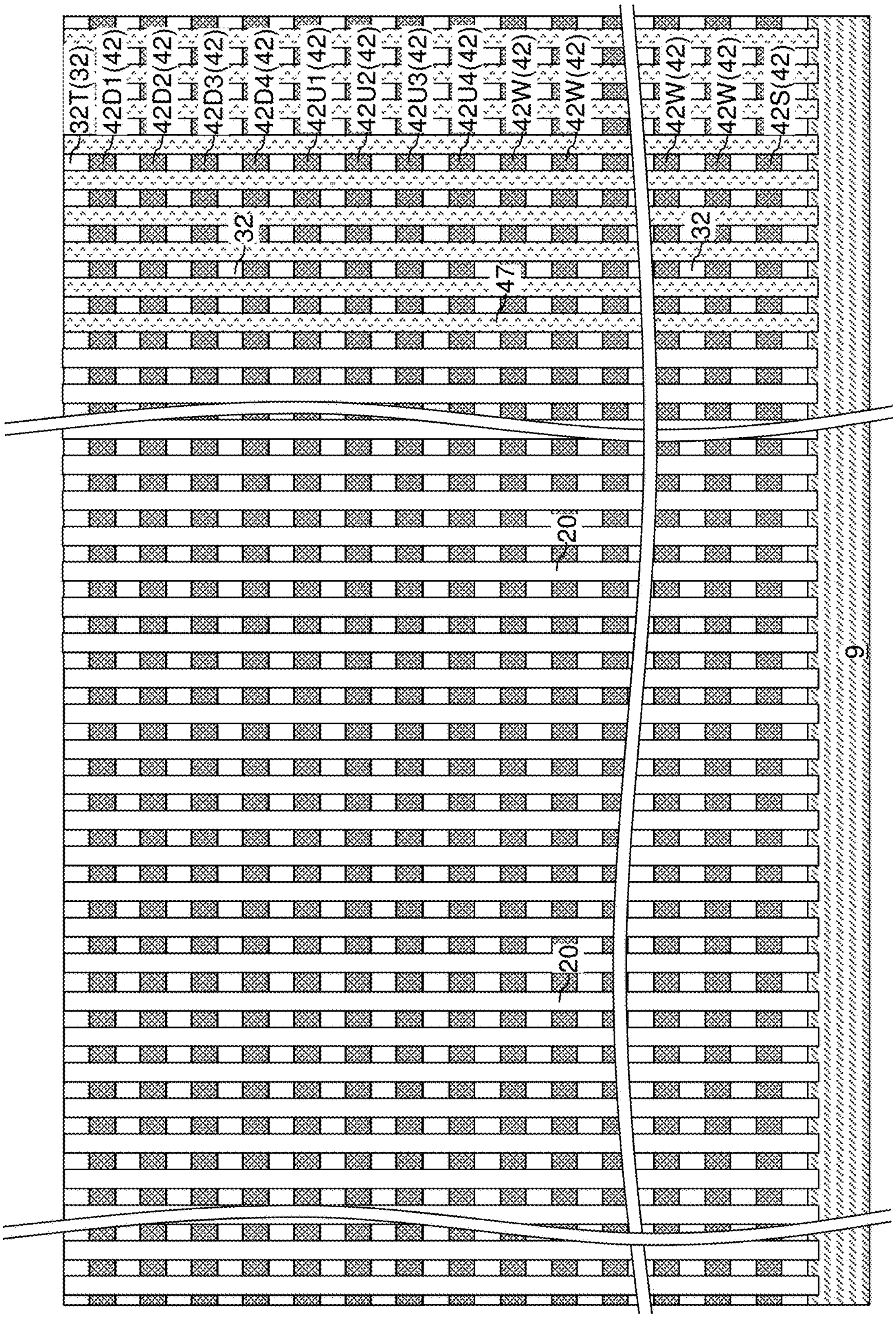
FIG. 5A is a vertical cross-sectional view of the exemplary structure after formation of support pillar structures according to an embodiment of the present disclosure.
Figure 5B:
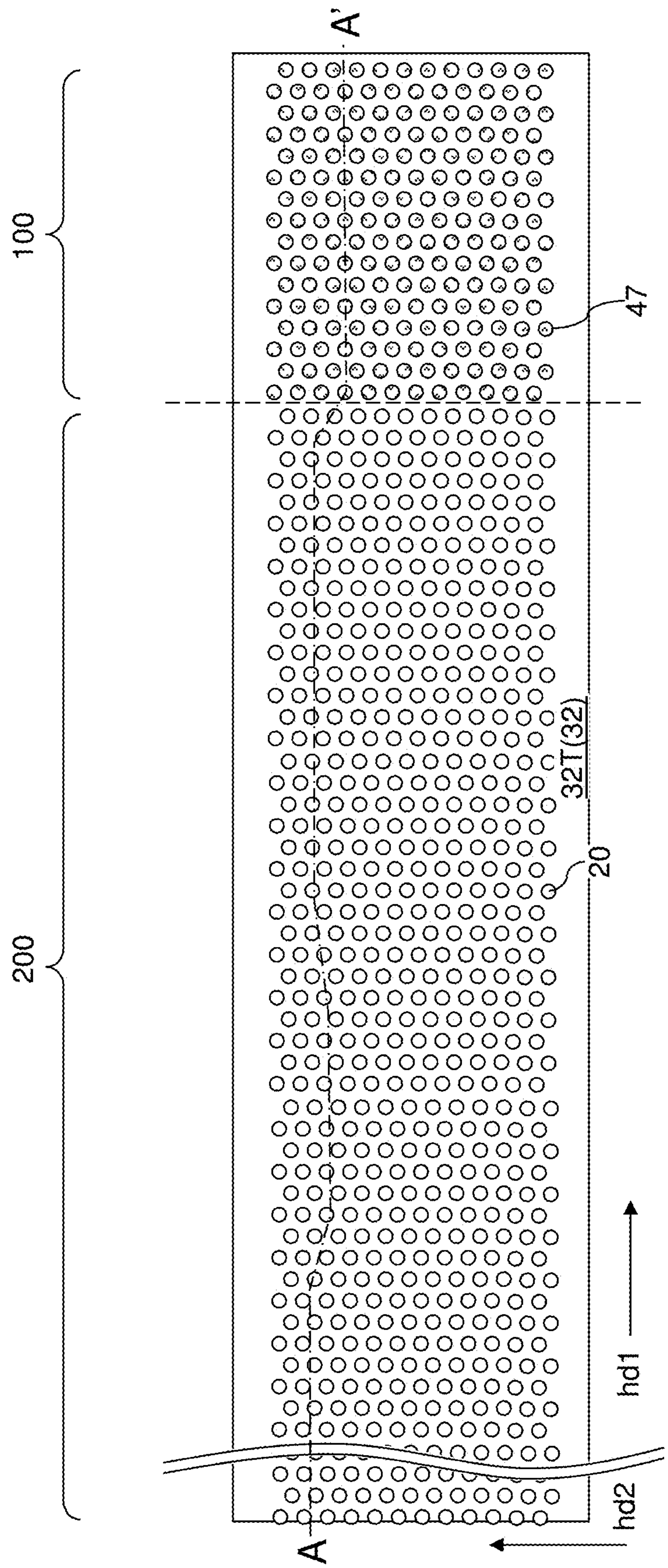
FIG. 5B is a top-down view of the exemplary structure of FIG. 5A. The vertical plane A-A' is the vertical cross-sectional plane of FIG. 5A.

Referring to FIGS. 5A and 5B, a dielectric fill material such as undoped silicate glass or a doped silicate glass can be deposited in the support openings 19 employing a conformal deposition process such as a chemical vapor deposition process. Portions of the dielectric fill material that overlie the topmost insulating layer 32T may be removed, for example, by performing an etch back process such as a wet etch process employing dilute hydrofluoric acid. Remaining portions of the dielectric fill material that fill the support openings 19 comprise support pillar structures 20, which are dielectric pillar structures that provide structural support to the exemplary structure during a subsequent processing step in which the sacrificial material layers 42 are removed.

Figure 6A:
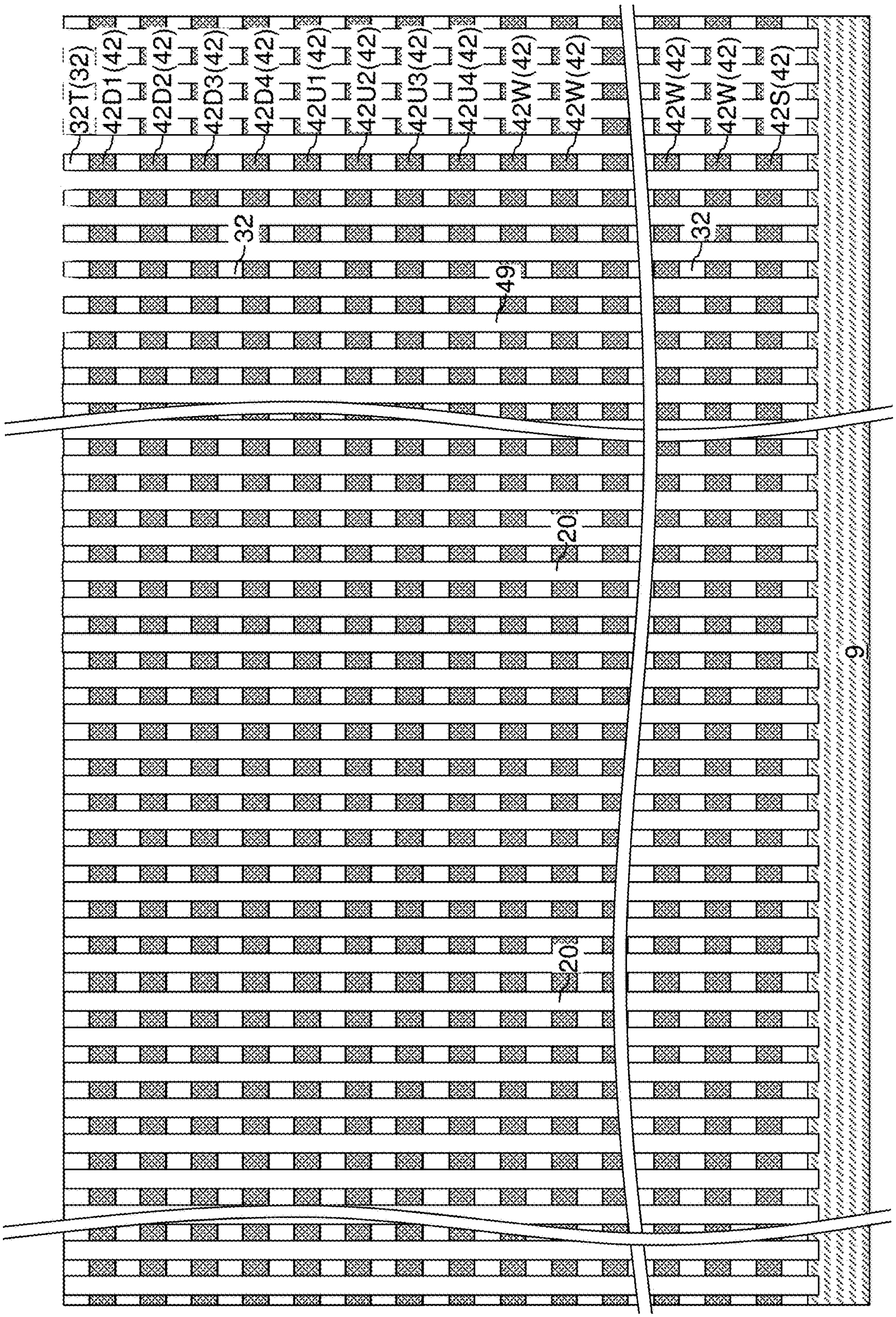
FIG. 6A is a vertical cross-sectional view of the exemplary structure after removal of sacrificial memory opening fill structures according to an embodiment of the present disclosure.
Figure 6B:
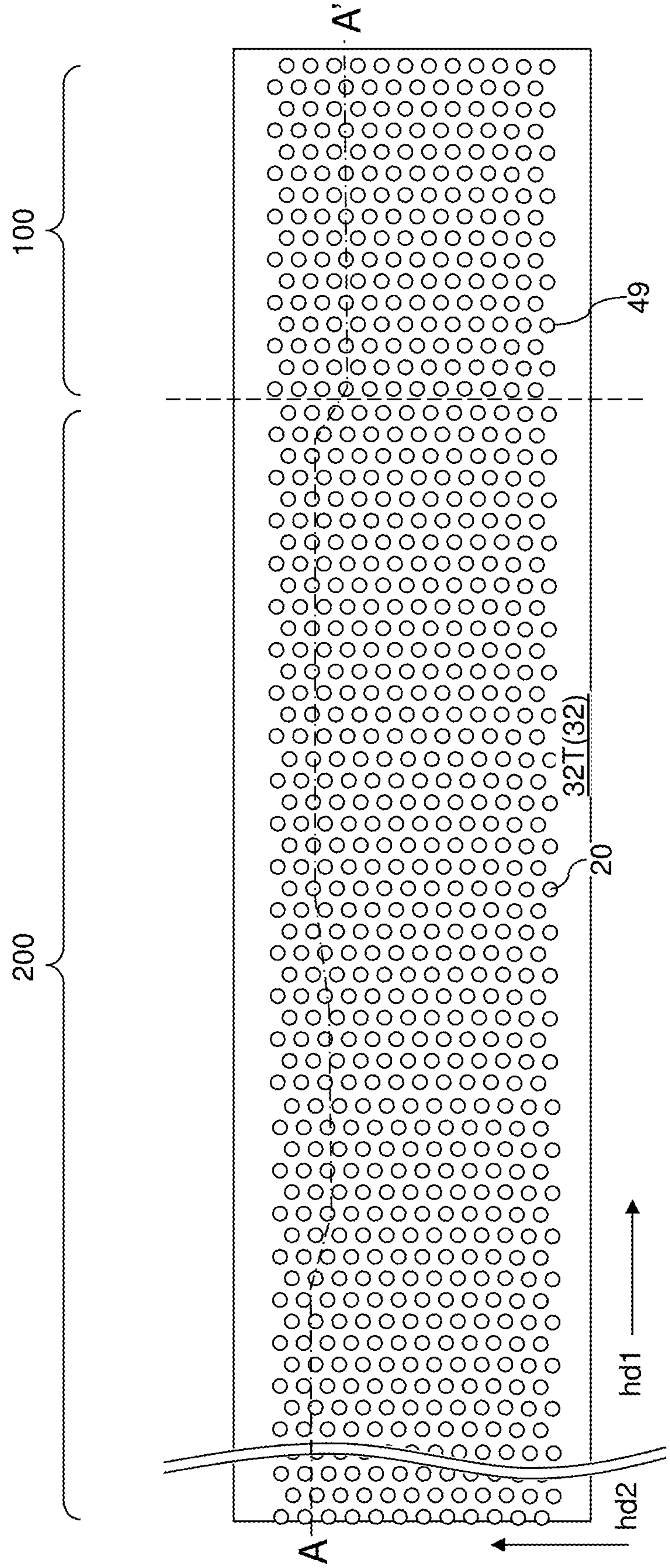
FIG. 6B is a top-down view of the exemplary structure of FIG. 6A. The vertical plane A-A' is the vertical cross-sectional plane of FIG. 6A.

Referring to FIGS. 6A and 6B, the sacrificial fill material of the sacrificial memory opening fill structures 47 can be removed selective to the materials of the insulating layers 32, the sacrificial material layers 42, the semiconductor material layer 9, and the support pillar structures 20. The sacrificial memory opening fill structures 47 may be removed by ashing or by performing an etch process, such as a wet etch process. Cavities are formed in volumes from the which the sacrificial memory opening fill structures 47 are removed.

FIGS. 7A-7H is a vertical cross-sectional view of a memory opening during formation of a memory opening fill structure 58. The same structural change occurs simultaneously in each of the other memory openings 49

Figure 7B:
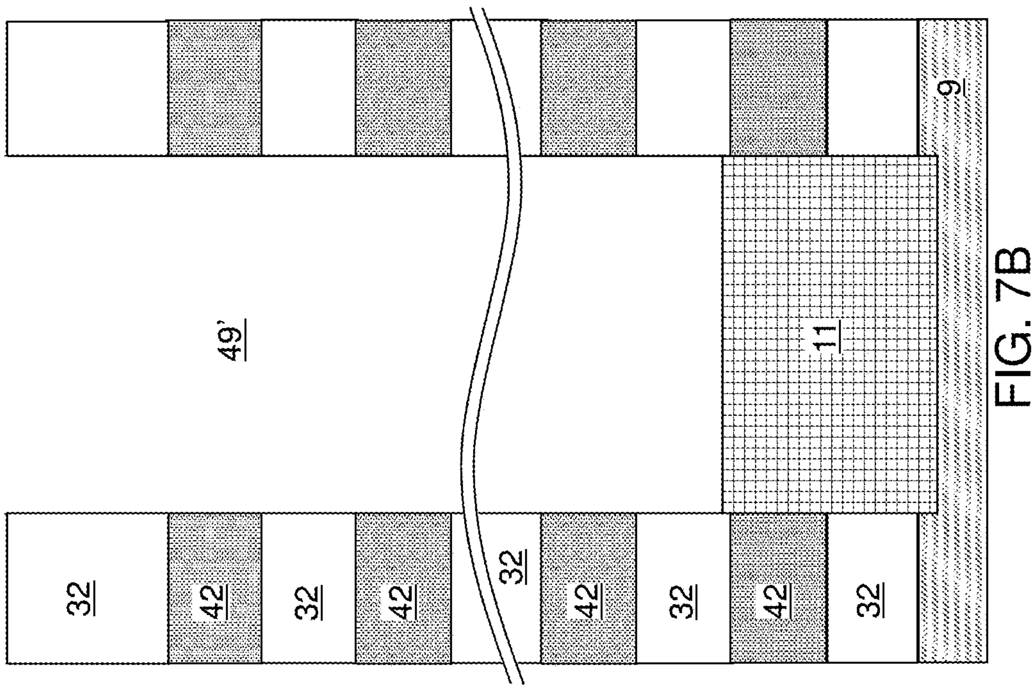
FIGS. 7A-7H are sequential vertical cross-sectional views of a memory opening during formation of a memory opening fill structure.
Figure 7A:
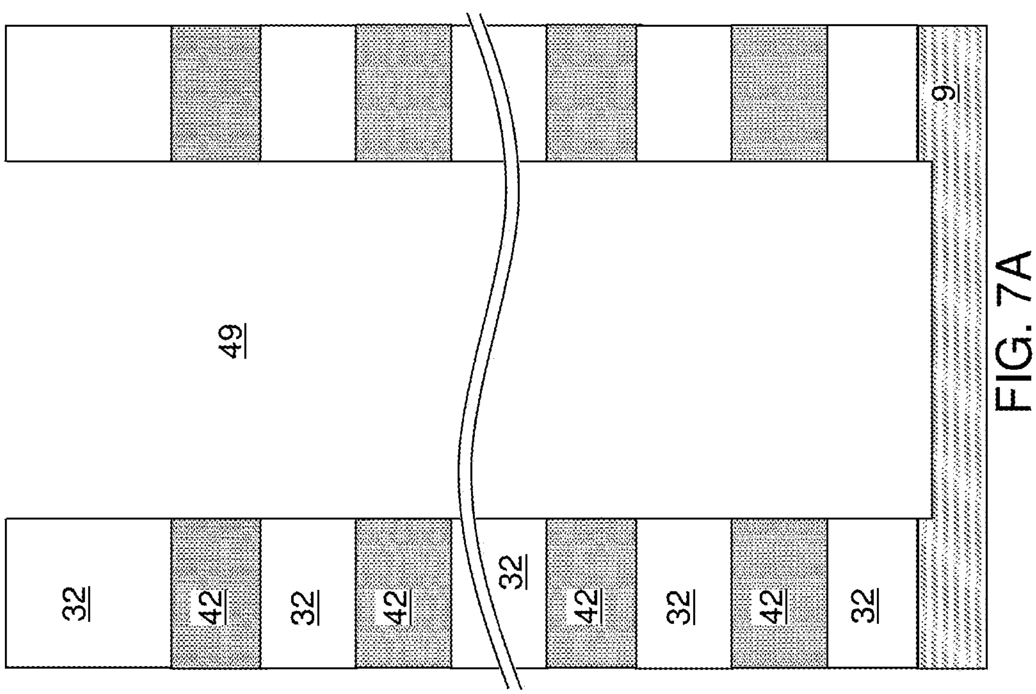

Referring to FIG. 7A, a memory opening 49 in the exemplary device structure of FIGS. 6A and 6B is illustrated. The memory opening 49 extends through the insulating cap layer 32T, the alternating stack (32, 42), and optionally into an upper portion of the semiconductor material layer 9. At this processing step, each support opening 19 can extend through subset of layers in the alternating stack (32, 42), and optionally through the upper portion of the semiconductor material layer 9. The recess depth of the bottom surface of each memory opening with respect to the top surface of the semiconductor material layer 9 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 7B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material (e.g., single crystal silicon) in epitaxial alignment with the single crystalline semiconductor material of the semiconductor material layer 9. In one embodiment, the pedestal channel portion 11 can be doped with electrical dopants of the same conductivity type as the semiconductor material layer 9. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the semiconductor material layer (e.g., doped well in a silicon wafer) 9 and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 9 that the pedestal channel portion contacts.

Figures 7C, 7D:
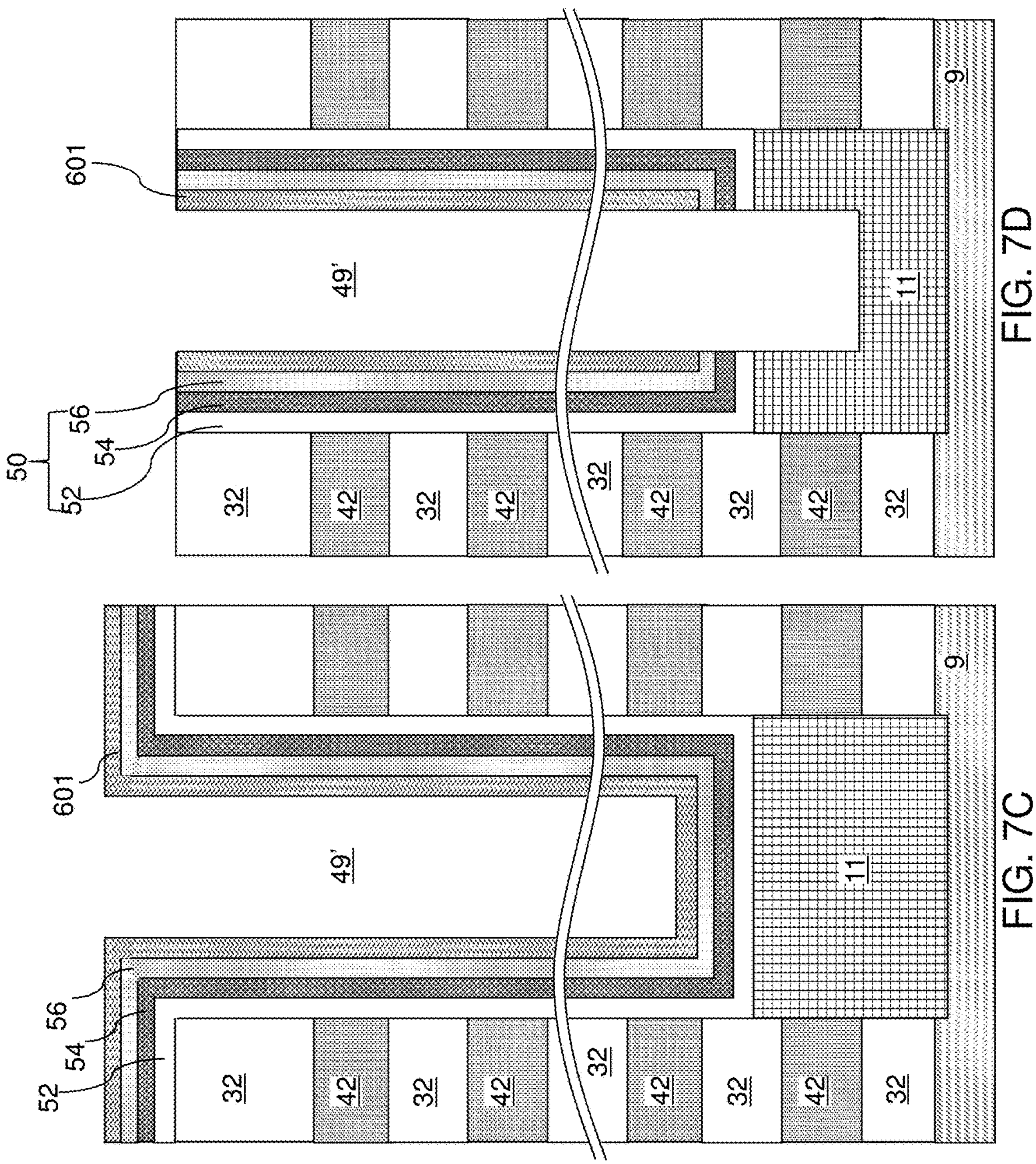

Referring to FIG. 7C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. Generally, the memory material layer 54 may comprise any memory material that can store a data bit. The data bit may be stored in the form of electrical charges trapped therein, in the form of a resistive state of a material due to changes in the material phase, resistivity, or a ferroelectric property. In one embodiment, the memory material layer 54 may comprise a charge storage layer. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the memory material layer 54 is described above as a single continuous layer, embodiments are expressly contemplated herein in which the memory material layer 54 is replaced with a plurality of memory material portions (which can be discrete charge trapping material portions or electrically isolated conductive material floating gate that are vertically spaced apart). The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. In one embodiment, the dielectric material liner 56 may comprise a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunneling dielectric layer can be in a range from 2 nm to 20 nm, although lesser and greater thicknesses can also be employed. Alternatively, a different type of dielectric material layer may be employed as the dielectric material liner 56.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 7D, the optional sacrificial cover material layer 601, the dielectric material liner 56, the memory material layer 54, and the blocking dielectric layer 52 overlying the insulating cap layer 32T are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 32T can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 9 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 9 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes amorphous silicon, a wet etch process employing hot trimethyl-2 hydroxyethyl ammonium hydroxide ("hot TMY") or tetramethyl ammonium hydroxide (TMAH) can be performed to remove the sacrificial cover material layer 601.

Figure 7F:
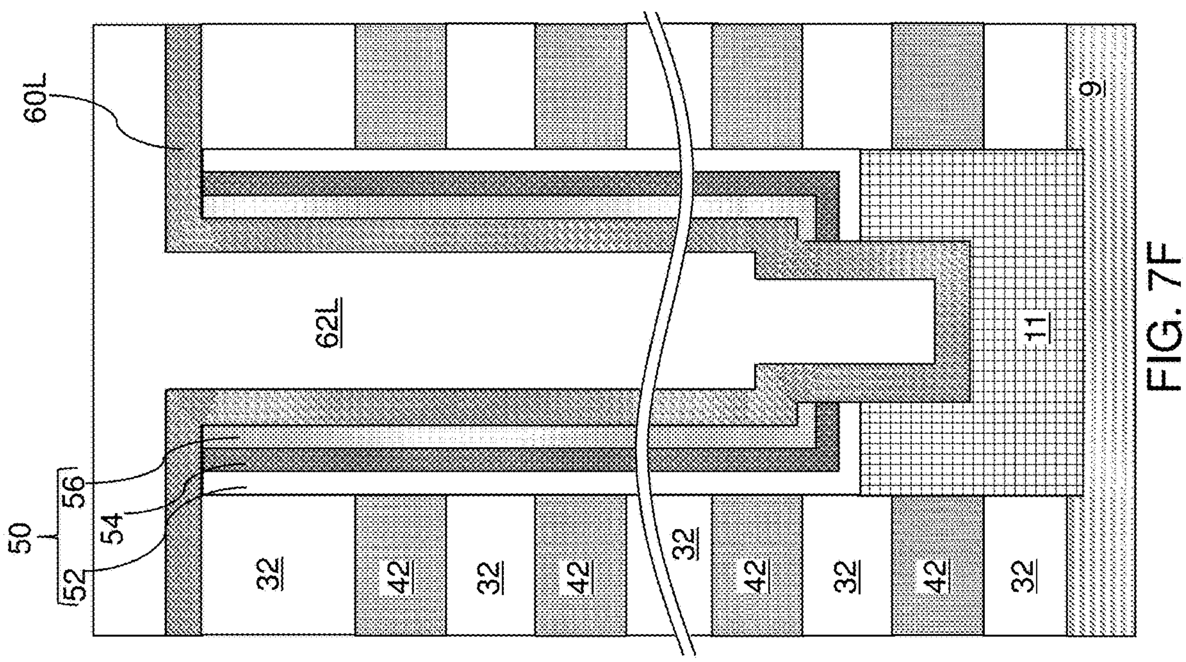
Figure 7E:
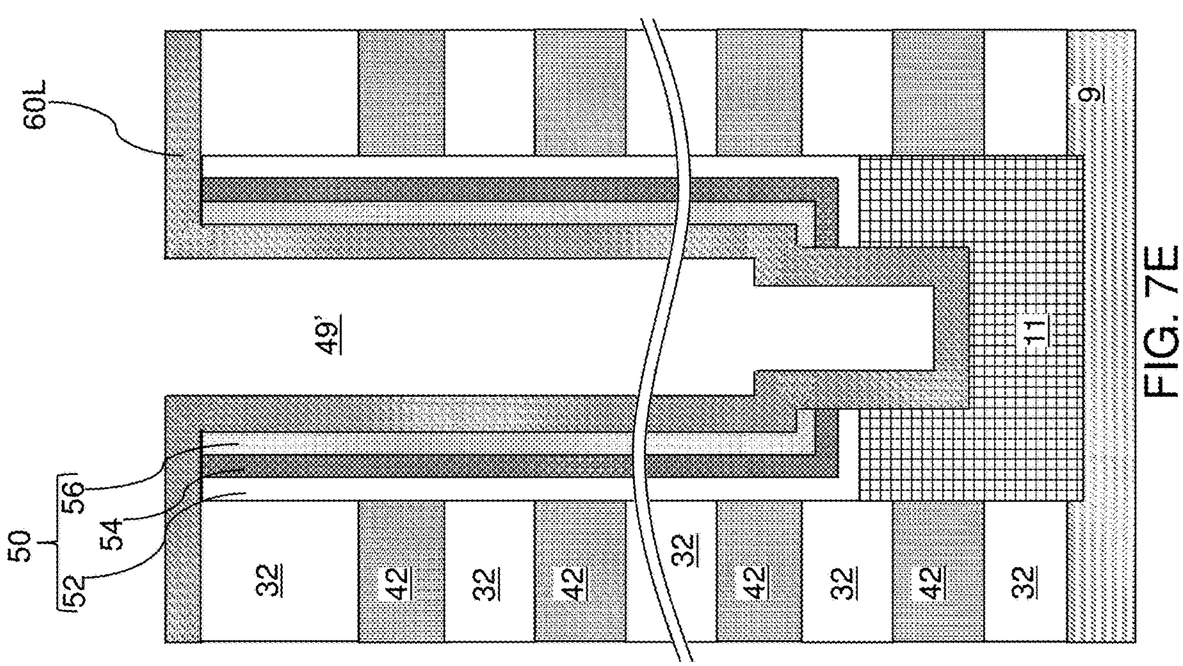

Referring to FIG. 7E, a semiconductor channel layer 60L can be deposited directly on the semiconductor surface of the pedestal channel portion 11 or the semiconductor material layer 9 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 9 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 7F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 7H:
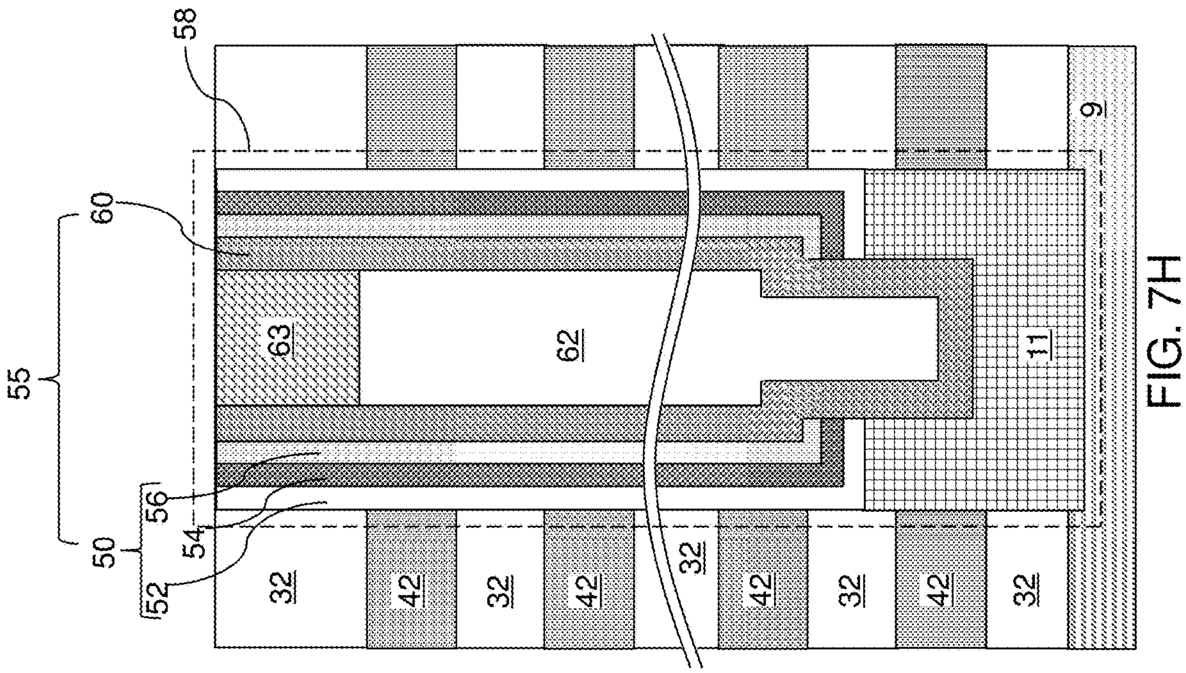
Figure 7G:
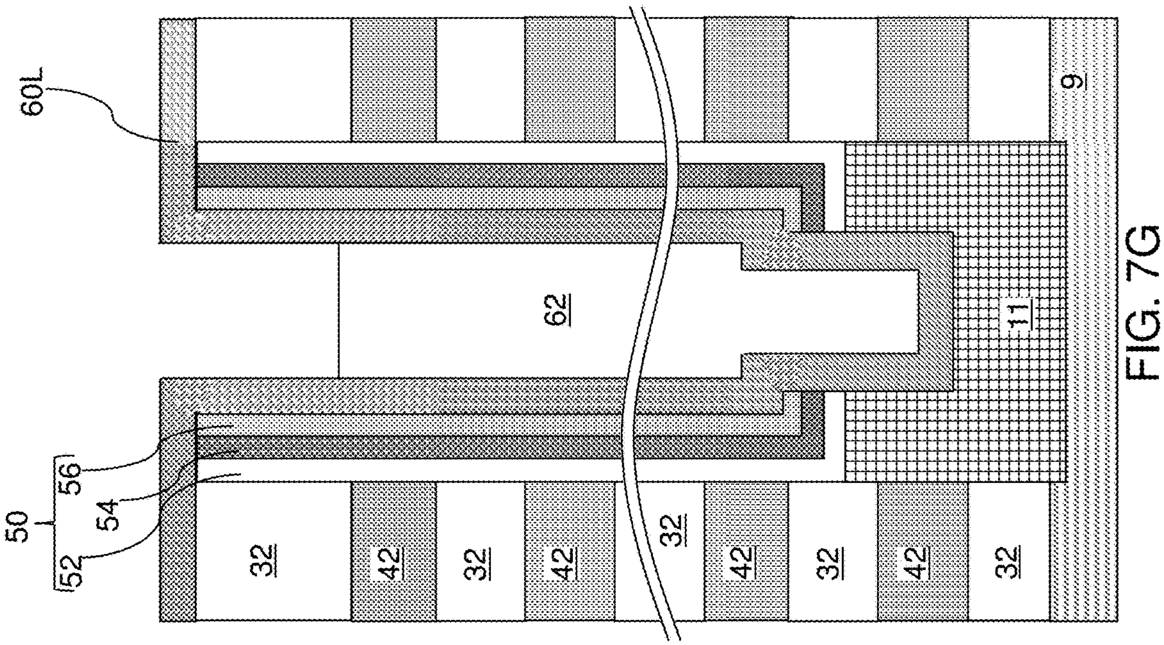

Referring to FIG. 7G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 32T. Each remaining portion of the dielectric core layer 62L constitutes a dielectric core 62.

Referring to FIG. 7H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case a blocking dielectric layer 52 is present in each memory opening fill structure 58, the blocking dielectric layer 52 may be formed on a sidewall of a memory opening 49, and the vertical stack of memory elements (which comprise portions of the memory material layer 54) may be formed on the blocking dielectric layer 52. In one embodiment, the vertical stack of memory elements comprises portions of a charge storage layer (e.g., the memory material layer 54) located at the levels of the sacrificial material layers 42. In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer and the tunneling dielectric layer can be located between the charge storage layer and the vertical semiconductor channel 60. A vertical NAND string can be formed through each memory opening upon subsequent replacement of the sacrificial material layers 42 with electrically conductive layers.

Figure 8A:
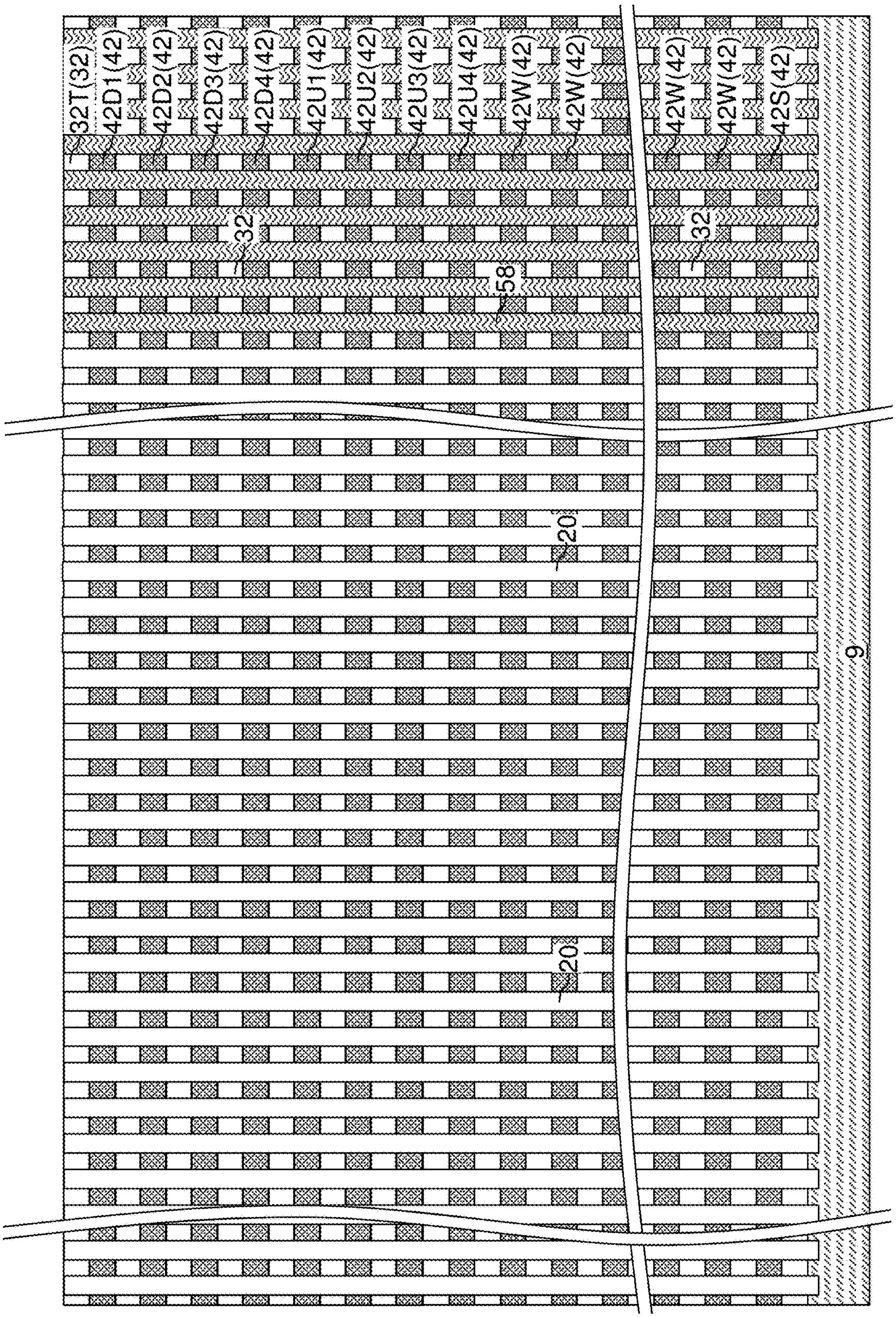
FIG. 8A is a vertical cross-sectional view of the exemplary structure after formation of memory opening fill structures according to an embodiment of the present disclosure.
Figure 8B:
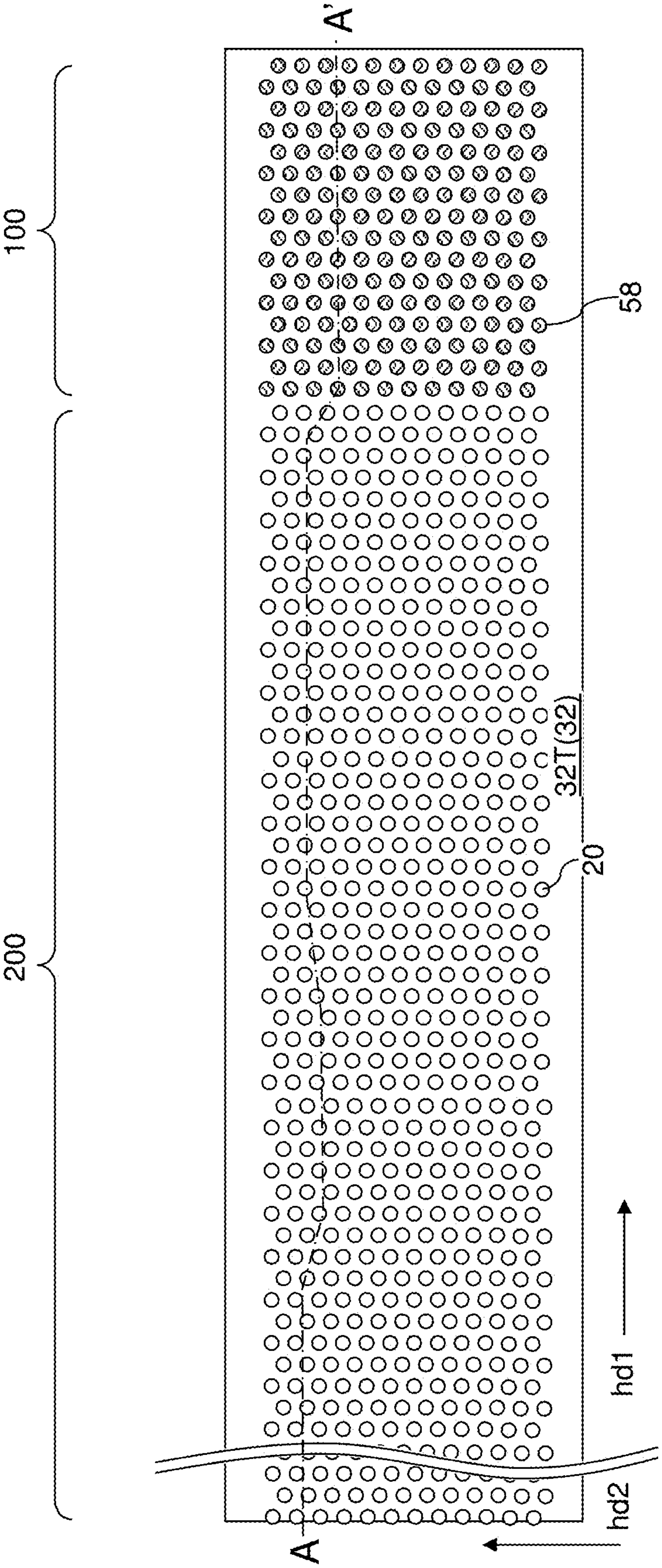
FIG. 8B is a top-down view of the exemplary structure of FIG. 8A. The vertical plane A-A' is the vertical cross-sectional plane of FIG. 8A.

Referring to FIGS. 8A and 8B, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 6A and 6B. An instance of the support pillar structure 20 can be formed within each support opening 19 of the structure of FIGS. 6A and 6B. While one illustrated configuration for the memory stack structure is described, the methods of the present disclosure can be applied to alternative memory stack structures including different layer stacks or structures for the memory film 50 and/or for the vertical semiconductor channel 60.

Figure 9A:
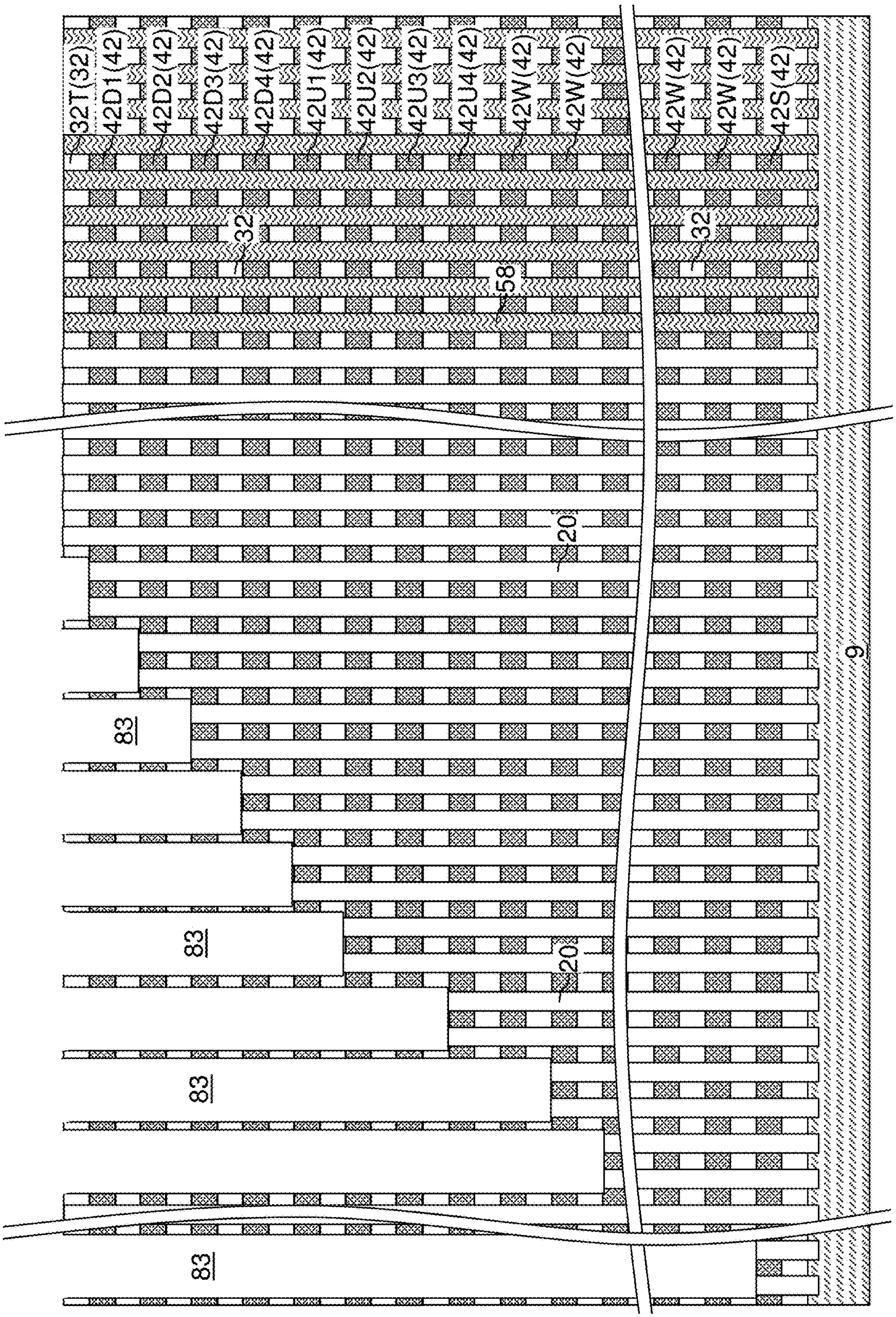
FIG. 9A is a vertical cross-sectional view of the exemplary structure after formation of contact via cavities according to an embodiment of the present disclosure.
Figure 9B:
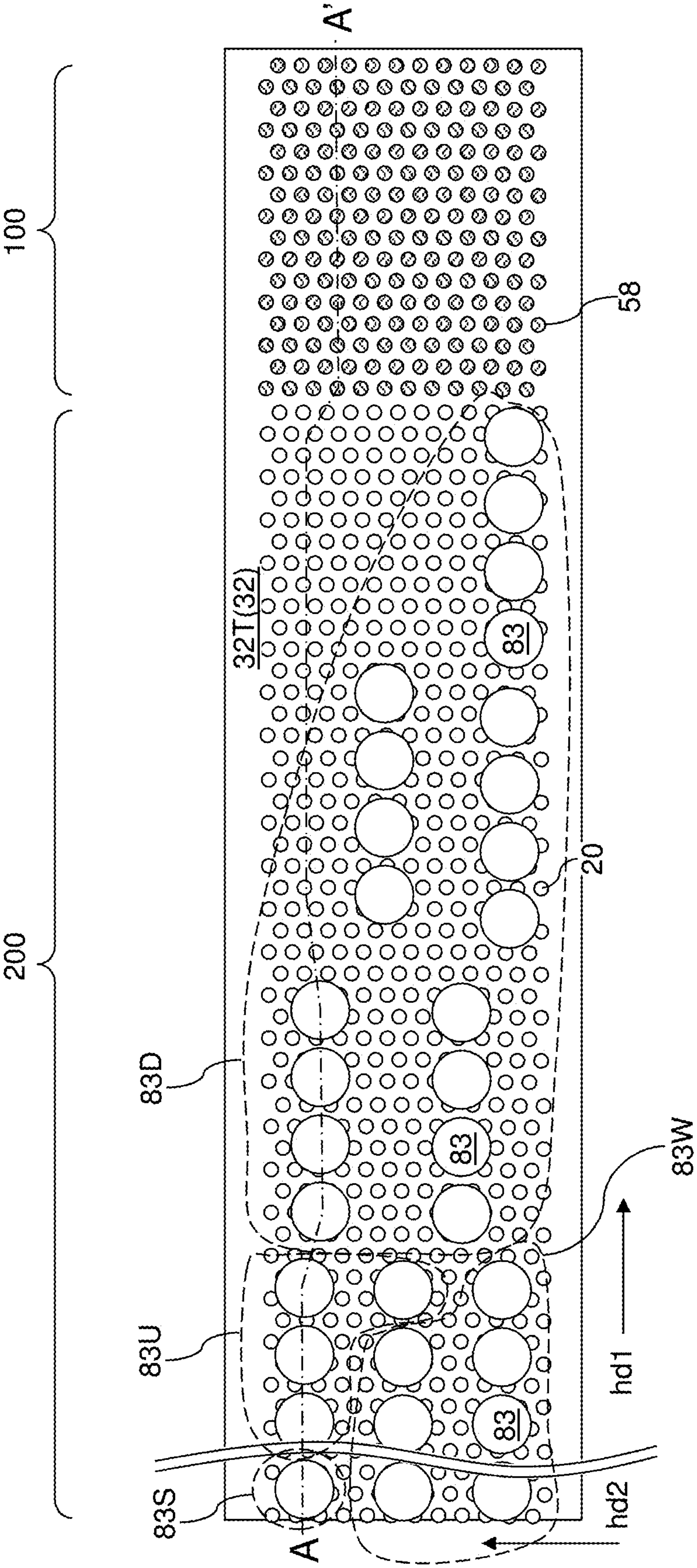
FIG. 9B is a top-down view of the exemplary structure of FIG. 9A. The vertical plane A-A' is the vertical cross-sectional plane of FIG. 9A.

Referring to FIGS. 9A and 9B, contact via cavities 83 having different depths can be formed in the contact region 200. Each of the contact via cavities 83 vertically extends through a respective subset of the layers within the alternating stack (32, 42), and has a respective bottom surface that includes a segment of a respective sacrificial material layer 42. Generally, support pillar structures 20 located within the areas of the contact via cavities 83 can be collaterally recessed during formation of the contact via cavities 83. In one embodiment, a predominant fraction of each support pillar structure 20 located within the areas of the contact via cavities 83 has a recessed surface that are coplanar with, or are substantially coplanar with, a physically exposed segment of a sacrificial material layer 42 that underlies the respective contact via cavity 83.

In one embodiment, each sacrificial material layer 42 that is subsequently replaced with a word-line-level electrically conductive layer can be physically exposed to at least one contact via cavity 83. In other words, the contact via cavities 83 can be formed such that each of the sacrificial material layers 42 that are subsequently replaced with a respective word-line-level electrically conductive layer is physically exposed to a set of at least one contact via cavity 83 within the contact region. In one embodiment, the topmost sacrificial material layer 42 is subsequently replaced with a drain-select-level electrically conductive layer, and each of the sacrificial material layers 42 other than the topmost sacrificial material layer 42 may comprise a respective surface segment that is physically exposed underneath a respective one of the contact via cavities 83.

Generally, the contact via cavities 83 can be formed using any suitable methods. For illustrative purposes, one embodiment method of forming the contact via cavities 83 is described below.

In one embodiment, a sacrificial etch mask layer (not shown) may be formed over the alternating stack (32, 42). The sacrificial etch mask layer may comprise any etch mask material that can withstand ashing processes that are subsequently employed to remove patterned photoresist material layers. For example, the sacrificial etch mask layer may comprise a dielectric metal oxide material, a metallic material, or a carbon-based material. A high-fidelity photoresist material, such as a deep ultraviolet (DUV) photoresist material, can be applied over the sacrificial etch mask layer, and can be patterned to form openings that define the areas of all contact via cavities 83 to be subsequently formed. An anisotropic etch process can be performed to form openings through the sacrificial etch mask layer. An array of openings are formed through the sacrificial etch mask layer. The high-fidelity photoresist material can be subsequently removed.

A series of block-level photoresist materials, such as mid-ultraviolet (MUV) photoresist materials in combination with a series of anisotropic etch processes can be subsequently employed to sequentially cover a respective subset of the openings in the sacrificial etch mask layer and to extend the pattern of the openings in the sacrificial etch mask layer through a respective number of stacks of an insulating layer 32 and a sacrificial material layer. For example, about one half of all of the openings through the sacrificial etch mask layer can be covered by a first block-level photoresist layer, and one insulating layer 32 and one sacrificial material layer 42 can be etched by performing an anisotropic etch process underneath the openings through the unmasked portions of the sacrificial material layer. Any unmasked portion of the support pillar structures 20 may be collaterally etched by selecting the etch chemistry of the various etch steps of an anisotropic etch process such that the overall etch rate for the material of the support pillar structures 20 matches the overall etch rate for a combination of an insulating layers 32 and a sacrificial material layer 42. The first block-level photoresist layer can be subsequently removed. About one half of all of the openings through the sacrificial etch mask layer can be covered by a second block-level photoresist layer. About one half of the unmasked openings are among the openings previously covered by the first block-level photoresist layer, and the remainder of the unmasked openings are among the openings previously masked by the first block-level photoresist layer. Two pairs of an insulating layer 32 and a sacrificial material layer 42 (i.e., two insulating layers 32 and two sacrificial material layers 42) can be etched by performing an anisotropic etch process underneath the openings through the unmasked portions of the sacrificial material layer. Any unmasked portion of the support pillar structures 20 may be collaterally etched by selecting the etch chemistry of the various etch steps of an anisotropic etch process such that the overall etch rate for the material of the support pillar structures 20 matches the overall etch rate for a combination of an insulating layers 32 and a sacrificial material layer 42. The second block-level photoresist layer can be subsequently removed. The above scheme can be repeated up to the N-th block-level photoresist layer and an N-th anisotropic etch process etching $2^{(N-1)}$ pairs of an insulating layer 32 and a sacrificial material layer 42 are employed. A terminal anisotropic etch process may be performed in the absence of any block-level photoresist layer, for example, to etch through unmasked portions of a respective set of two insulating layers 32 and a sacrificial material layer 42 that underlies any opening through the sacrificial etch mask layer.

Contact via cavities 83 having $2^N$ different depths can be formed in the contact region 200. In an illustrative example, if N is 8, the total number of sacrificial material layers 42 may be $2^8$+M, which corresponds to 256 word-line-level sacrificial material layers and M drain-select-level sacrificial material layers. While a case in which M is 1 is described, embodiments are expressly contemplated herein in which M may be in integer greater than 1. The sacrificial etch mask layer can be subsequently removed, for example, by ashing or by performing an etch process that removes the material of the sacrificial etch mask layer selective to the materials of the alternating stack (32, 42).

The contact via cavities 83 comprise at least one source-select-electrode contact via cavity 83S vertically extending from a horizontal plane including a topmost surface of the alternating stack (32, 46) to a top surface of the source-select-level sacrificial material layer(s) 42S, word-line-contact via cavities 83W vertically extending from the horizontal plane including the topmost surface of the alternating stack (32, 46) to a top surface of a respective one of the word-line-level sacrificial material layers 42W, dummy contact via cavities 83U vertically extending from the horizontal plane including the topmost surface of the alternating stack (32, 46) to a top surface of a respective one of the dummy sacrificial material layers 42U, and drain-select-electrode contact via cavities 83D vertically extending from the horizontal plane including the topmost surface of the alternating stack (32, 46) to a top surface of a respective one of the drain-select-level sacrificial material layers 42D. The source-select-level sacrificial material layer(s) 42S has a top surface segment that is physically exposed to the source-select-electrode contact via cavity or cavities 83S. Each of the word-line-level sacrificial material layers 42W has a respective top surface segment that is physically exposed to a respective word-line-contact via cavity 83W. Each of the dummy sacrificial material layers 42U has a respective top surface segment that is physically exposed to a respective dummy contact via cavity 83U. Each of the drain-select-level sacrificial material layers 42D has a plurality of top surface segments that are physically exposed to a respective drain-select-electrode contact via cavity 83D.

The number of surface segments of each drain-select-level sacrificial material layer 42D that are exposed to a respective drain-select-electrode contact via cavity 83D may be the same as the total number of drain-select-electrode strips to be subsequently formed between each neighboring pair of backside trenches. For example, if five drain-select-level electrically conductive strips are to be formed at each level of a drain-select-level sacrificial material layer 42D, five drain-select-electrode contact via cavities 83D can be formed per drain-select-level sacrificial material layer 42D. Generally, if N (which is an integer greater than 1) drain-select-level electrically conductive strips are to be formed at each level of a drain-select-level sacrificial material layer 42D, N drain-select-electrode contact via cavities 83D can be formed per drain-select-level sacrificial material layer 42D. If the total number of levels of the drain-select-level sacrificial material layers 42D is M (M being a positive integer), the total number of drain-select-electrode contact via cavities 83D that is formed within an area between a neighboring pair of backside trenches to be subsequently formed can be M×N.

According to an aspect of the present disclosure, N clusters of M drain-select-electrode contact via cavities 83D that extend to different drain-select-level sacrificial material layers 42D can be formed within an area between a neighboring pair of backside trenches to be subsequently formed (which corresponds to the illustrated area of FIG. 9B). In the illustrative example, M is 4 and N is 5, and five clusters of four drain-select-electrode contact via cavities 83D can be formed within an area between a neighboring pair of backside trenches to be subsequently formed. For example, a memory block may have five (when N=5) NAND memory string "fingers", each having four (when M=4) drain-select-level sacrificial material layers (i.e., drain side select gate electrode layers) 42D.

Figure 10A:
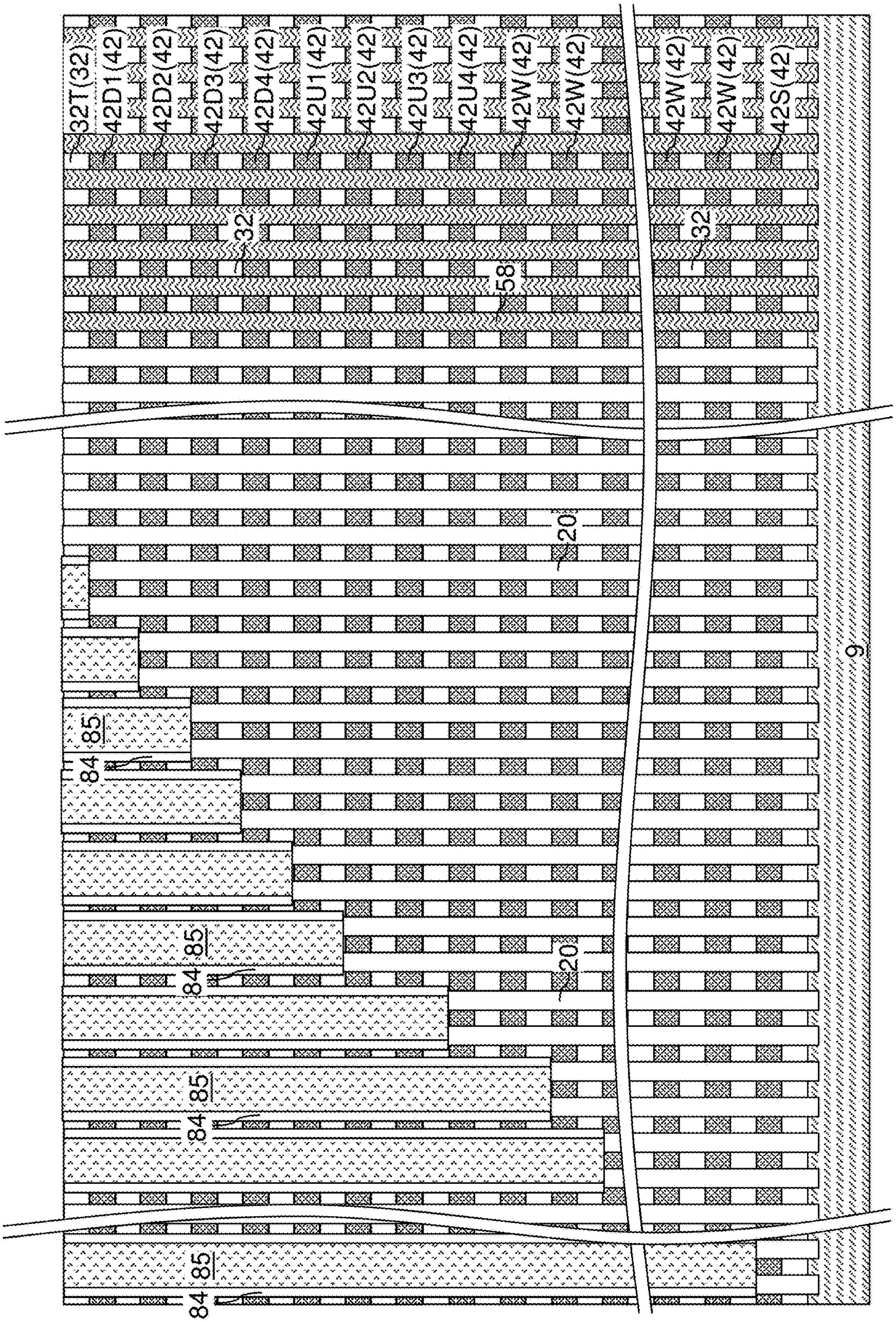
FIG. 10A is a vertical cross-sectional view of the exemplary structure after formation of tubular insulating spacers and sacrificial via structures according to an embodiment of the present disclosure.
Figure 10B:
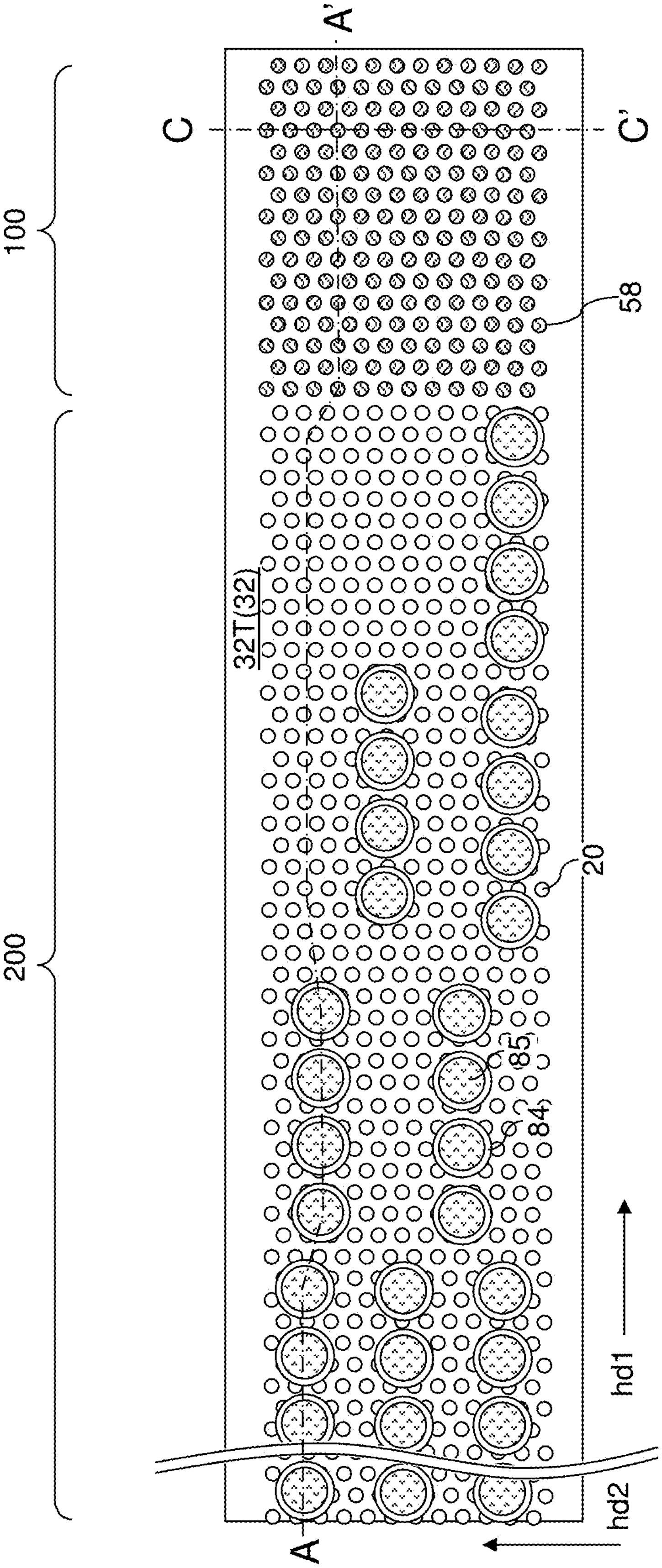
FIG. 10B is a top-down view of the exemplary structure of FIG. 10A. The vertical plane A-A' is the vertical cross-sectional plane of FIG. 10A.
Figure 10C:
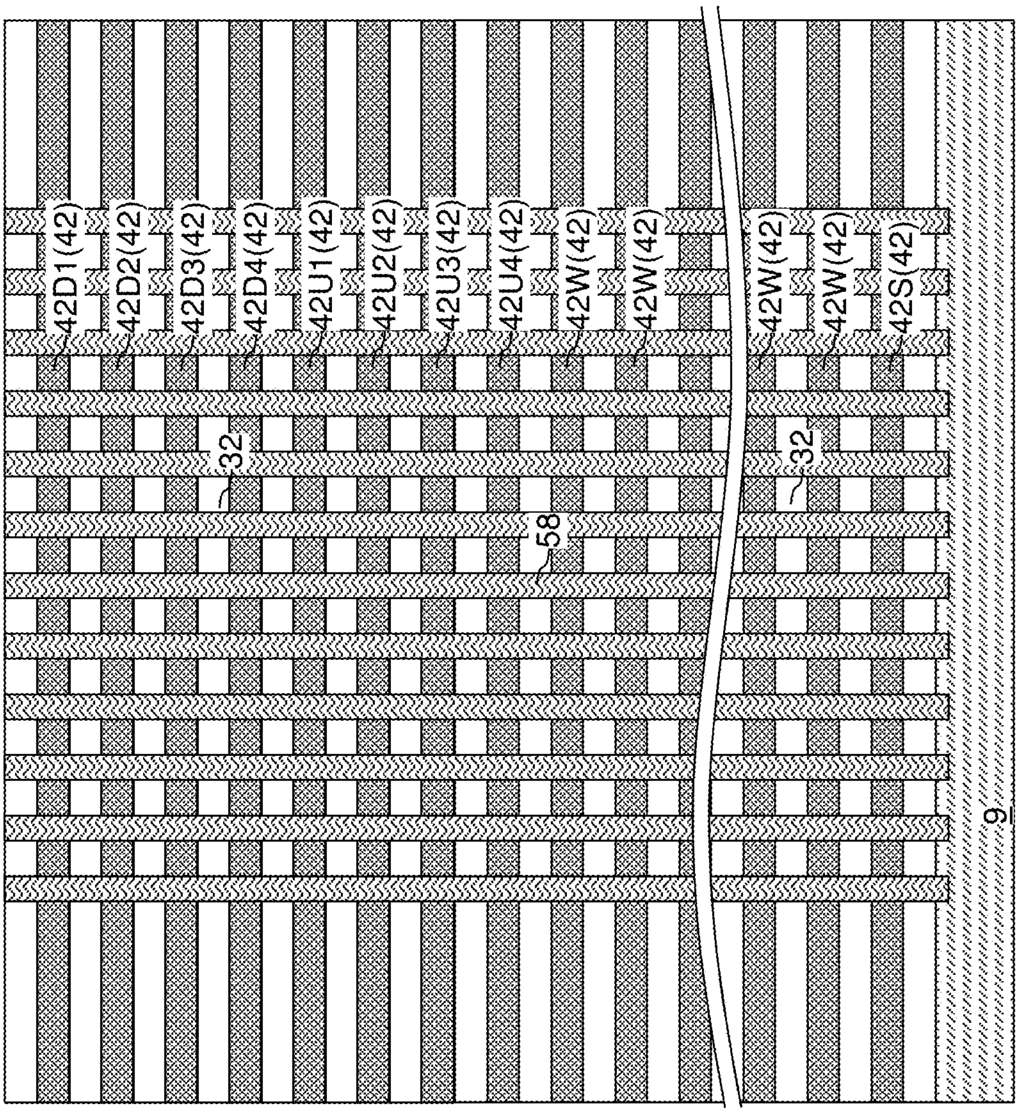
FIG. 10C is a vertical cross-sectional view of the exemplary structure along the vertical plane C-C' of FIG. 10A.

Referring to FIGS. 10A and 10B, an insulating material layer may be conformally deposited over the physically exposed surfaces of the contact via cavities 83 and over the alternating stack (32, 42). The insulating material layer includes an insulating material such as undoped silicate glass (i.e., silicon oxide) or a doped silicate glass. The thickness of the insulating material layer may be in a range from 10 nm to 100 nm, although lesser and greater thicknesses may also be employed. An anisotropic etch process (e.g., a sidewall spacer etch process) can be performed to remove horizontally-extending portions of the insulating material layer at the bottom of each contact via cavity 83 and from above the alternating stack (32, 42). Each remaining portion of the insulating material layer comprises an insulating spacer having a tubular configuration, and is herein referred to as a tubular insulating spacer 84. A void is present within each unfilled volume of the contact via cavities 83.

A sacrificial fill material can be deposited in the voids within the contact via cavities 83. The sacrificial fill material comprises a material that can be subsequently removed selective to materials of the tubular insulating spacers 84, the insulating layers 32, and the support pillar structures 20. For example, the sacrificial fill material may comprise a carbon-based material such as amorphous carbon or diamond-like carbon, a semiconductor material such as amorphous silicon or a silicon-germanium alloy, or a dielectric material such as borosilicate glass or organosilicate glass. Excess portions of the sacrificial fill material may be removed from above the horizontal plane including the top surface of the alternating stack employing a planarization process. The planarization process may comprise a recess etch process or a chemical mechanical polishing process. Each remaining portion of the sacrificial fill material constitutes a sacrificial via structure 85.

Each contiguous combination of a tubular insulating spacer 84 and a sacrificial via structure 85 is herein referred to as an in-process laterally-insulated contact via assembly (84, 85). The in-process laterally-insulated contact via assemblies (84, 85) are formed in the contact region 200 through a respective subset of layers within the alternating stack (32, 42) and directly on a top surface of a respective one of the sacrificial material layers 42 within the alternating stack (32, 42). Each of the in-process laterally-insulated contact via assemblies (84, 85) comprises a respective tubular insulating spacer 84 and a respective sacrificial via structure 85. Each of the in-process laterally-insulated contact via assemblies (84, 85) may be referred to as a first in-process laterally-insulated contact via assembly (84, 85), a second in-process laterally-insulated contact via assembly (84, 85), etc. The first in-process laterally-insulated contact via assembly (84, 85) comprises combination of a first tubular insulating spacer 84 and a first sacrificial via structure 85; the second in-process laterally-insulated contact via assembly (84, 85) comprises combination of a second tubular insulating spacer 84 and a second sacrificial via structure 85; etc.

Generally, the memory stack structures 55 are located within a memory array region 100, and the in-process laterally-insulated contact via assemblies (84, 85) are located in a contact region 200 that is laterally offset from the memory array region 100. In one embodiment, the contact region 200 may be free of any memory stack structures 55. Instead, support pillar structures 20 comprising and/or consisting essentially of a dielectric material can be located within the contact region 200. The support pillar structures 20 can contact a substrate including a semiconductor material layer 9, and can extend through at least a bottommost insulating layer 32 within the alternating stack (32, 42). In one embodiment, a subset of the support pillar structures 20 may have a topmost surface or a recessed surface that contacts a bottom surface of a respective one of the in-process laterally-insulated contact via assemblies (84, 85). The recessed surface may be adjoined to a sidewall of a respective support pillar structure 20 that extends to the horizontal plane including the topmost surface of the alternating stack (32, 42).

In one embodiment, the in-process laterally-insulated contact via assemblies (84, 85) may comprise a first in-process laterally-insulated contact via assembly (84, 85) that contacts a top surface of each support pillar structure 20 within a first subset of the support pillar structures 20. Each support pillar structure 20 within the first subset of the support pillar structures 20 vertically extends through at least one sacrificial material layer 42 including, for example, a first sacrificial material layer 42 that is in contact with the bottom surface of the first in-process laterally-insulated contact via assembly (84, 85). Further, each support pillar structure 20 within the first subset of the support pillar structures 20 may vertically extend through each layer within the alternating stack (32, 42) that underlies the first sacrificial material layer 42.

Figure 11A:
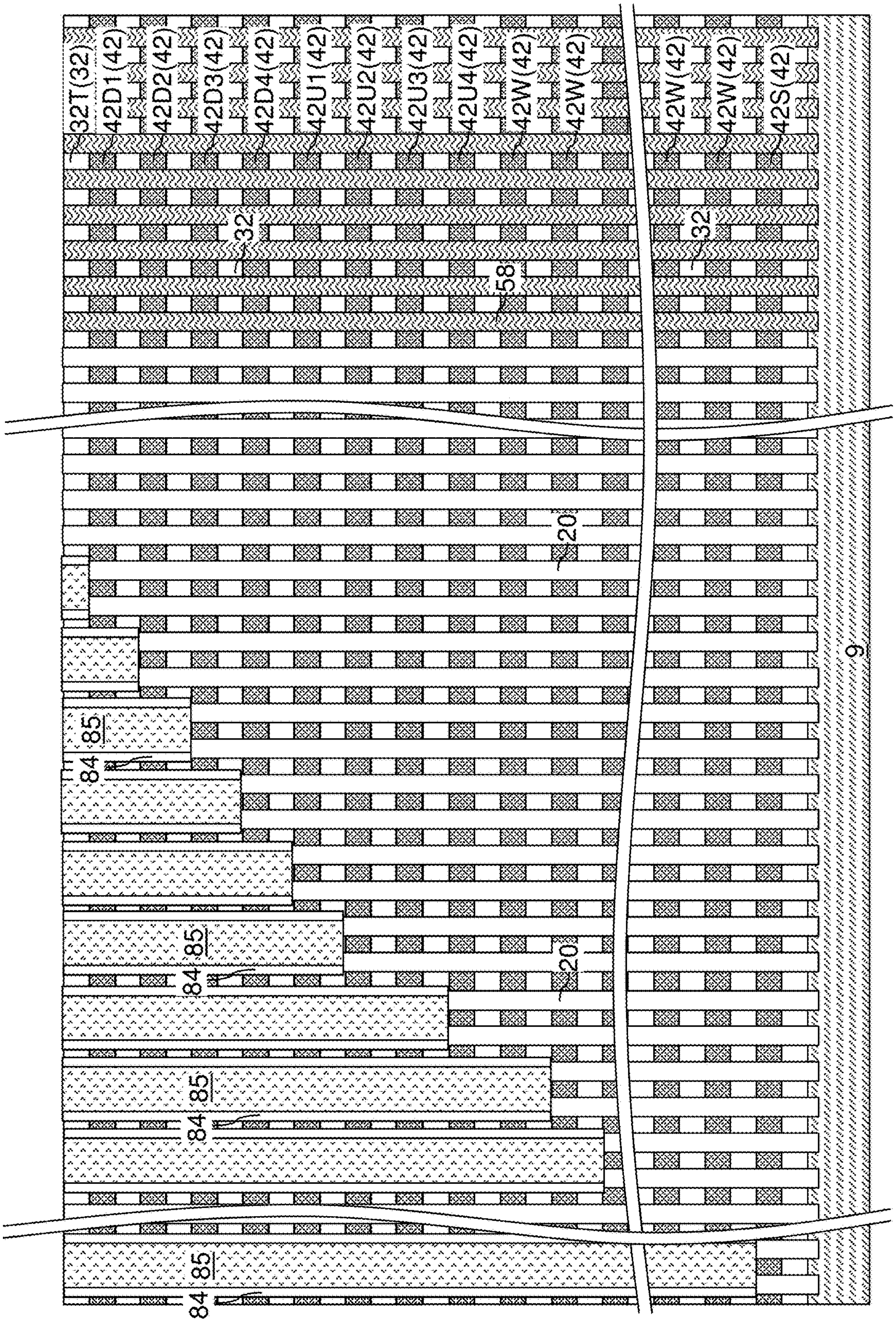
FIG. 11A is a vertical cross-sectional view of the exemplary structure after formation of backside trenches according to an embodiment of the present disclosure.
Figure 11B:
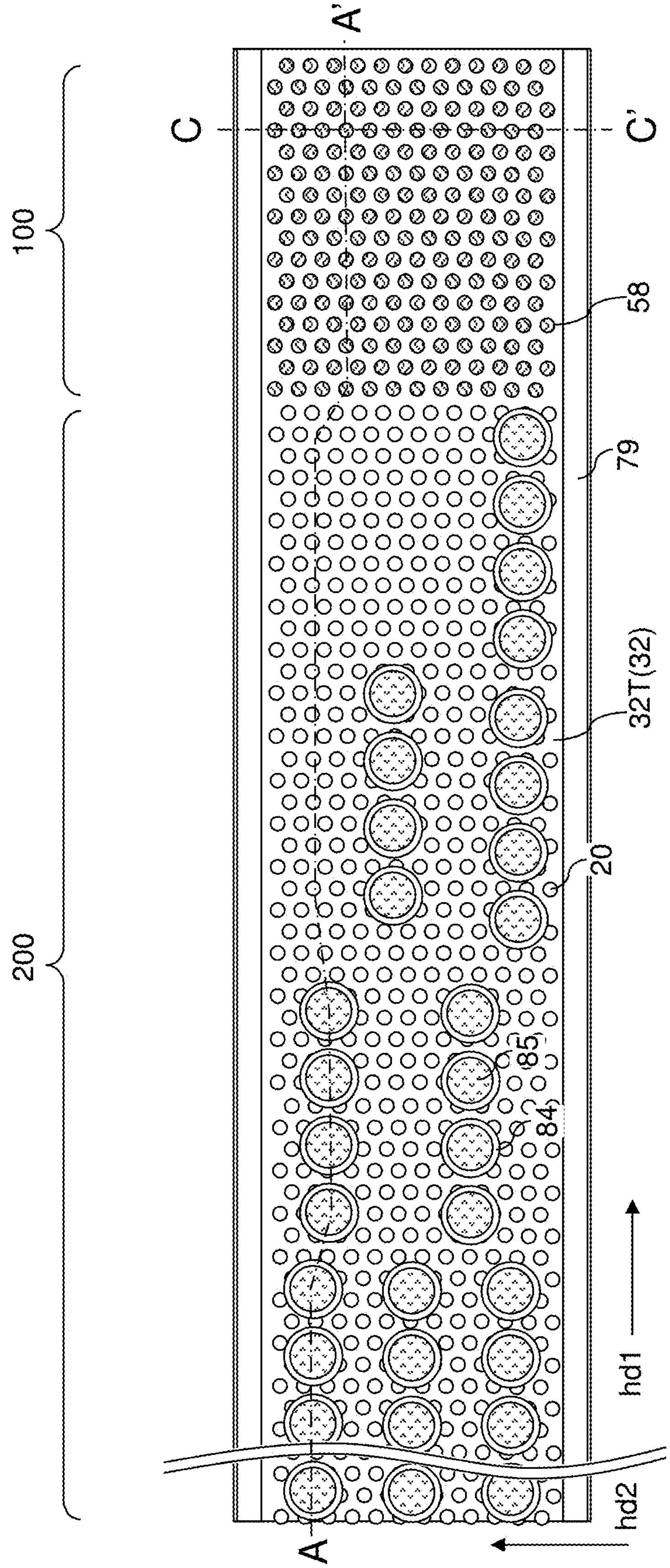
FIG. 11B is a horizontal cross-sectional of the exemplary structure of FIG. 11A along the horizontal plane B-B' of FIG. 11A. The vertical plane A-A' is the vertical cross-sectional plane of FIG. 11A.
Figure 11C:
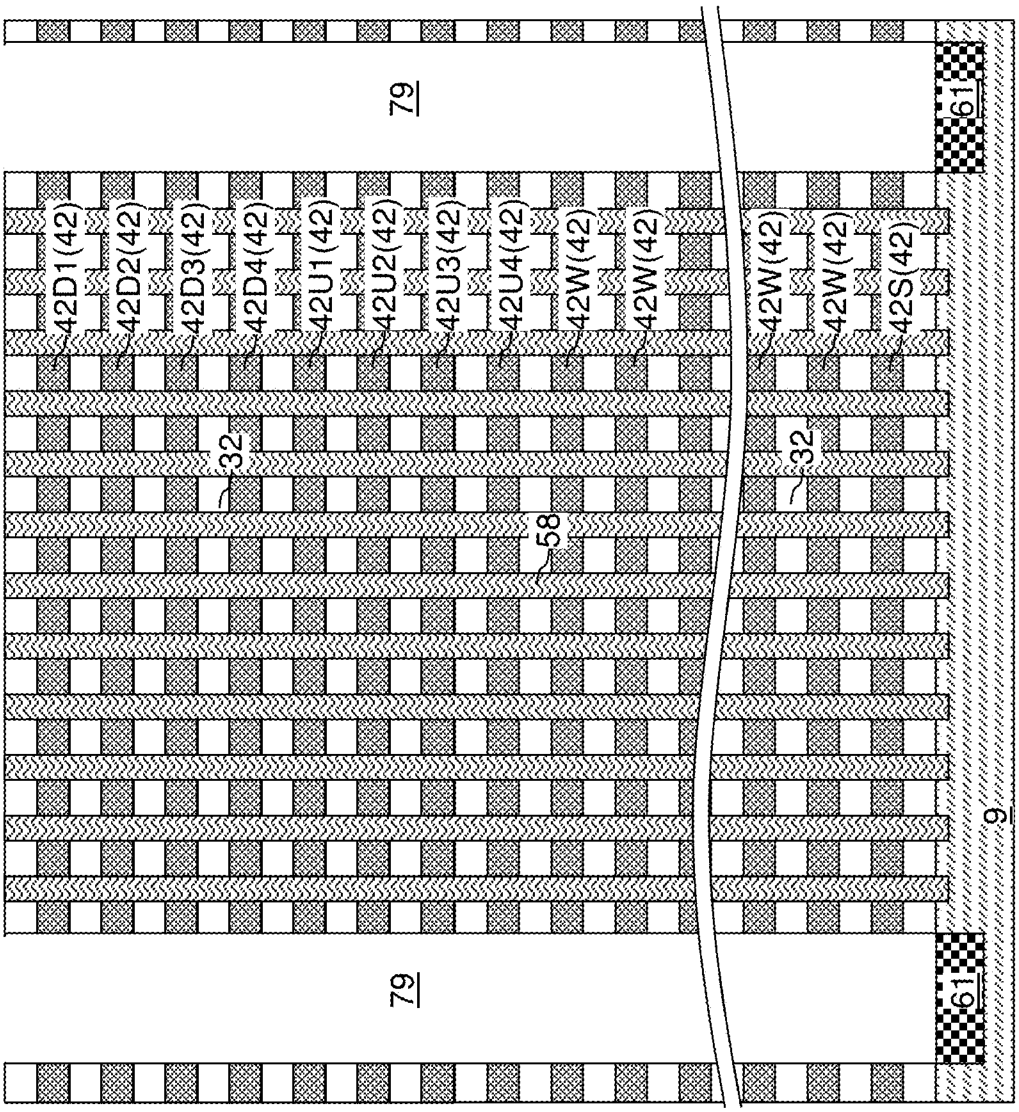
FIG. 11C is a vertical cross-sectional view of the exemplary structure along the vertical plane C-C' of FIG. 11A.
Figure 12A:
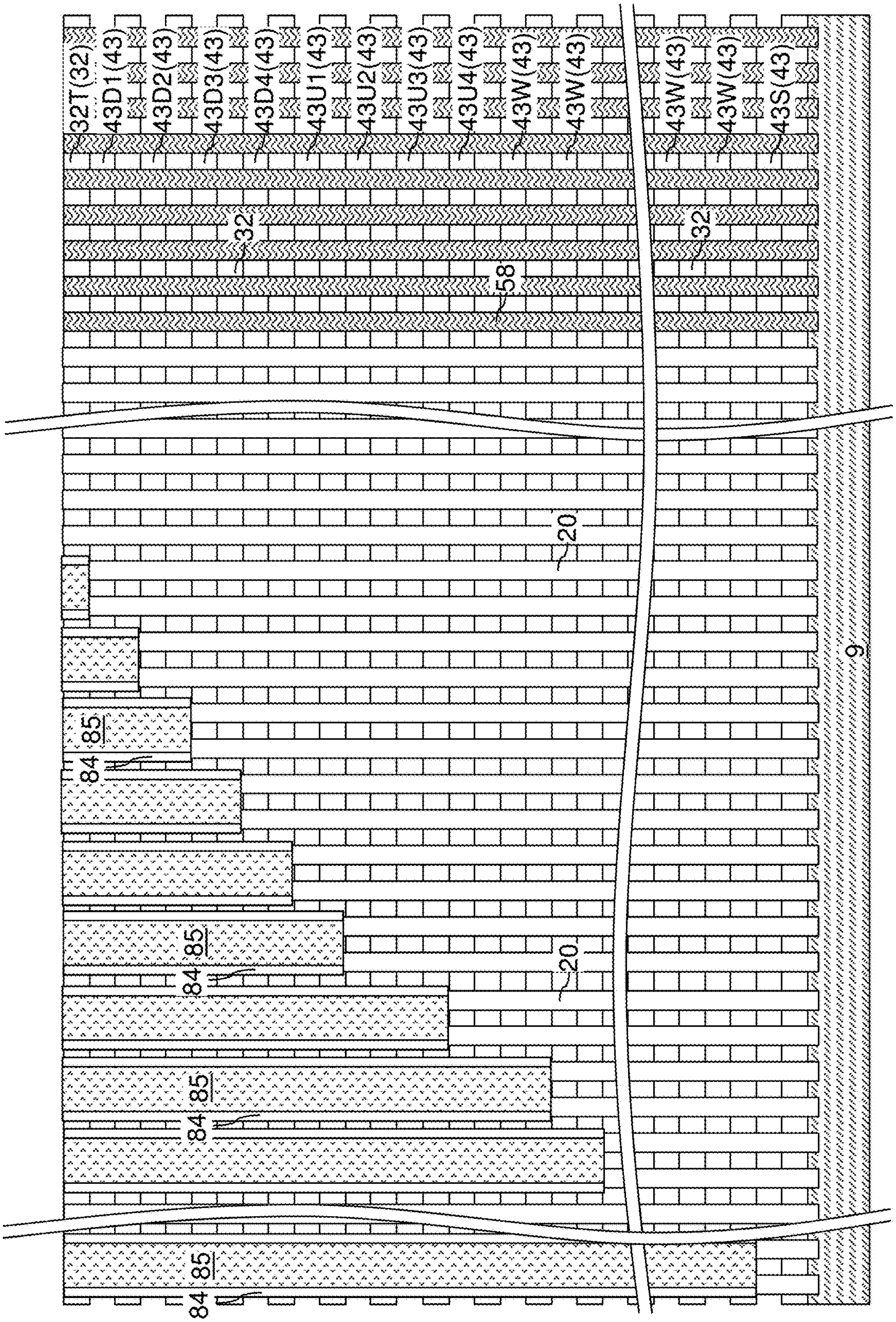
FIG. 12A is a vertical cross-sectional view of the exemplary structure after formation of backside recesses according to an embodiment of the present disclosure.
Figure 12B:
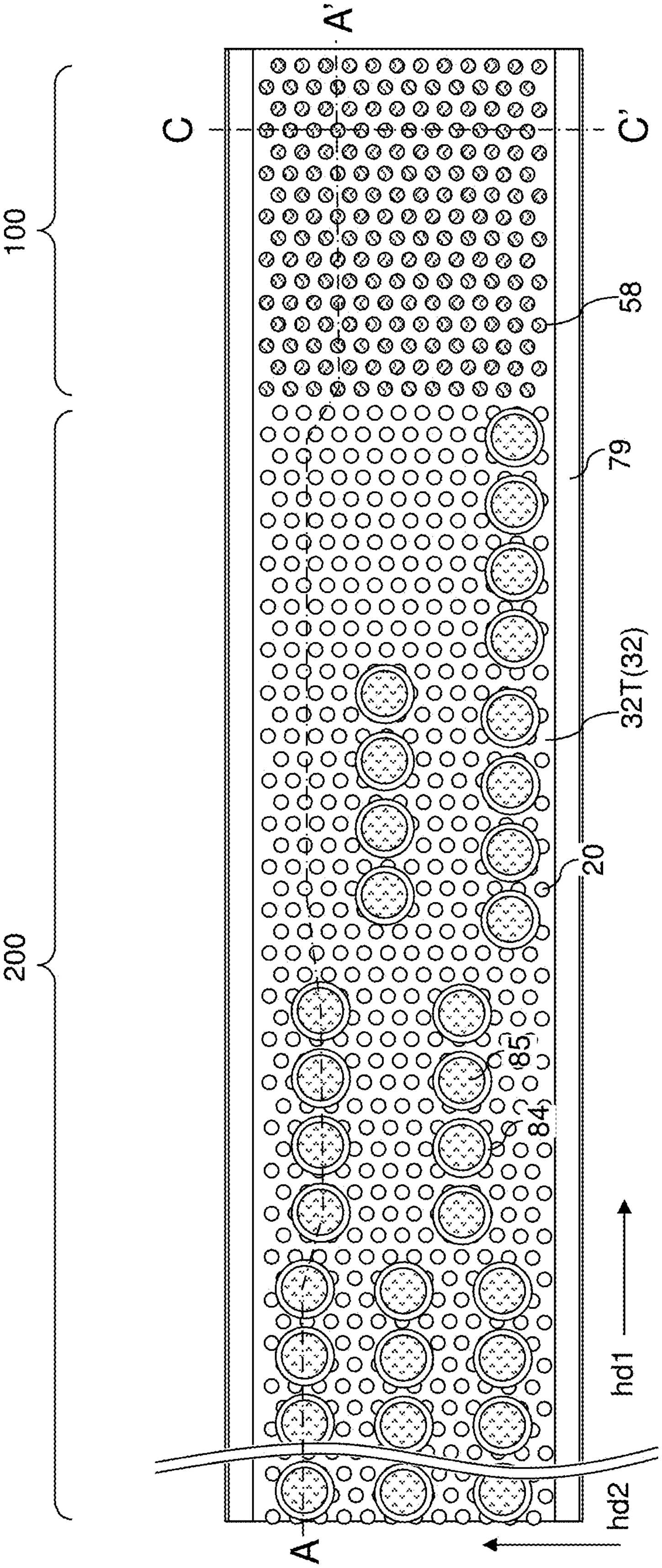
FIG. 12B is a horizontal cross-sectional of the exemplary structure of FIG. 12A along the horizontal plane B-B' of FIG. 12A. The vertical plane A-A' is the vertical cross-sectional plane of FIG. 12A.
Figure 12C:
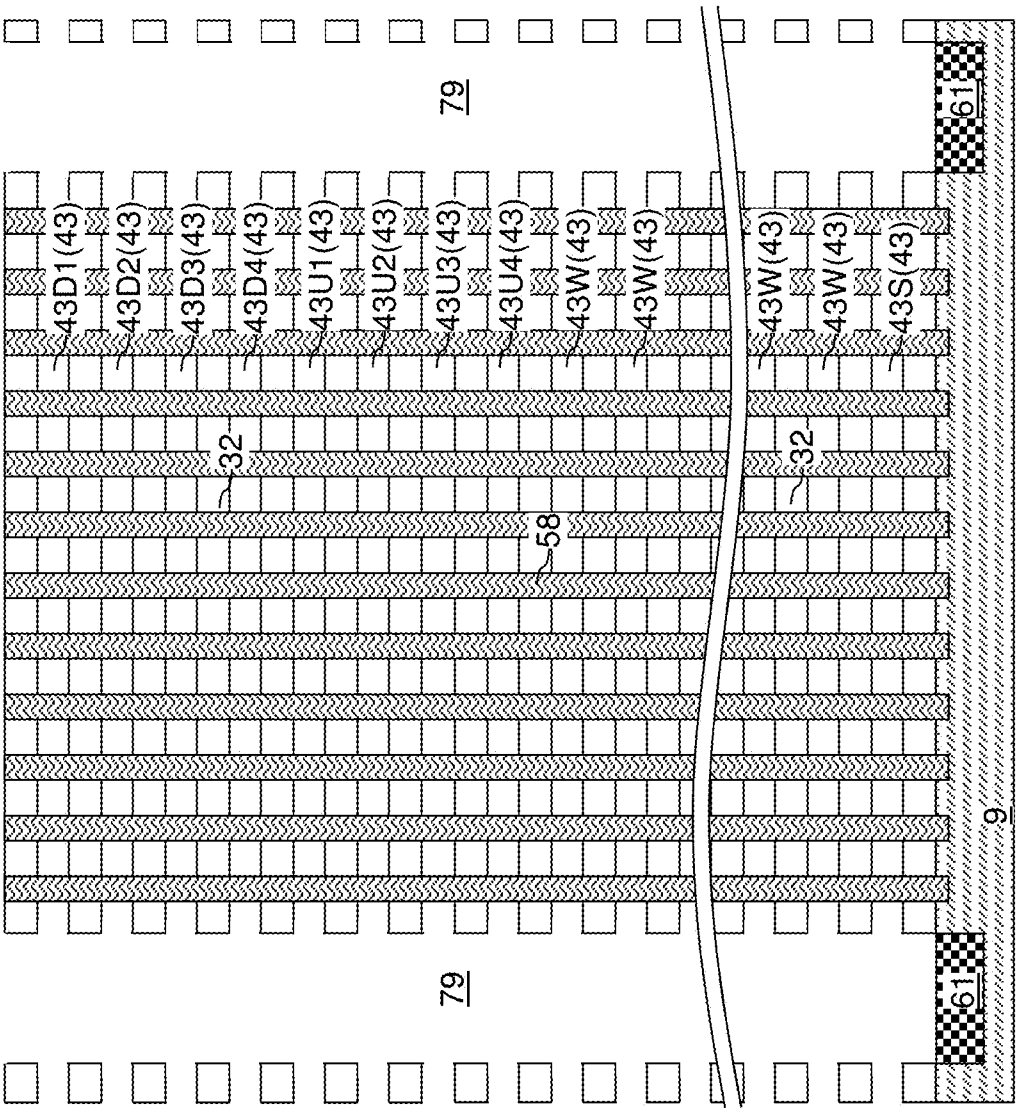
FIG. 12C is a vertical cross-sectional view of the exemplary structure along the vertical plane C-C' of FIG. 12A.

Referring to FIGS. 11A-11C, a sacrificial capping material layer (not shown) may be optionally formed over the alternating stack (32, 42). The sacrificial capping material layer, if employed, comprises a sacrificial material that protects the memory opening fill structures 58 during subsequent processing steps and then removed, for example, by performing a recess etch process. For example, the sacrificial capping material layer may comprise a silicon oxide layer having a thickness in a range from 30 nm to 300 nm, although lesser and greater thicknesses may also be employed.

A photoresist layer (not shown) can be applied over the sacrificial capping material layer, and is lithographically patterned to form openings in areas between clusters of memory opening fill structures 58. In one embodiment, the opening may comprise elongated openings that laterally extend along the first horizontal direction hd1 and having a respective uniform width. The pattern in the photoresist layer can be transferred through the sacrificial capping material layer and the alternating stack (32, 42) employing an anisotropic etch to form backside trenches 79, which vertically extend from the top surface of the sacrificial capping material layer at least to the top surface of the semiconductor material layer 9, and laterally extend through the memory array regions 100 and the contact region 200 along the first horizontal direction hd1.

In one embodiment, the backside trenches 79 can laterally extend along the first horizontal direction hd1 and can be laterally spaced apart from each other along the second horizontal direction hd2 that is perpendicular to the first horizontal direction hd1. The memory stack structures 55 can be arranged in rows that extend along the first horizontal direction hd1. Each backside trench 79 can have a uniform width that is invariant along the lengthwise direction (i.e., along the first horizontal direction hd1). Multiple rows of memory stack structures 55 can be located between a neighboring pair of backside trenches 79. In one embodiment, the backside trenches 79 can include source contact openings in which a source contact via structure can be subsequently formed.

A source region 61 can be formed at a surface portion of the semiconductor material layer 9 under each backside trench 79 by implantation of electrical dopants into physically exposed surface portions of the semiconductor material layer 9. An upper portion of the semiconductor material layer 9 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Referring to FIGS. 12A-12C and 13A, an etchant that selectively etches the second material of the sacrificial material layers 42 with respect to the first material of the insulating layers 32 can be introduced into the backside trenches 79, for example, employing an isotropic etch process. Backside recesses 43 are formed in volumes from which the sacrificial material layers 42 are removed. The removal of the second material of the sacrificial material layers 42 can be selective to the first material of the insulating layers 32, the semiconductor material of the semiconductor material layer 9, and the material of the outermost layer of the memory films 50. In one embodiment, the sacrificial material layers 42 can include silicon nitride, and the materials of the insulating layers 32 can be selected from silicon oxide or dielectric metal oxide.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20 and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the semiconductor material layer 9. In this case, each backside recess 43 can define a space for receiving a respective word line or a select gate electrode of the array of three-dimensional NAND strings.

Each of the plurality of backside recesses 43 can extend substantially parallel to the top surface of the semiconductor material layer 9. A backside recess 43 can be vertically bounded by a top surface of an underlying insulating layer 32 and a bottom surface of an overlying insulating layer 32. In one embodiment, each backside recess 43 can have a uniform height throughout. The photoresist layer can be removed, for example, by ashing.

Figure 13A:
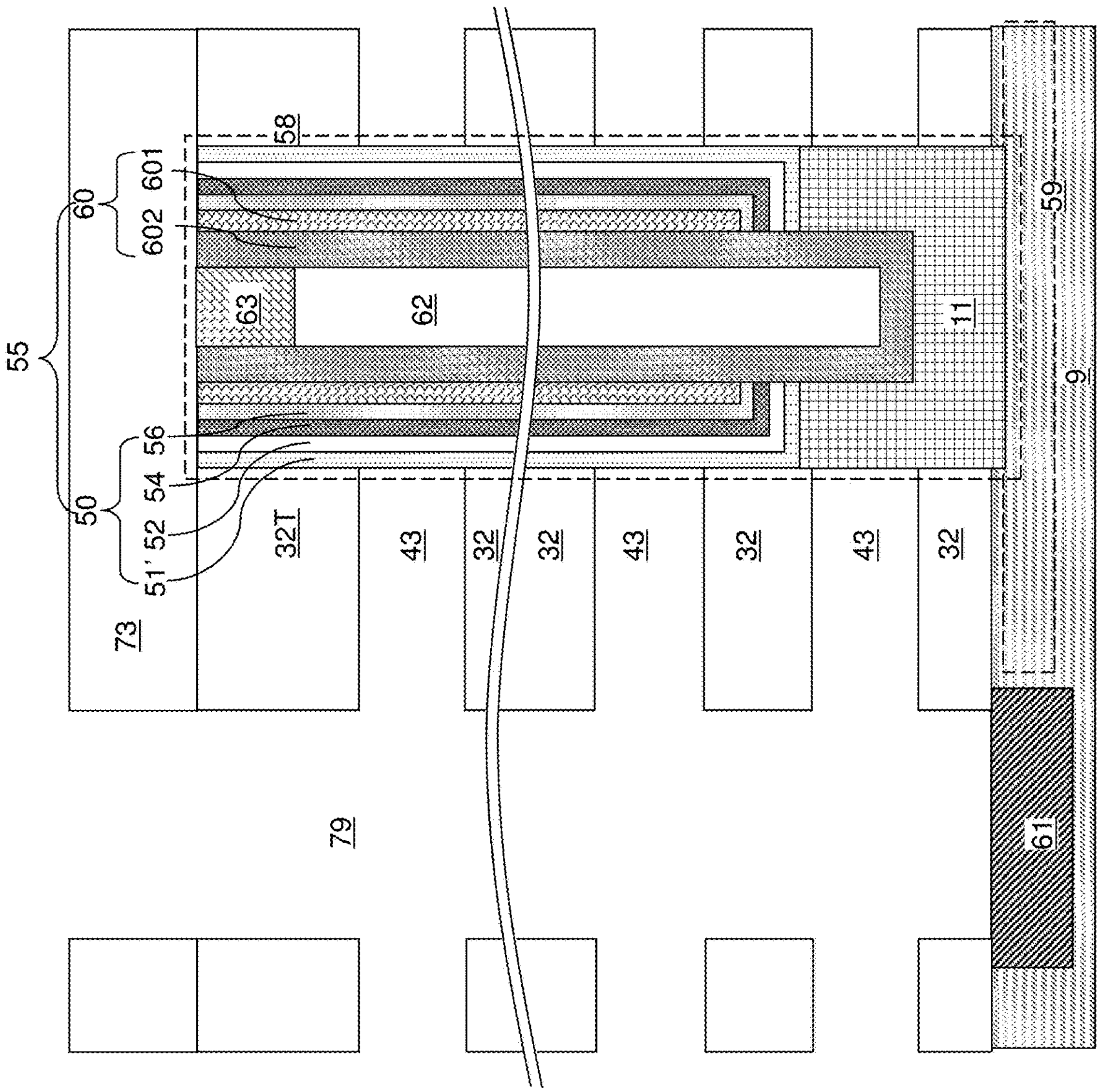
FIGS. 13A-13E are sequential vertical cross-sectional views of a region of the exemplary structure during formation of electrically conductive layers
Figure 13B:
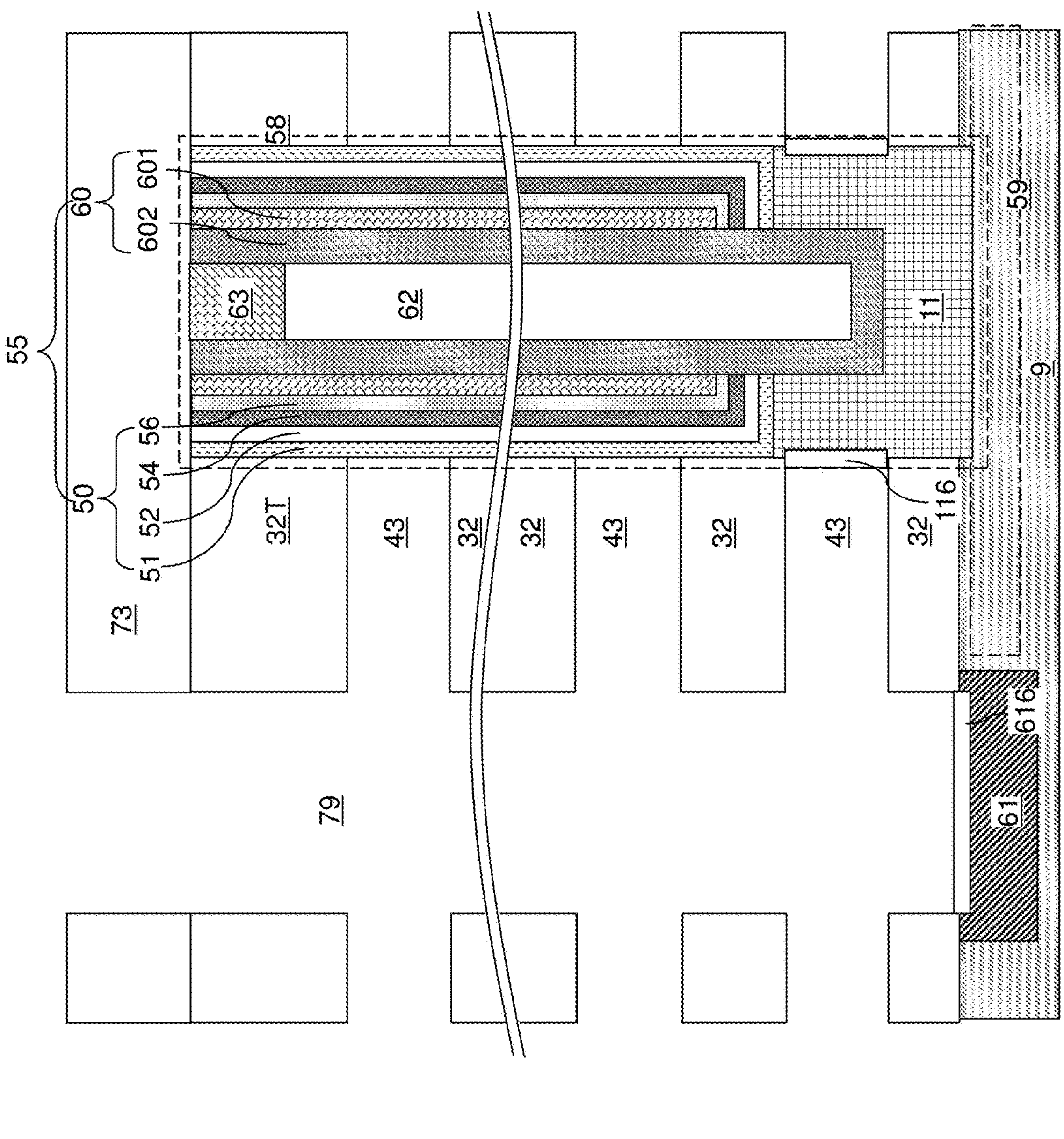

Referring to FIG. 13B, physically exposed surface portions of the optional pedestal channel portions 11 and the semiconductor material layer 9 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 9 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 9.

Figure 13C:
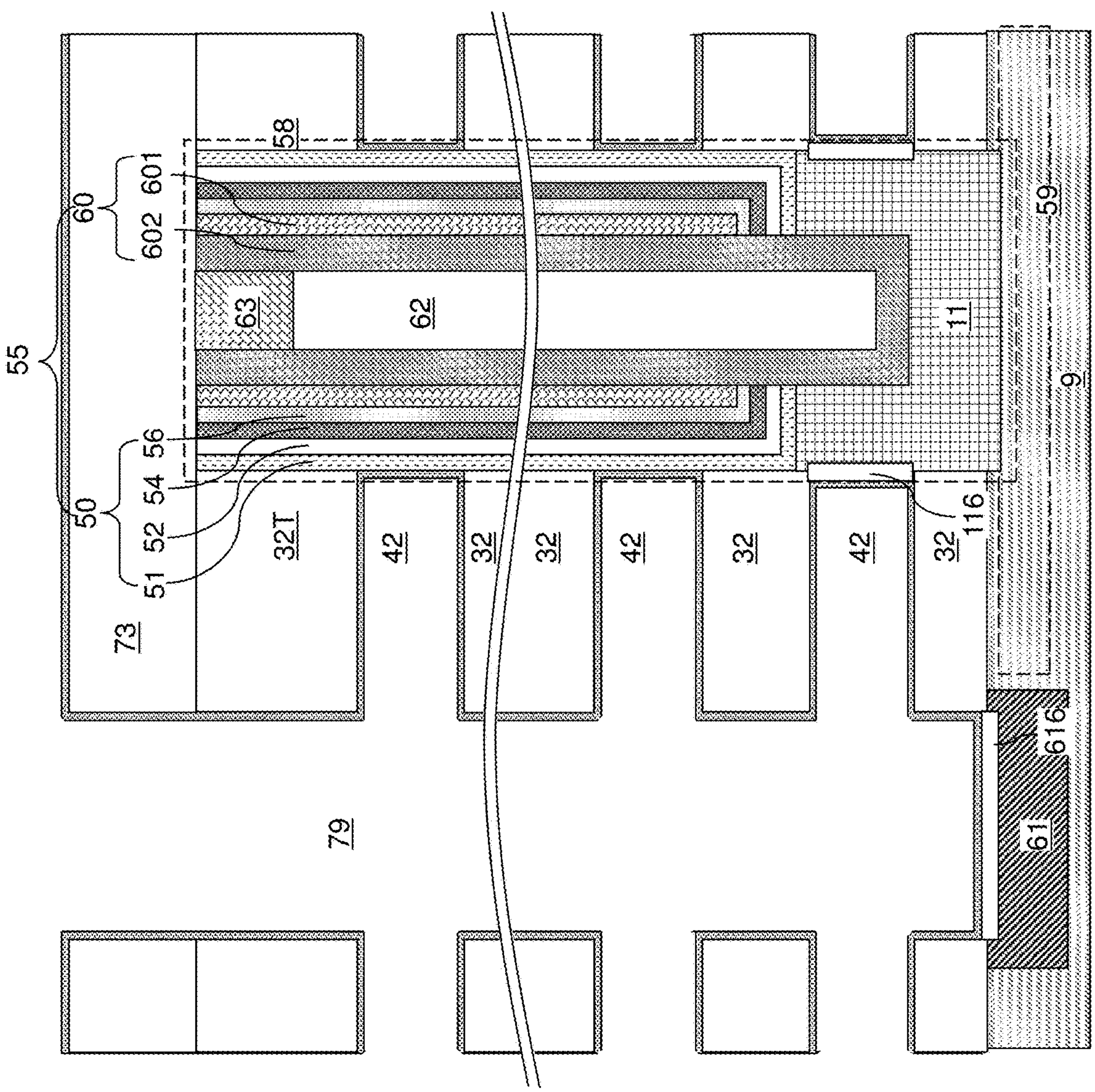

Referring to FIG. 13C, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity is present within the portion of each backside trench 79 that is not filled with the backside blocking dielectric layer 44.

Figure 13D:
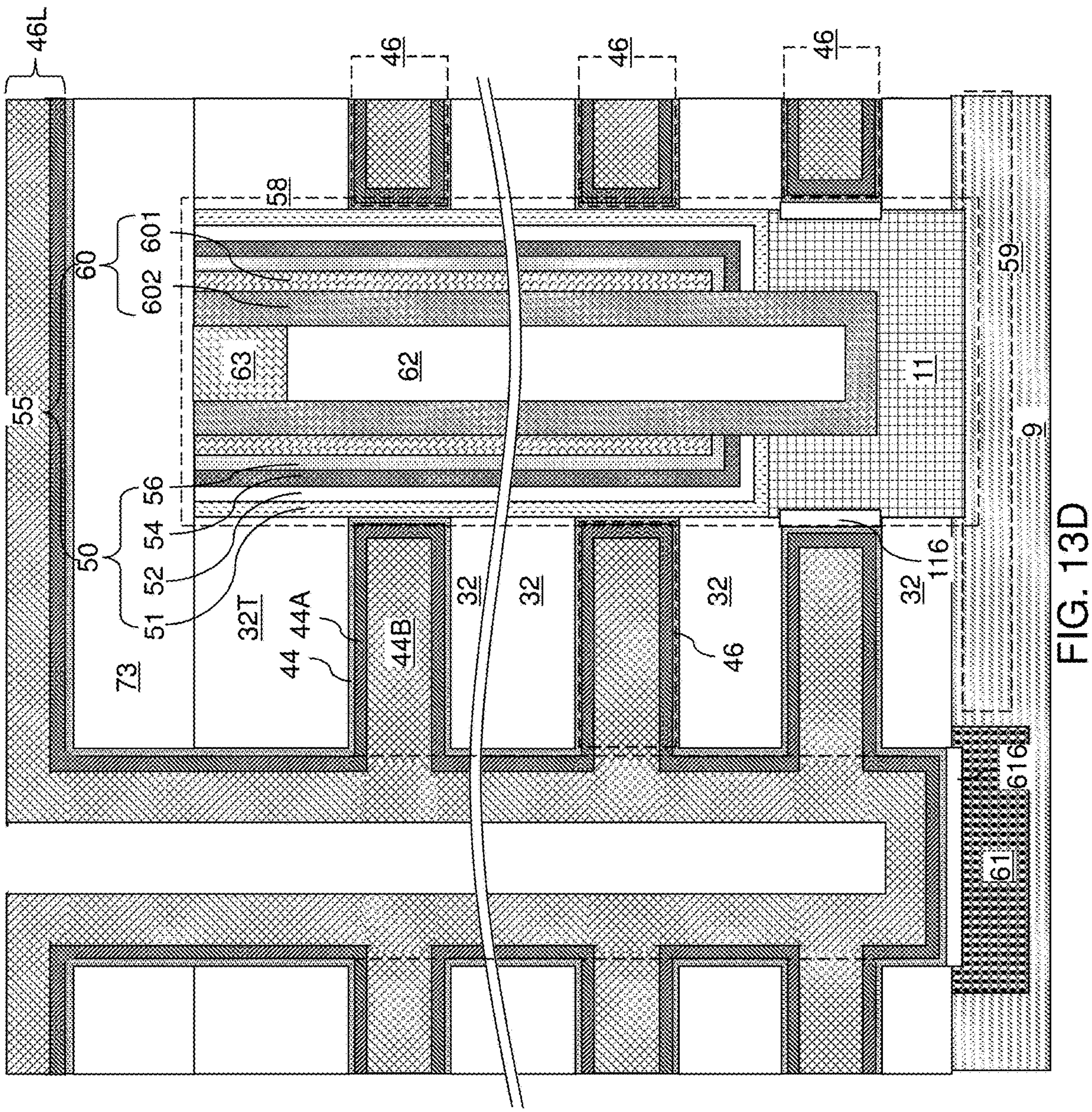

Referring to FIG. 13D, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the sacrificial capping material layer to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the sacrificial capping material layer. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the sacrificial capping material layer.

Each sacrificial material layer 42 can be replaced with an electrically conductive layer 46. A backside cavity is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 13E:
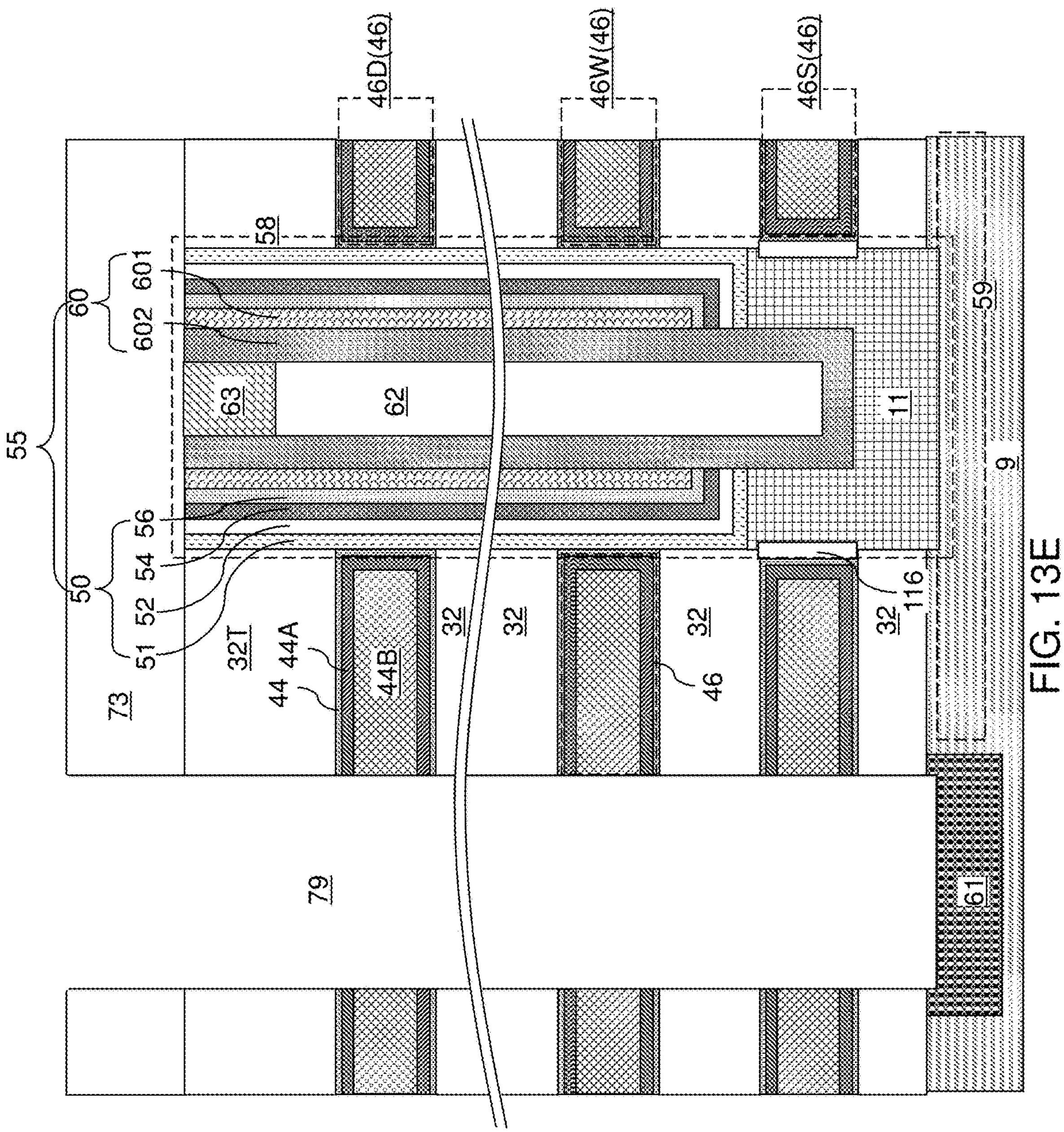

Referring to FIGS. 13E, the deposited metallic material of the continuous electrically conductive material layer 46L is etched back from the sidewalls of each backside trench 79 and from above the sacrificial capping material layer, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

The middle electrically conductive layers 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity is present within each backside trench 79.

The electrically conductive material layers 46 may comprise different types of layers. In one embodiment, the electrically conductive material layers 46 may comprise at least one source-select-level electrically conductive material layer (i.e., source side select gate electrode layer(s)) 46S, word-line-level electrically conductive material layers (i.e., active word lines) 46 W, dummy electrically conductive material layers (i.e., dummy word lines) 46U, and drain-select-level electrically conductive material layers (i.e., drain side select gate electrode layers) 46D. While one source-select-level electrically conductive material layer 46S, a plurality of word-line-level electrically conductive material layers 46W, 4 dummy electrically conductive material layers 46U, and 4 drain-select-level electrically conductive material layers 46D are illustrated, embodiments are expressly contemplated herein in which the total number of the drain-select-level electrically conductive material layers 46D is in a range from 1 to 16 (such as from 2 to 8), and the total number of the dummy electrically conductive material layers 46U is in a range from 1 to 16 (such as from 2 to 8). More than one source-select-level electrically conductive material layer 46S may also be provided.

The drain-select-level electrically conductive layers 46D are employed to activate or deactivate from the drain side a respective group (e.g., NAND memory string "finger") of memory stack structures 55 in each memory block located between a pair of backside trenches 79. Each of word-line-level electrically conductive layers 46W are employed as active word lines, and laterally surround a two-dimensional array of memory elements, which are portions of the memory material layers 54 located at the level of a respective word-line-level electrically conductive layer 46W. Specifically, the active word lines are used to program, erase and read a memory element (i.e., memory cell). The dummy electrically conductive layers 46U function in the same manner as the word-line-level electrically conductive layers 46W, but are not used to program, erase or read data within portions of the memory material layers 54 located at the levels of the dummy electrically conductive layers 46U. Specifically, the memory device does not store data adjacent to the dummy word lines to avoid data integrity issues. The at least one source-select-level electrically conductive layer 46S is employed to activate or deactivate from the source side, a respective group (e.g., NAND memory string "finger") of memory stack structures 55 located in the memory block between a pair of backside trenches 79.

Generally, a combination of an alternating stack of insulating layers 32 and electrically conductive layers 46 and memory stack structures 55 that vertically extend through the alternating stack (32, 46) is provided. Each of the memory stack structures 55 comprises a respective vertical semiconductor channel 60 and a respective vertical stack of memory elements. The electrically conductive layers 46 can comprise, from bottom to top, at least one source-select-level electrically conductive layer 46S, word-line-level electrically conductive layers 46W, dummy electrically conductive layers 46U, and drain-select-level electrically conductive layers 46D. Each source region 61 (if present) is formed in an upper portion of the semiconductor material layer 9. Semiconductor channels (59, 11, 60) extend between each source region 61 and a respective set of drain regions 63. The semiconductor channels (59, 11, 60) include the vertical semiconductor channels 60 of the memory stack structures 55.

Figure 14A:
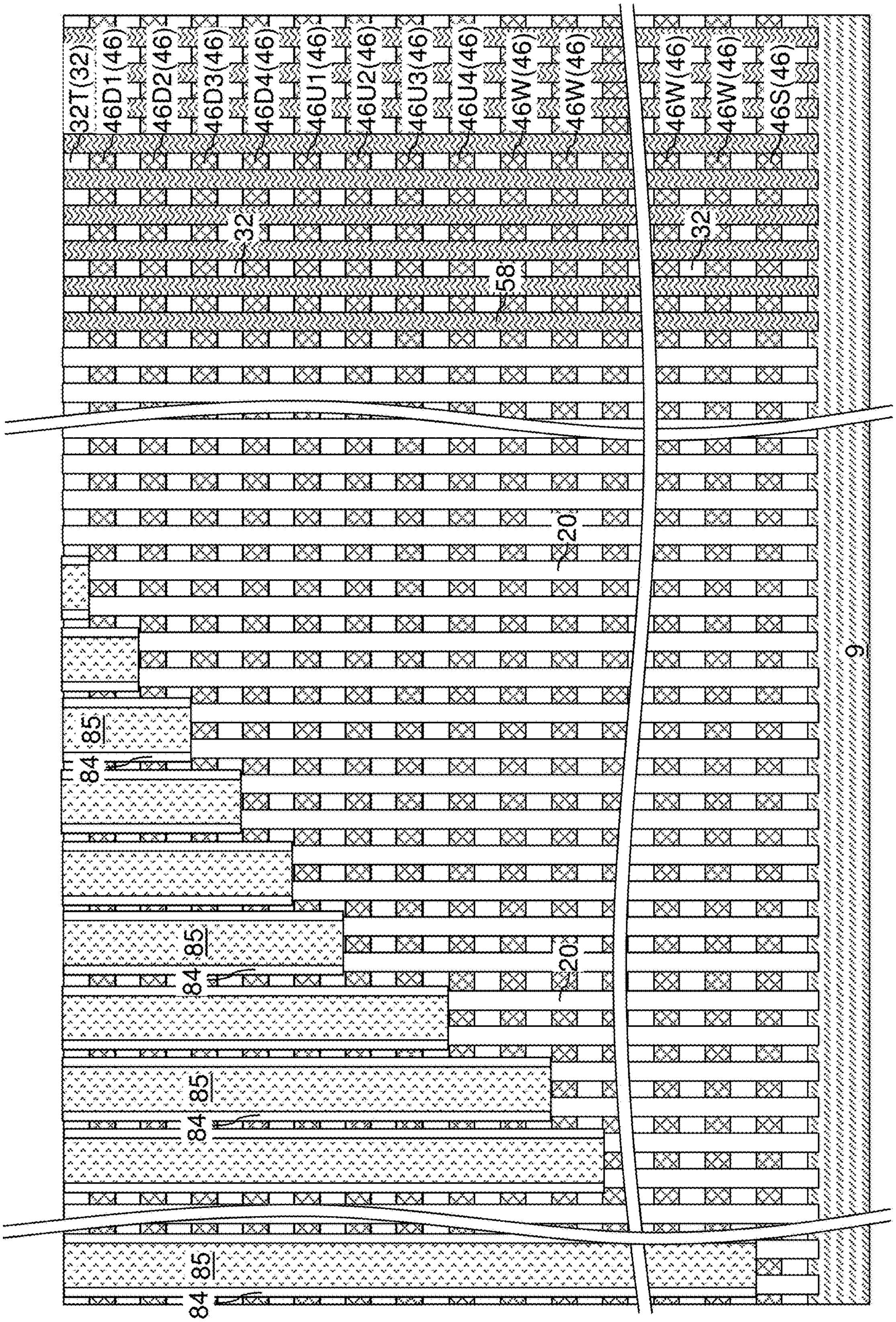
FIG. 14A is a vertical cross-sectional view of the exemplary structure after formation of backside trench fill structures according to an embodiment of the present disclosure.
Figure 14B:
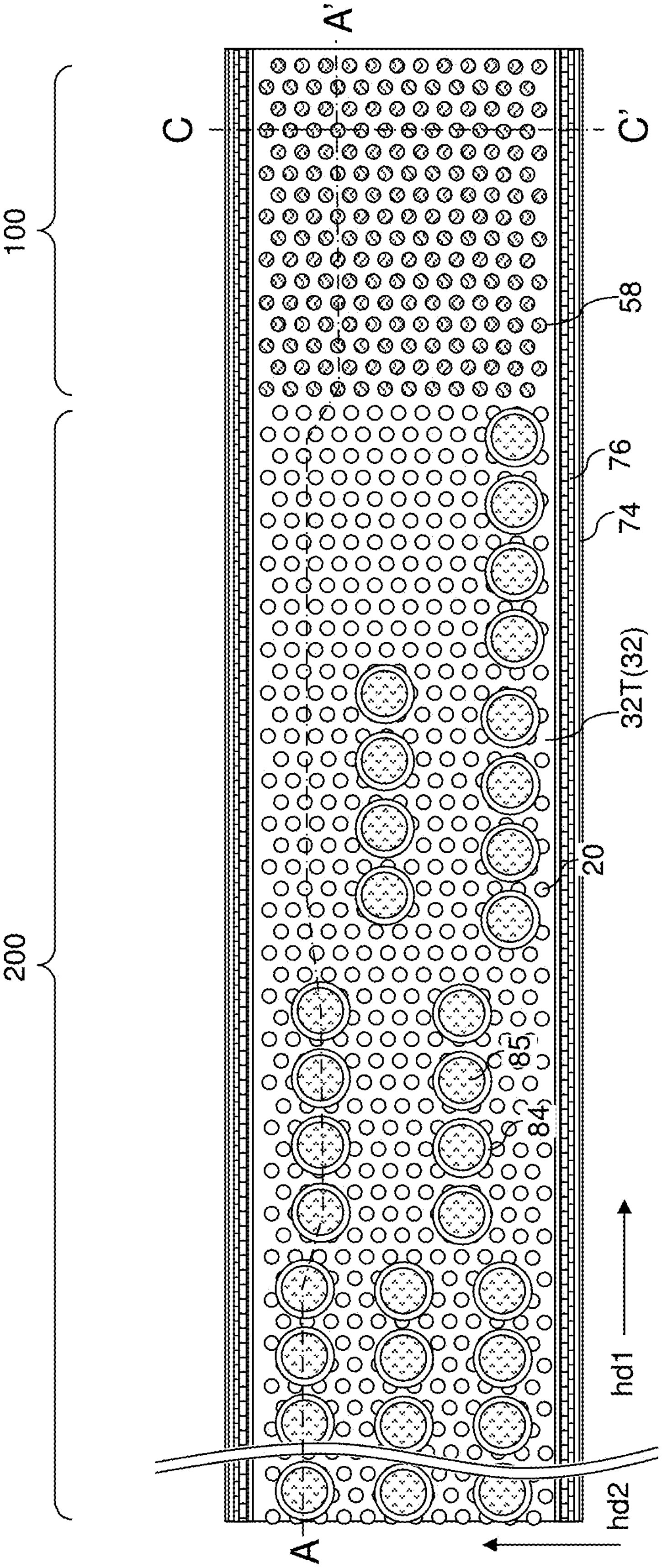
FIG. 14B is a top-down view of the exemplary structure of FIG. 14A. The vertical plane A-A' is the vertical cross-sectional plane of FIG. 14A.
Figure 14C:
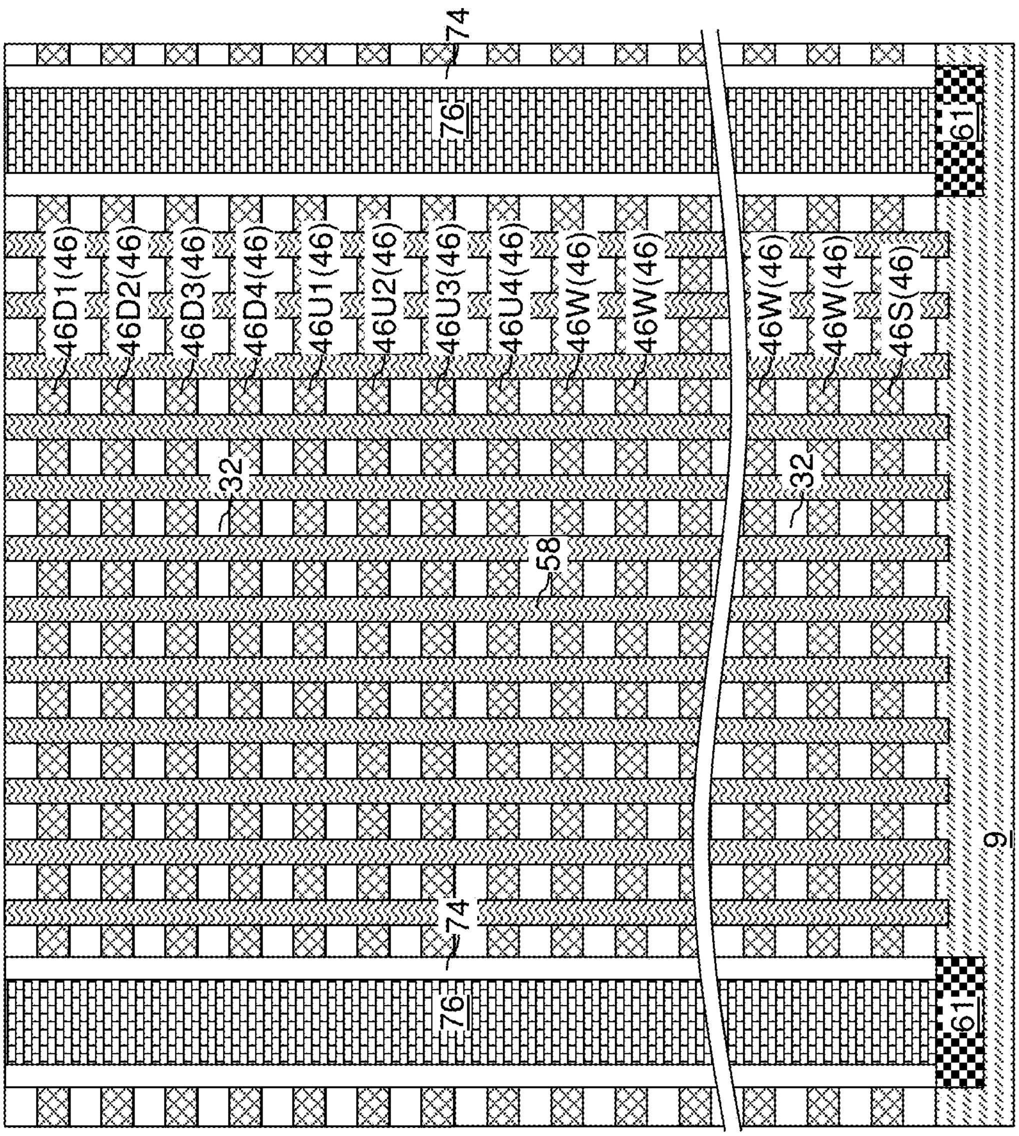
FIG. 14C is a vertical cross-sectional view of the exemplary structure along the vertical plane C-C' of FIG. 14A.
Figure 15A:
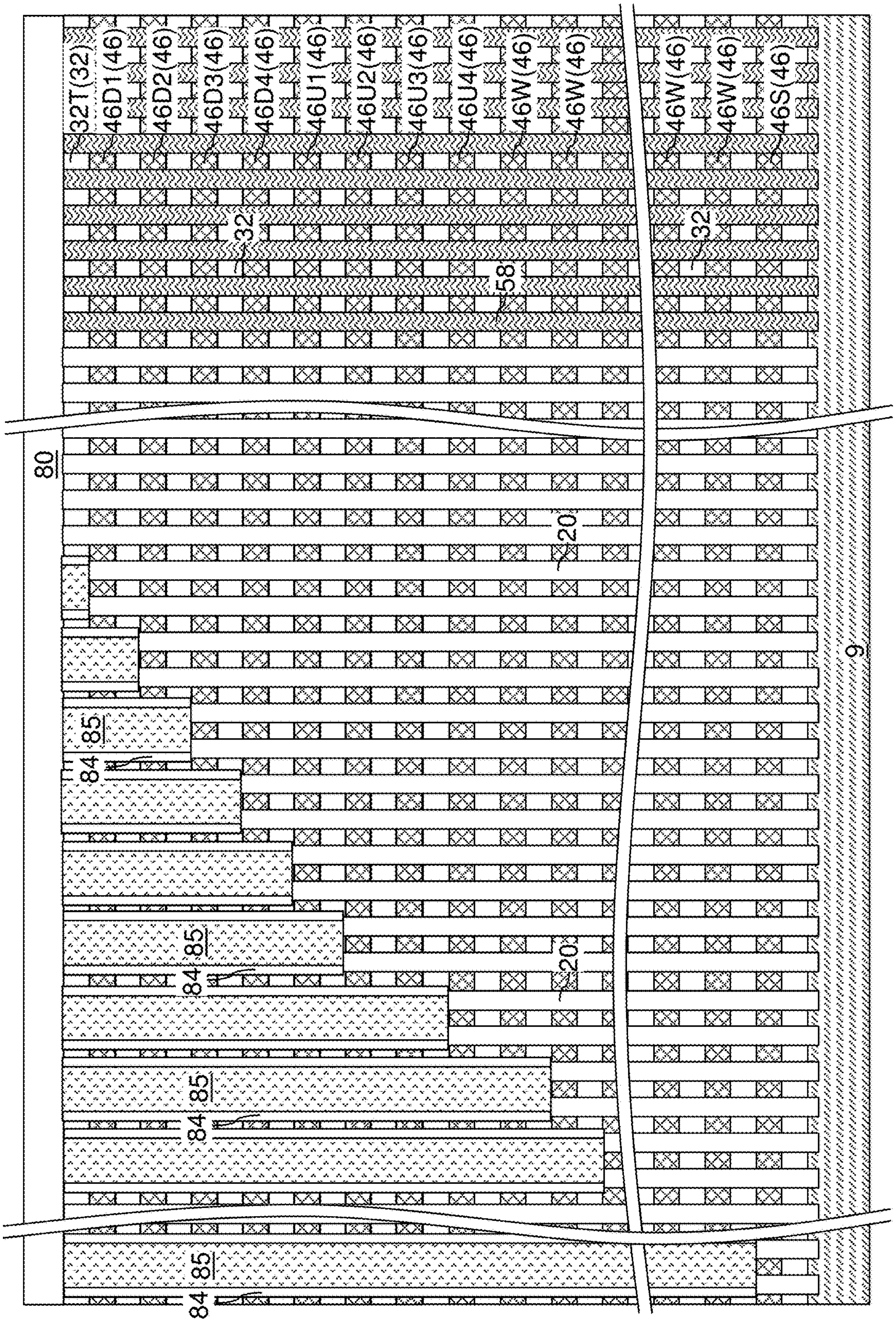
FIG. 15A is a vertical cross-sectional view of the exemplary structure after formation of a contact-level dielectric layer and first drain-select-level cavities according to an embodiment of the present disclosure.
Figure 15B:
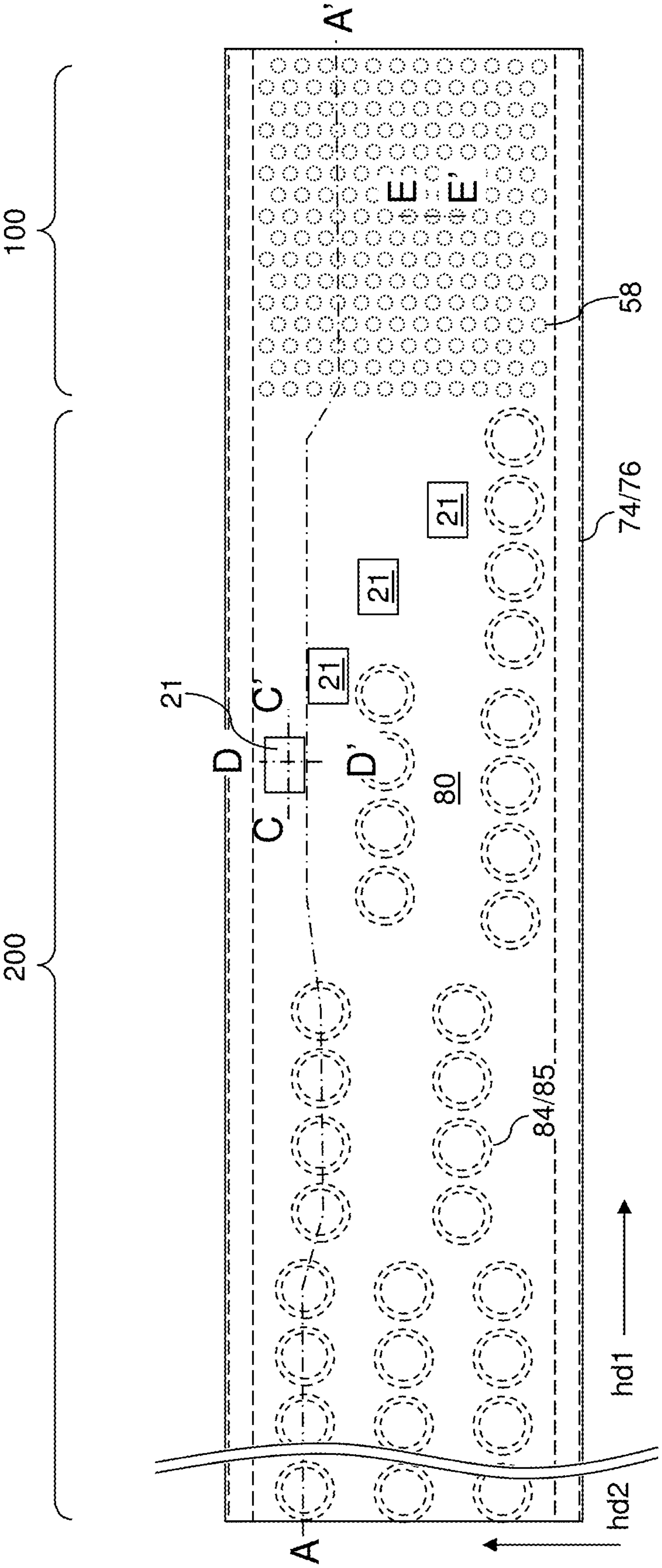
FIG. 15B is a top-down view of the exemplary structure of FIG. 15A. The vertical plane A-A' is the vertical cross-sectional plane of FIG. 15A.
Figure 15E:
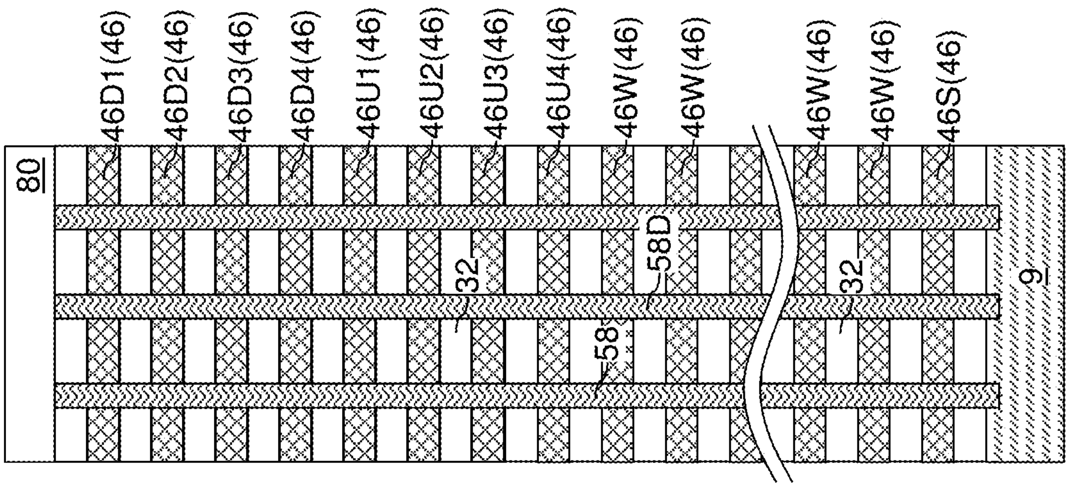
FIG. 15E is a vertical cross-sectional view of the exemplary structure along the vertical plane E-E' of FIG. 15B.
Figure 15D:
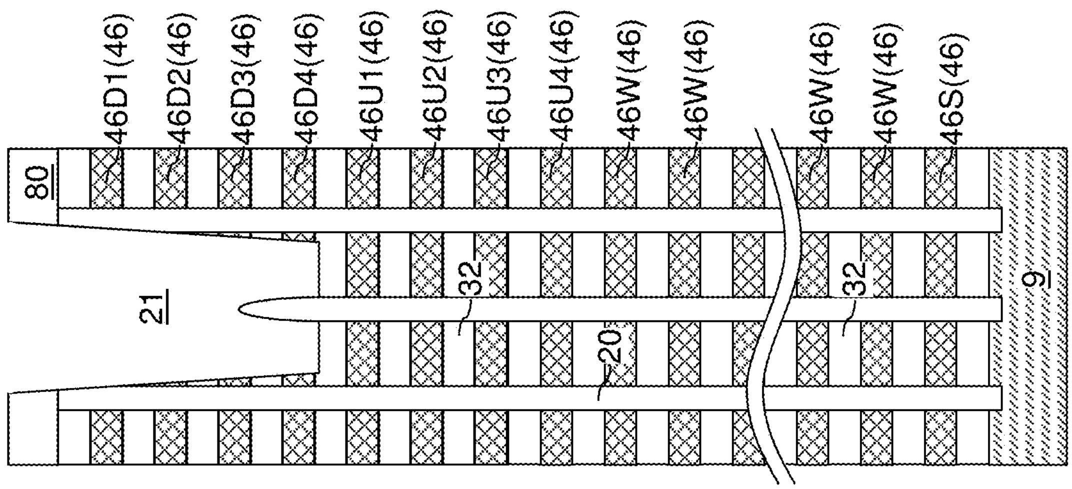
FIG. 15D is a vertical cross-sectional view of the exemplary structure along the vertical plane D-D' of FIG. 15B.
Figure 15C:
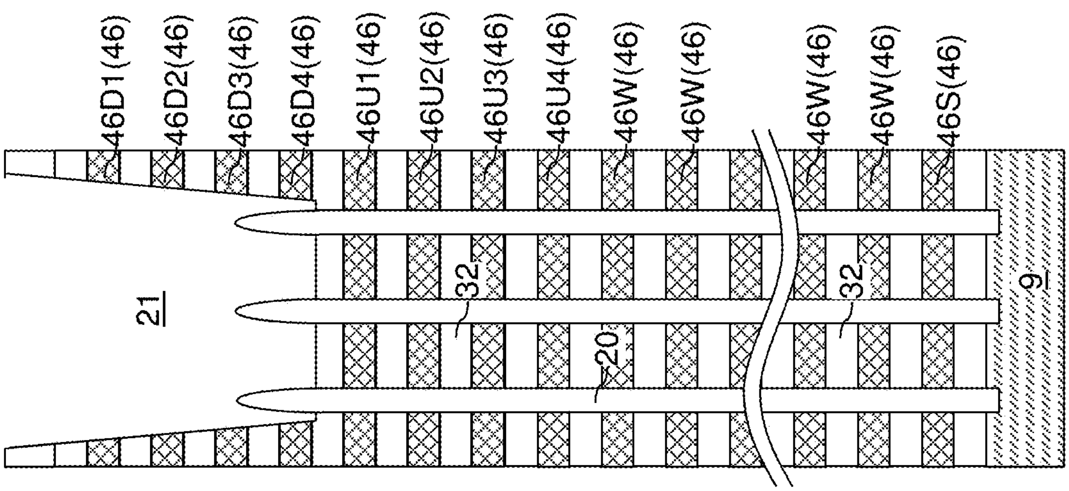
FIG. 15C is a vertical cross-sectional view of the exemplary structure along the vertical plane C-C' of FIG. 15B.
Figure 16A:
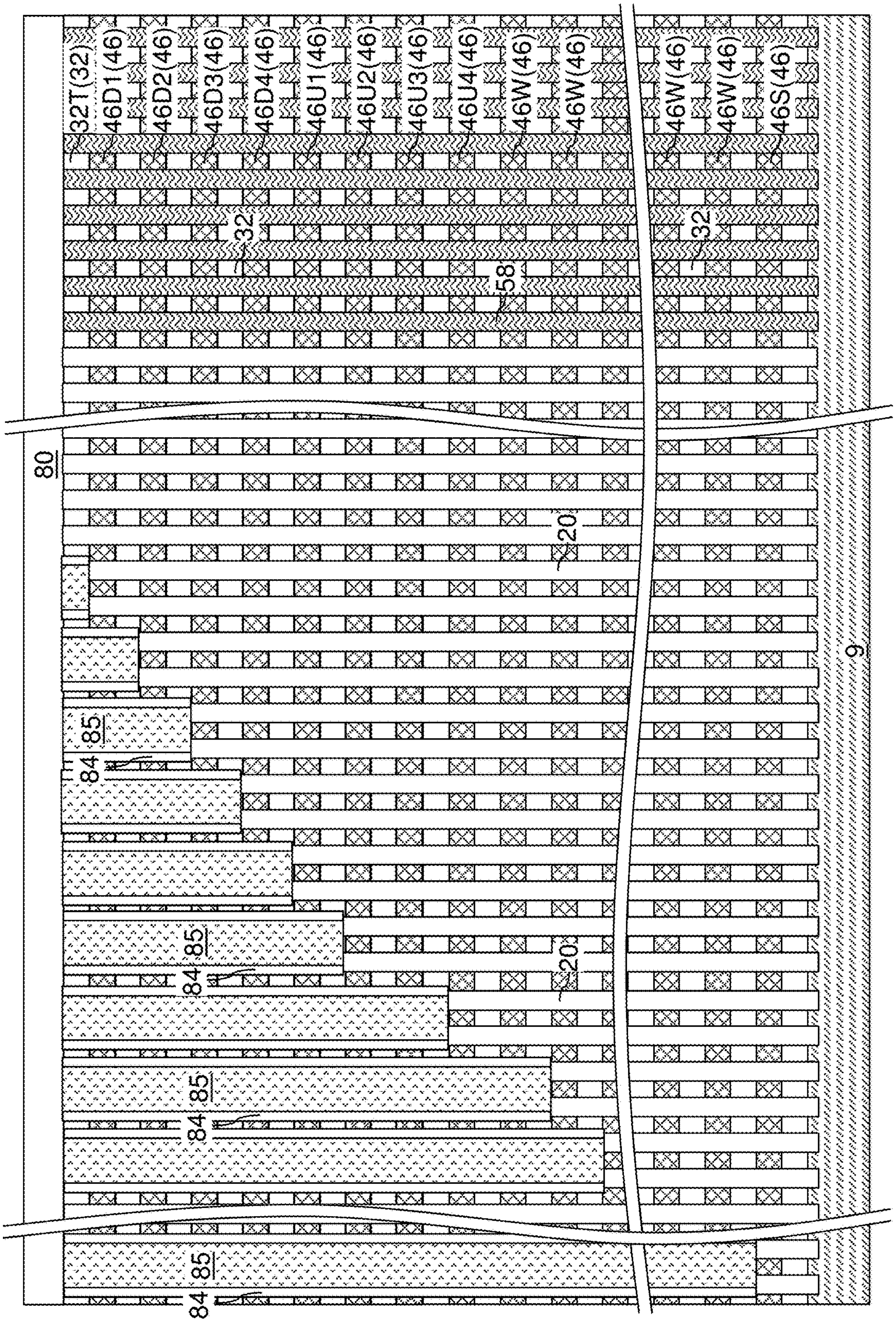
FIG. 16A is a vertical cross-sectional view of the exemplary structure after formation of first drain-select-level isolation material portions according to an embodiment of the present disclosure.
Figure 16B:
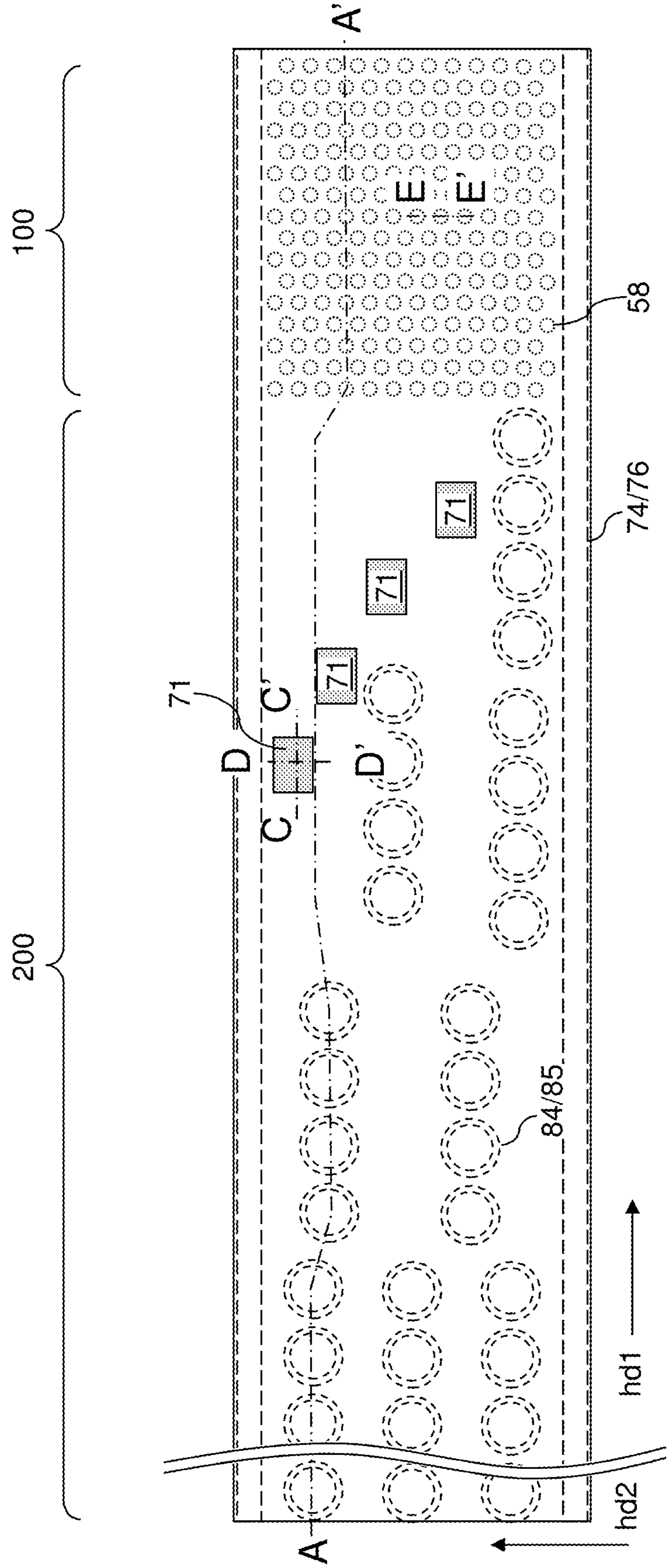
FIG. 16B is a top-down view of the exemplary structure of FIG. 16A. The vertical plane A-A' is the vertical cross-sectional plane of FIG. 16A.
Figure 16E:
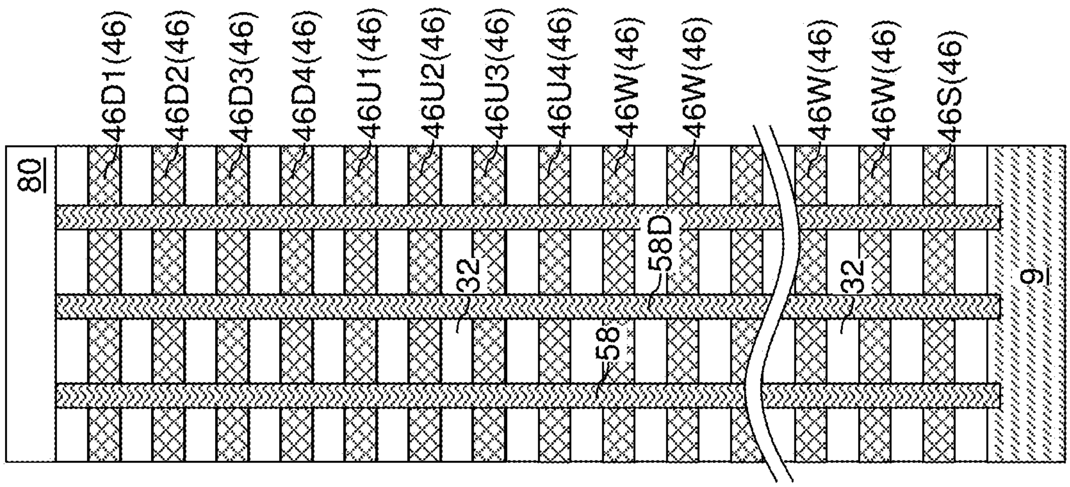
FIG. 16E is a vertical cross-sectional view of the exemplary structure along the vertical plane E-E' of FIG. 16B.
Figure 16D:
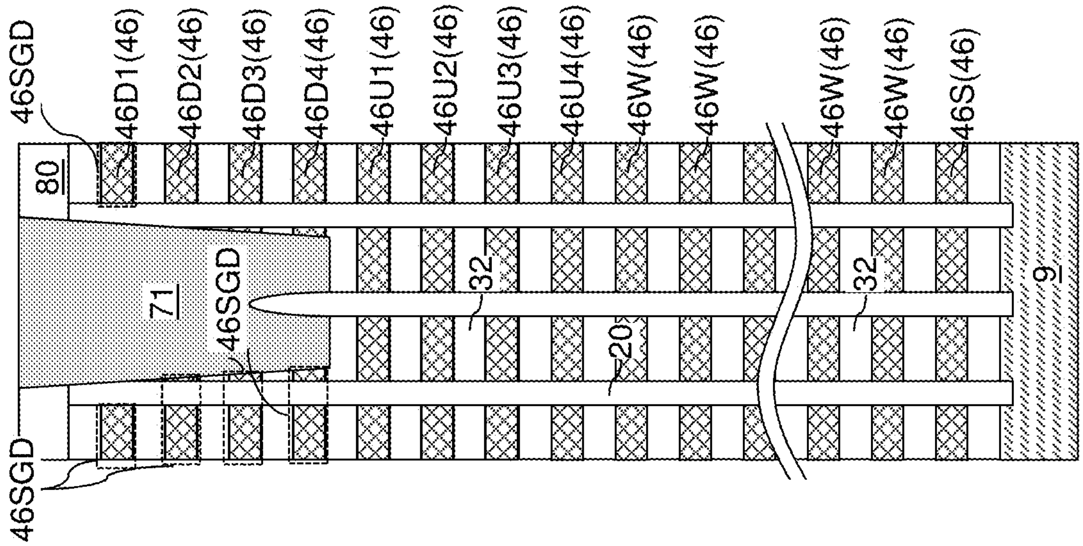
FIG. 16D is a vertical cross-sectional view of the exemplary structure along the vertical plane D-D' of FIG. 16B.
Figure 16C:
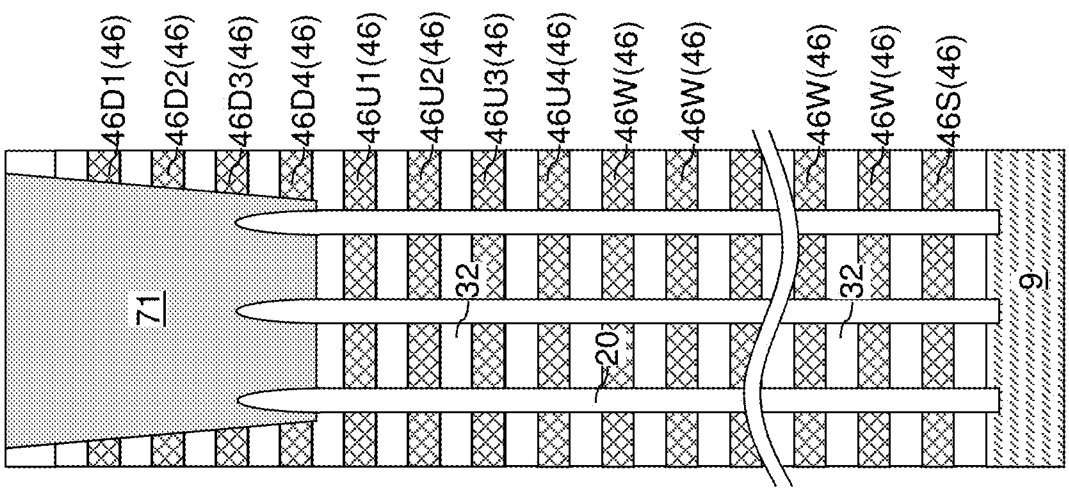
FIG. 16C is a vertical cross-sectional view of the exemplary structure along the vertical plane C-C' of FIG. 16B.

Referring to FIGS. 14A-14C, an insulating material layer can be formed in the backside trenches 79 and over the sacrificial capping material layer by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the sacrificial capping material layer and at the bottom of each backside trench 79. Each remaining portion of the insulating material layer constitutes an insulating spacer 74. A backside cavity is present within a volume surrounded by each insulating spacer 74. A top surface of the source region 61 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material and the sacrificial capping material layer can be planarized employing the topmost insulating layer 32T as a stopping layer. If chemical mechanical planarization (CMP) process is employed, the topmost insulating layer 32T can be employed as a CMP stopping layer. Each remaining continuous portion of the at least one conductive material in the backside trenches 79 constitutes a backside contact via structure 76. The backside contact via structures 76 extends through the alternating stack (32, 46), and contacts a top surface of a respective source region 61. Each contiguous combination of an insulating spacer 74 and a backside contact via structure 76 constitutes a backside trench fill structure (74, 76).

The exemplary structure includes an alternating stack of insulating layers 32 and electrically conductive layers 46 that is located over a substrate. The alternating stack (32, 46) is laterally bounded by a first backside trench fill structure (74, 76) and a second backside trench fill structure (74, 76) that are located within a first backside trench 79 and a second backside trench 79, respectively. The electrically conductive layers 46 comprise word-line-level electrically conductive layers 46W and a drain-select-level electrically conductive layer 46D. Memory stack structures 55 vertically extend through the alternating stack (32, 46). The first backside trench fill structure (74, 76) and the second backside trench fill structure (74, 76) vertically extend from a bottommost layer of the alternating stack (32, 46) to a topmost layer of the alternating stack (32, 46), laterally extend along a first horizontal direction hd1, and are laterally spaced apart from each other along a second horizontal direction hd2 by a uniform lateral spacing.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60

Referring to FIGS. 15A-15E, a contact-level dielectric layer 80 can be formed over the alternating stack (32, 46). The contact-level dielectric layer 80 comprises a dielectric material, such as silicon oxide, and may have a thickness in a range from 100 nm to 600 nm, although lesser and greater thicknesses may also be employed.

A first patterned etch mask layer (not shown) can be formed over the contact-level dielectric layer 80. In one embodiment, the first patterned etch mask layer may comprise a photoresist layer that is applied over the contact-level dielectric layer 80 and is subsequently lithographically patterned to form discrete openings. The discrete openings may be formed in areas of the contact region 200 along which composite drain-select-level isolation structures are to be subsequently formed. The discrete openings may be formed in areas of the contact region 200 that are proximal to the memory array region 100, but may terminate before reaching the memory array region 100. A first anisotropic etch process can be performed to transfer the pattern of the openings in the photoresist layer through the contact-level dielectric layer 80 and each of the drain-select-level electrically conductive layers 46D and each insulating layer 32 that overlies the bottommost drain-select-level electrically conductive layer 46D.

According to an aspect of the present disclosure, the first anisotropic etch process comprises an alternating sequence of multiple iterations of a first anisotropic selective etch step that etches a material of the insulating layers 32 selective to a material of the drain-elect-level electrically conductive layers 46 and a second anisotropic selective etch step that etches the material of the drain-select-level electrically conductive layers 46D selective to the material of the insulating layers 32. The first anisotropic etch process etches through portions of each of the drain-select-level electrically conductive layers 46D in the contact region 200 that are not masked by the first patterned etch mask.

In one embodiment, support pillar structures 20 vertically extending through the alternating stack (32, 46) and comprising a dielectric material (such as silicon oxide) are present in the contact region 200. In one embodiment, the first anisotropic etch process collaterally vertically recesses a first subset of the support pillar structures 20 that is located within the areas of the openings in the first patterned etch mask layer. The first subset of the support pillar structures 20 may be vertically recessed only during the first anisotropic selective etch steps, and is not significantly recessed during the second anisotropic selective etch steps. As a consequence, top portions of the first subset of the support pillar structures 20 protrude above bottom surfaces of the cavities that are formed by the first anisotropic etch process.

First drain-select-level cavities 21 are formed in volumes from which materials of the contact-level dielectric layer 80, the drain-select-level electrically conductive layers 46D, and a subset of the insulating layers 32 are removed. The first drain-select-level cavities 21 can be discrete cavities that are laterally spaced from each other. In one embodiment, each of the first drain-select-level cavities 21 may have first width along the second horizontal direction hd2. In one embodiment, the first subset of the support pillar structure 20 vertically extends through each of the word-line-level electrically conductive layers 46W and the dummy electrically conductive layers 46U, and protrudes into a respective one of the first drain-select-level cavities 21.

Referring to FIGS. 16A-16E, a first dielectric fill material can be deposited in the first drain-select-level cavities 21. Excess portions of the first dielectric fill material can be removed from above the horizontal plane including the top surface of the contact-level dielectric layer 80 by a planarization process such as a chemical mechanical polishing process or a recess etch process. Remaining portions of the first dielectric fill material comprise first drain-select-level isolation material portions 71. The first dielectric fill material of the first drain-select-level isolation material portions 71 may comprise a doped silicate glass or an undoped silicate glass (i.e., silicon oxide).

The first drain-select-level isolation material portions 71 are formed in the first drain-select-level cavities 21, which are discrete cavities. In one embodiment, the first drain-select-level isolation material portions 71 are formed directly on the first subset of the support pillar structures 20. The first drain-select-level isolation material portions 71 are formed above the horizontal plane including topmost surfaces of the dummy electrically conductive layers 46U. In one embodiment, the dummy electrically conductive layers 46U do not contact the first drain-select-level isolation material portions 71. Thus, each dummy electrically conductive layer 46U located in a memory block between a respective pair of backside trench fill structures (74, 76) is not patterned during formation by the first drain-select-level cavities 21.

The first subset of the support pillar structures 20 vertically extends through each of the word-line-level electrically conductive layers 46W and the dummy electrically conductive layers 46U and protrudes into a respective one of the first drain-select-level isolation material portions 71. In one embodiment, a topmost surface of each support pillar structure 20 within the first subset of the support pillar structures 20 is located below a horizontal plane including top surfaces of the first drain-select-level isolation material portions 71 and above a horizontal plane including bottom surfaces of the first drain-select-level isolation material portions 71. The first subset of the support pillar structures 20 have convex upper tips.

Referring to FIGS. 17A-17E, a second patterned etch mask layer (not shown) can be formed over the contact-level dielectric layer 80. In one embodiment, the second patterned etch mask layer may comprise a photoresist layer that is applied over the contact-level dielectric layer 80 and is subsequently lithographically patterned to form line-shaped openings. The line shaped openings include straight segments that laterally extend along the first horizontal direction hd1 and additional straight segments and/or curved segments that laterally extend a respective horizontal direction that is not parallel to the first horizontal direction hd1. The line-shaped openings may be formed in the contact region 200 and in the memory array region 100.

A second anisotropic etch process can be performed to transfer the pattern of the openings in the photoresist layer through the contact-level dielectric layer 80, each of the drain-select-level electrically conductive layers 46D, through one or more of the dummy electrically conductive layers 46U and optionally through the lateral edge portions of the first drain-select-level isolation material portions 71. If the second anisotropic etch process etches through the optionally through the lateral edge portions of the first drain-select-level isolation material portions 71, then the areas etched during the first and second anisotropic etch processes partially overlap. The second anisotropic etch process may have an etch chemistry that simultaneously etches the material of the insulating layers 32 and the material of the electrically conductive layers 46, such as the drain-select-level electrically conductive layers 46D. In other words, the etch chemistry of the second anisotropic etch process may be non-selective and indiscriminate with respect to the materials of the insulating layers 32 and electrically conductive layers 46. In one embodiment, the ratio of the etch rate of the material of the insulating layers 32 and the etch rate of the material of the electrically conductive layers 46 may be in a range from 0.5 to 2.0, such as from ⅔ to 1.5, and/or from 0.75 to ¾.

The second anisotropic etch process forms second drain-select-level trenches 22 through the drain-select-level electrically conductive layers 46D and through at least one dummy electrically conductive layer 46U and optionally through lateral edge portions of the first drain-select-level isolation material portions 71. The second drain-select-level trenches 22 may comprise narrow line cavities within minimal line broadening. The duration of the second anisotropic etch process is selected so that all of the drain-select-level electrically conductive layers 46D are etched through even in the case of the lowest etch rate that is possible under process assumptions for the second anisotropic etch process.

Further, the duration of the second anisotropic etch process is selected such that none of the word-line-level electrically conductive layers 46W are etched even in the case of the highest etch rate that is possible under process assumptions of the second anisotropic etch process. In one embodiment, the total number of layers of the dummy electrically conductive layers 46U between a neighboring pair of backside trench fill structures (74, 76) may be Q (where Q is an integer greater than 1), and the duration of the second anisotropic etch process may be selected such that Q/2 number of dummy electrically conductive layers 46U are etched by the second anisotropic etch process under nominal process conditions. Each remaining portion of the first drain-select-level isolation material portions 71 may function as a structure connecting a pair of second drain-select-level trenches 22, which are laterally spaced apart from each other by the first drain-select-level isolation material portion 71.

Figure 17A:
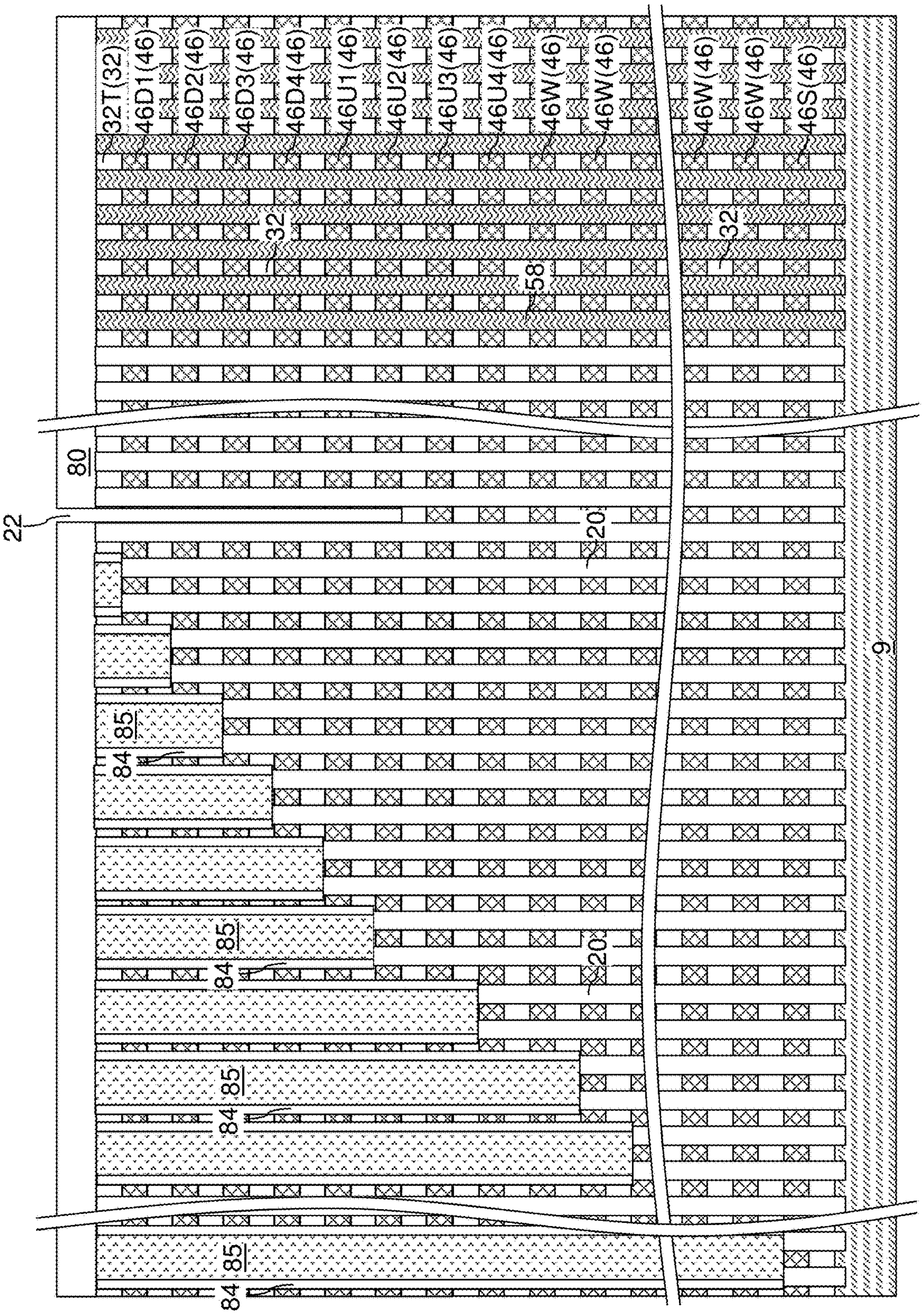
FIG. 17A is a vertical cross-sectional view of the exemplary structure after formation of second drain-select-level cavities according to an embodiment of the present disclosure.
Figure 17B:
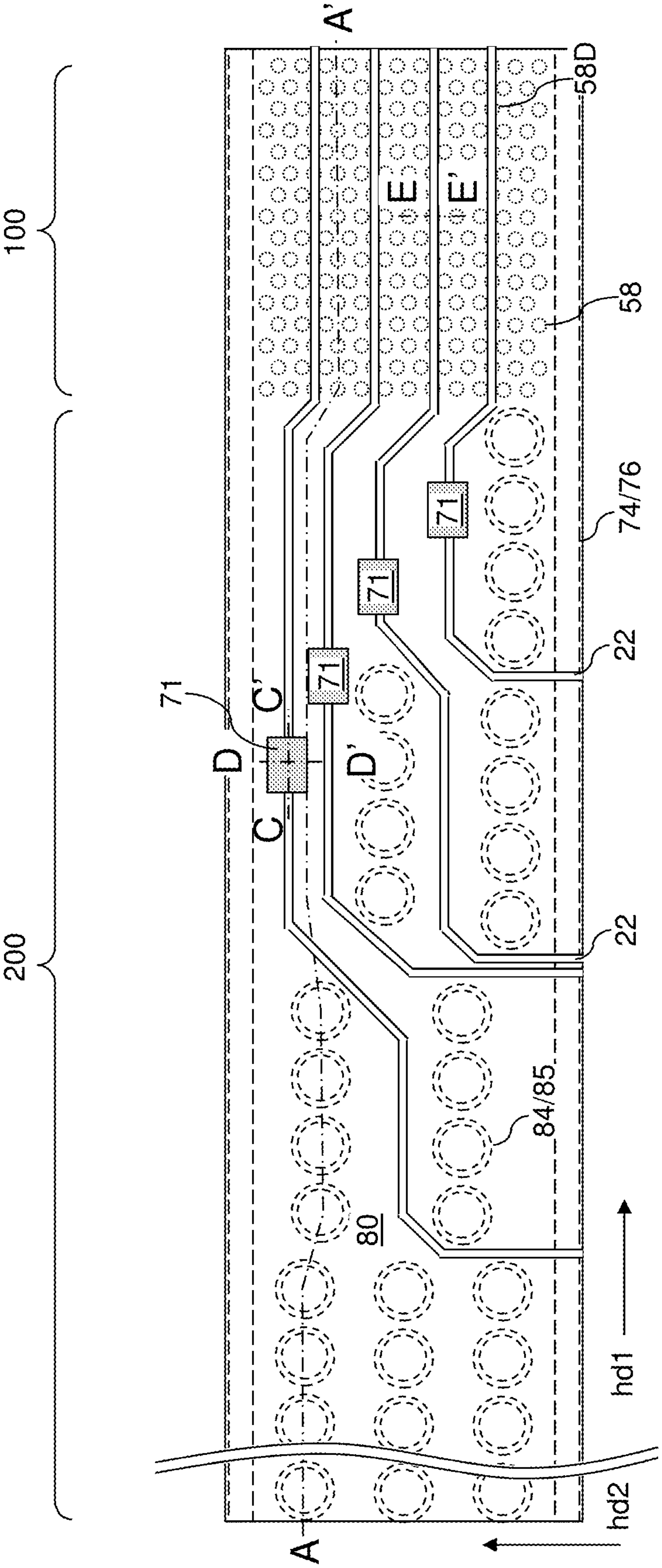
FIG. 17B is a top-down view of the exemplary structure of FIG. 17A. The vertical plane A-A' is the vertical cross-sectional plane of FIG. 17A.
Figure 17E:
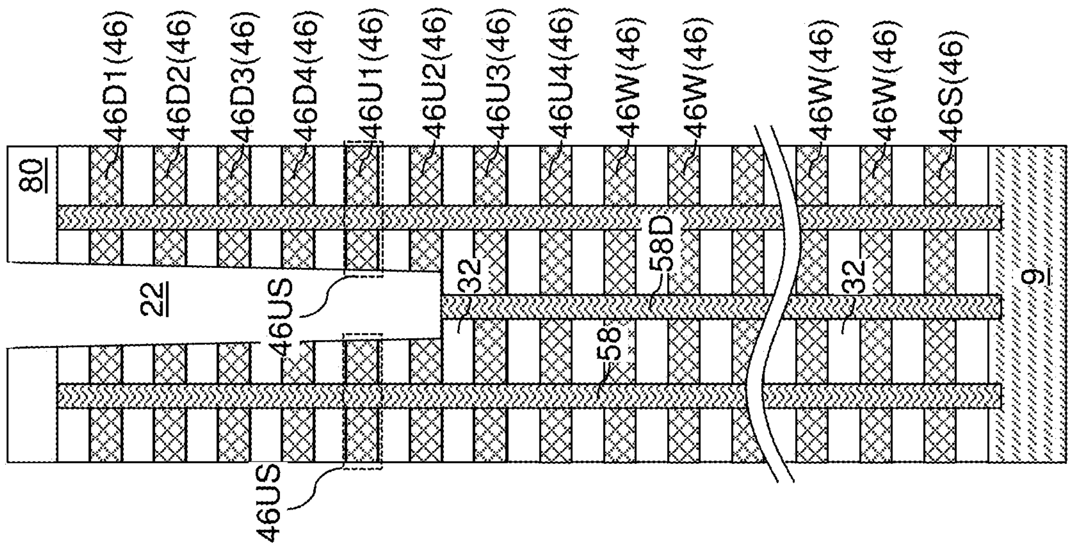
FIG. 17E is a vertical cross-sectional view of the exemplary structure along the vertical plane E-E' of FIG. 17B.
Figure 17D:
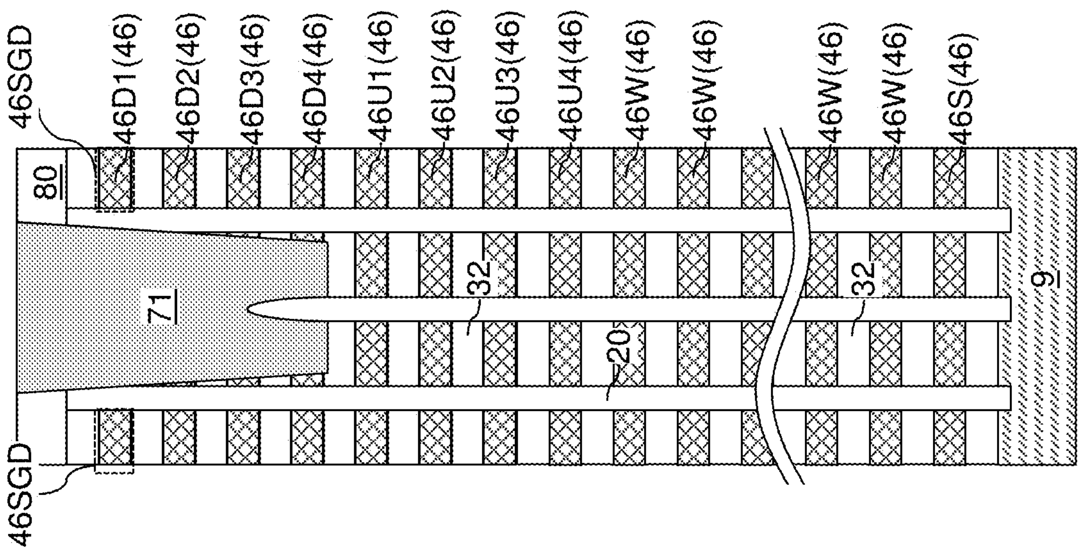
FIG. 17D is a vertical cross-sectional view of the exemplary structure along the vertical plane D-D' of FIG. 17B.
Figure 17C:
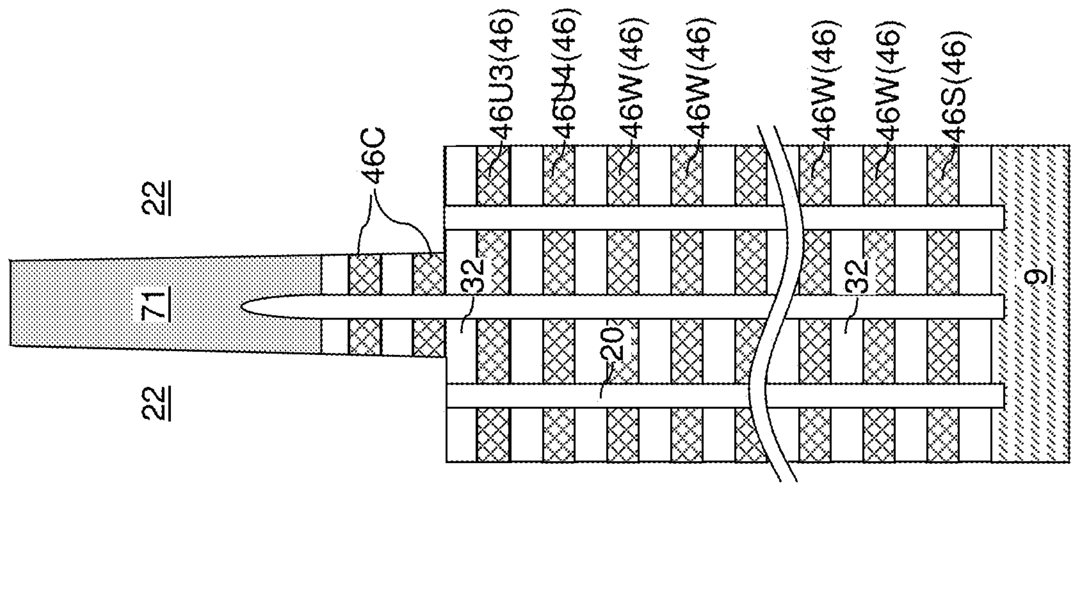
FIG. 17C is a vertical cross-sectional view of the exemplary structure along the vertical plane C-C' of FIG. 17B.

In the illustrated example of FIGS. 17A-17C, the number Q is 4. In this case, the duration of the second anisotropic etch process can be selected such that the second anisotropic etch process etches through all of the drain-select-level electrically conductive layers 46D and two of the four dummy electrically conductive layers 46U under nominal process conditions. In case the second anisotropic etch process provides a maximum possible etch rate allowed under the process assumptions, the second anisotropic etch process may etch through all of the word-line-level electrically conductive layers 46D and more than two dummy electrically conductive layers 46U but does not etch any of the word-line-level electrically conductive layers 46W. In case the second etch process provides a minimum possible etch rate allowed under the process assumptions, the second anisotropic etch process etches through all of the word-line-level electrically conductive layers 46D and may, or may not etch any of the dummy electrically conductive layers 46U.

In one embodiment, second anisotropic etch process collaterally vertically recesses a second subset of the support pillar structures 20 such that top surfaces of the second subset of the support pillar structures 20 are recessed to a height of bottom surfaces of the second drain-select-level trenches 22. In one embodiment, the second drain-select-level trenches 22 may have a second width between a respective pair of lengthwise sidewalls. In one embodiment, each of the first drain-select-level isolation material portions 71 has a first width along the second horizontal direction hd2, and the first width is greater than the second width. In an illustrative example, the first width may be in a range from 20 nm to 400 nm, such as from 40 nm to 200 nm, and the second width may be in a range from 10 nm to 100 nm, such as from 20 nm to 60 nm, although lesser and greater widths may also be employed.

In one embodiment, portions of the second drain-select-level trenches 22 that are formed in the memory array region 100 may be formed over a respective row of memory stack structures 55 located within a respective row of memory opening fill structures 58. Such memory stack structures 55 are not employed as a vertical stack of memory cells (i.e., are not used to store data), and thus, are herein referred to as dummy memory stack structures. The corresponding memory opening fill structures including the dummy memory stack structures are herein referred to as dummy memory opening fill structures 58D. A row of dummy memory opening fill structures 58D can be physically exposed at the bottom of each second drain-select-level trench 22 located in the memory array region 100. In one embodiment, the second anisotropic etch process collaterally vertically recesses a subset of the memory stack structures 55 which are dummy memory stack structures. Top surfaces of the subset of the memory stack structures are recessed to the height of the bottom surfaces of the second drain-select-level trenches 22.

In one embodiment, each of the drain-select-level electrically conductive layers 46D can be divided into a respective set of drain-select-level electrically conductive strips (i.e., drain side select gate electrodes) 46SGD that are laterally spaced and are electrically isolated from each other. Portions of the dummy electrically conductive layers 46U that underlie the first drain-select-level isolation material portions 71 are not etched during the second anisotropic etch process. Thus, each connecting portion 46C of the dummy electrically conductive layers 46U functions as a connection (i.e., "bridge") region for each dummy electrically conductive layer 46U that is etched through by the second anisotropic etch process. Each dummy electrically conductive layer 46U through which the second drain-select-level trenches 22 are formed remains as a respective continuous material layer including a plurality of dummy electrically conductive strips 46US that are interconnected to each other through connecting portions 46C that underlie the first drain-select-level isolation material portions 71. Thus, the drain-select-level electrically conductive strips (i.e., drain side select gate electrodes) 46SGD in adjacent NAND memory string "fingers" are laterally isolated from each other by the drain-select-level isolation material portions 71. In contrast, portions of the same dummy electrically conductive layer 46U located in adjacent NAND memory string "fingers" are electrically connected to each other via the connecting portion 46C. Thus, the dummy electrically conductive layer 46U are not left to electrically float during operation of the memory device.

In one embodiment, the memory opening fill structures 58 are arranged as rows of memory opening fill structures 58 along a first horizontal direction hd1 that is parallel to a lengthwise direction of the first backside trench fill structure (74, 76) and the second backside trench fill structure (74, 76). A subset of the second drain-select-level trenches 22 laterally extends along the first horizontal direction hd1 between a respective neighboring pair of rows of memory opening fill structures 58.

Figure 18A:
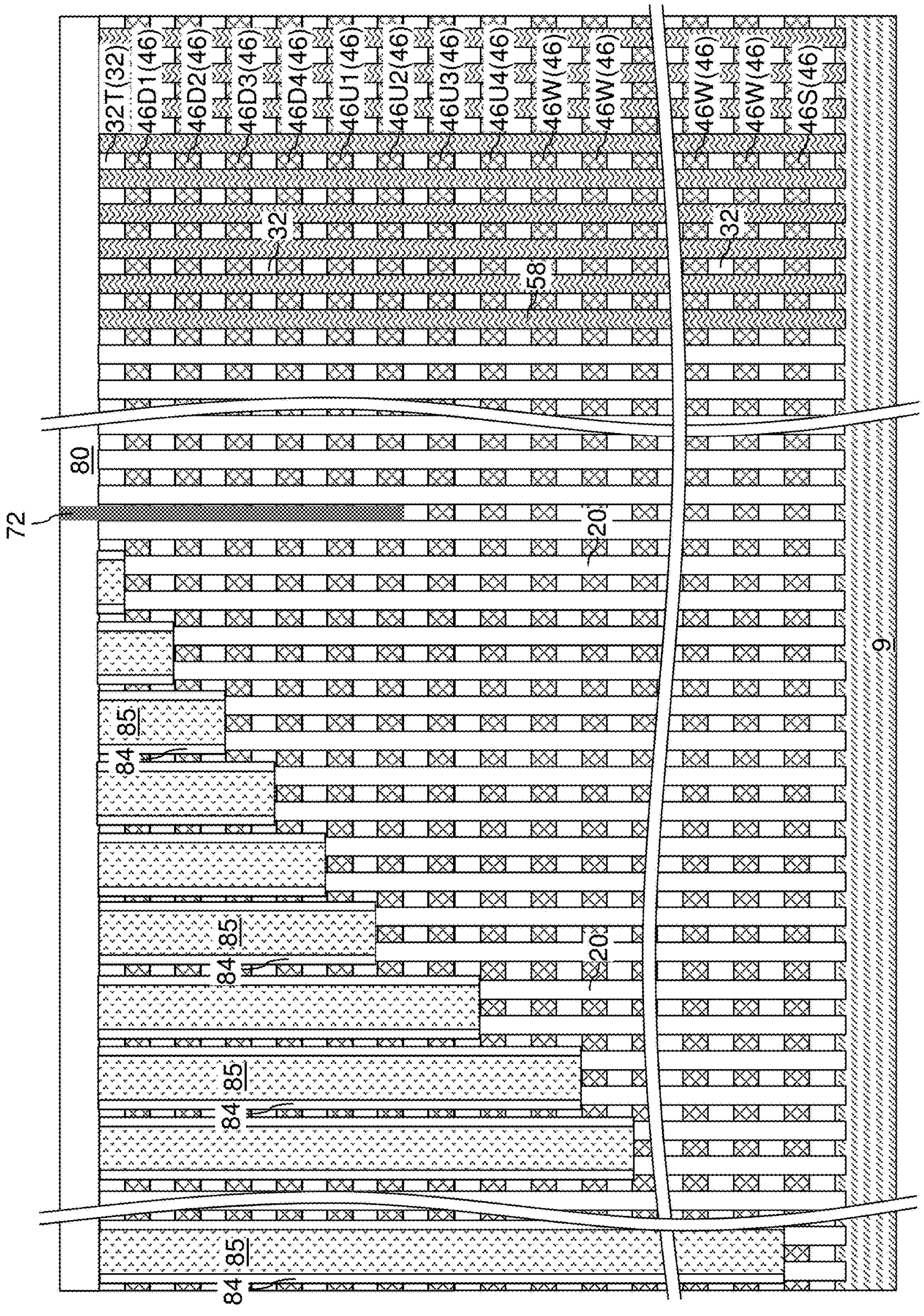
FIG. 18A is a vertical cross-sectional view of the exemplary structure after formation of second drain-select-level isolation material portions according to an embodiment of the present disclosure.
Figure 18B:
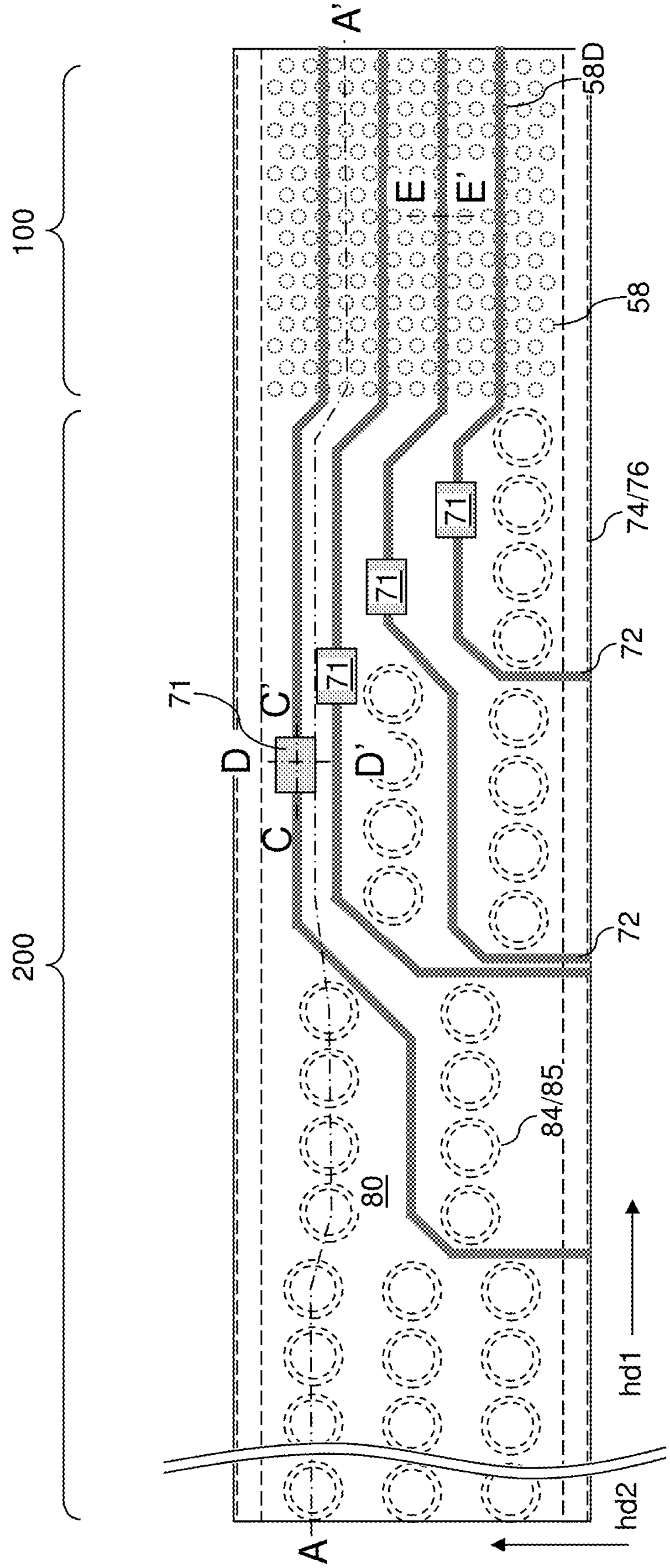
FIG. 18B is a top-down view of the exemplary structure of FIG. 18A. The vertical plane A-A' is the vertical cross-sectional plane of FIG. 18A.
Figure 18E:
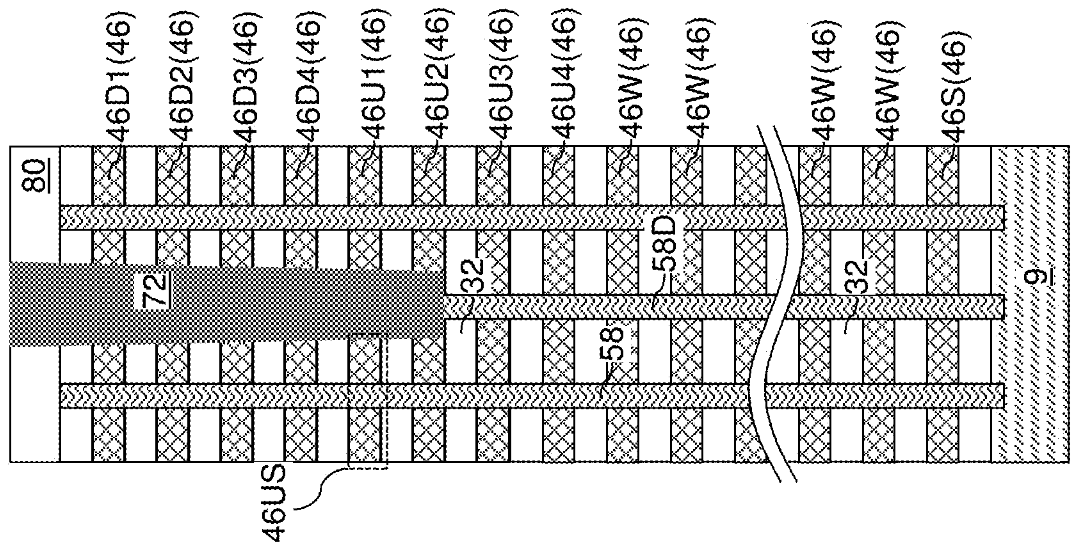
FIG. 18E is a vertical cross-sectional view of the exemplary structure along the vertical plane E-E' of FIG. 18B.
Figure 18D:
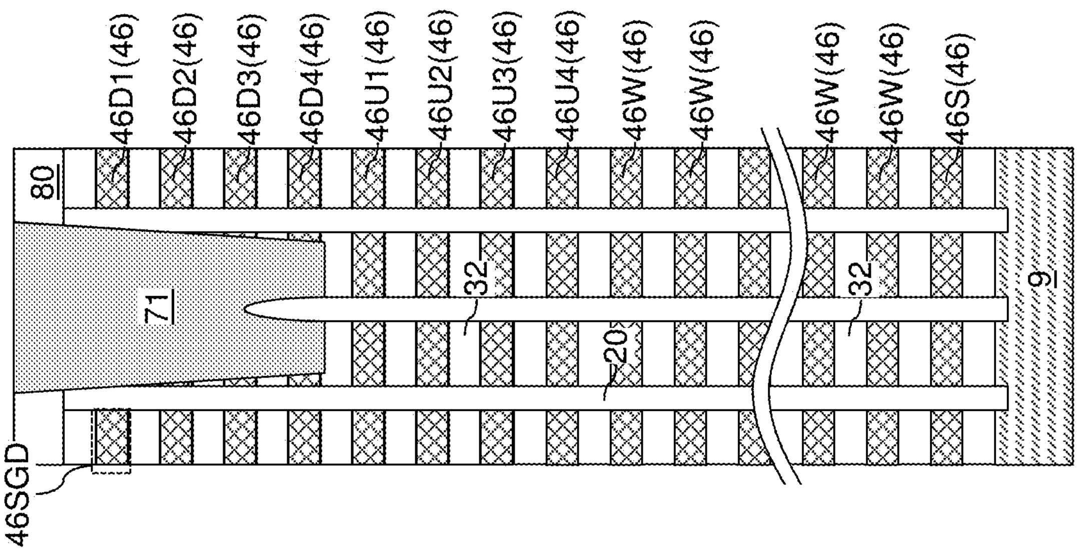
FIG. 18D is a vertical cross-sectional view of the exemplary structure along the vertical plane D-D' of FIG. 18B.
Figure 18C:
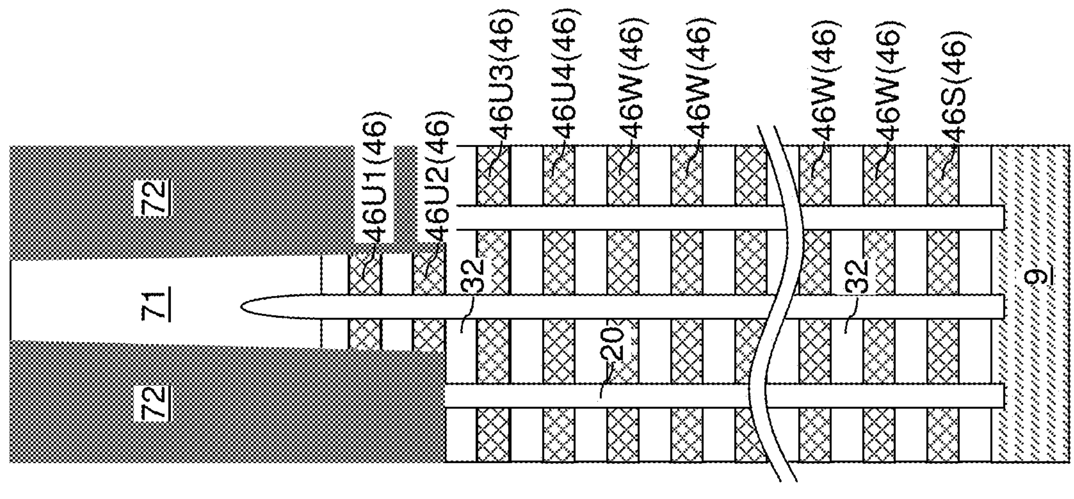
FIG. 18C is a vertical cross-sectional view of the exemplary structure along the vertical plane C-C' of FIG. 18B.
Figure 19A:
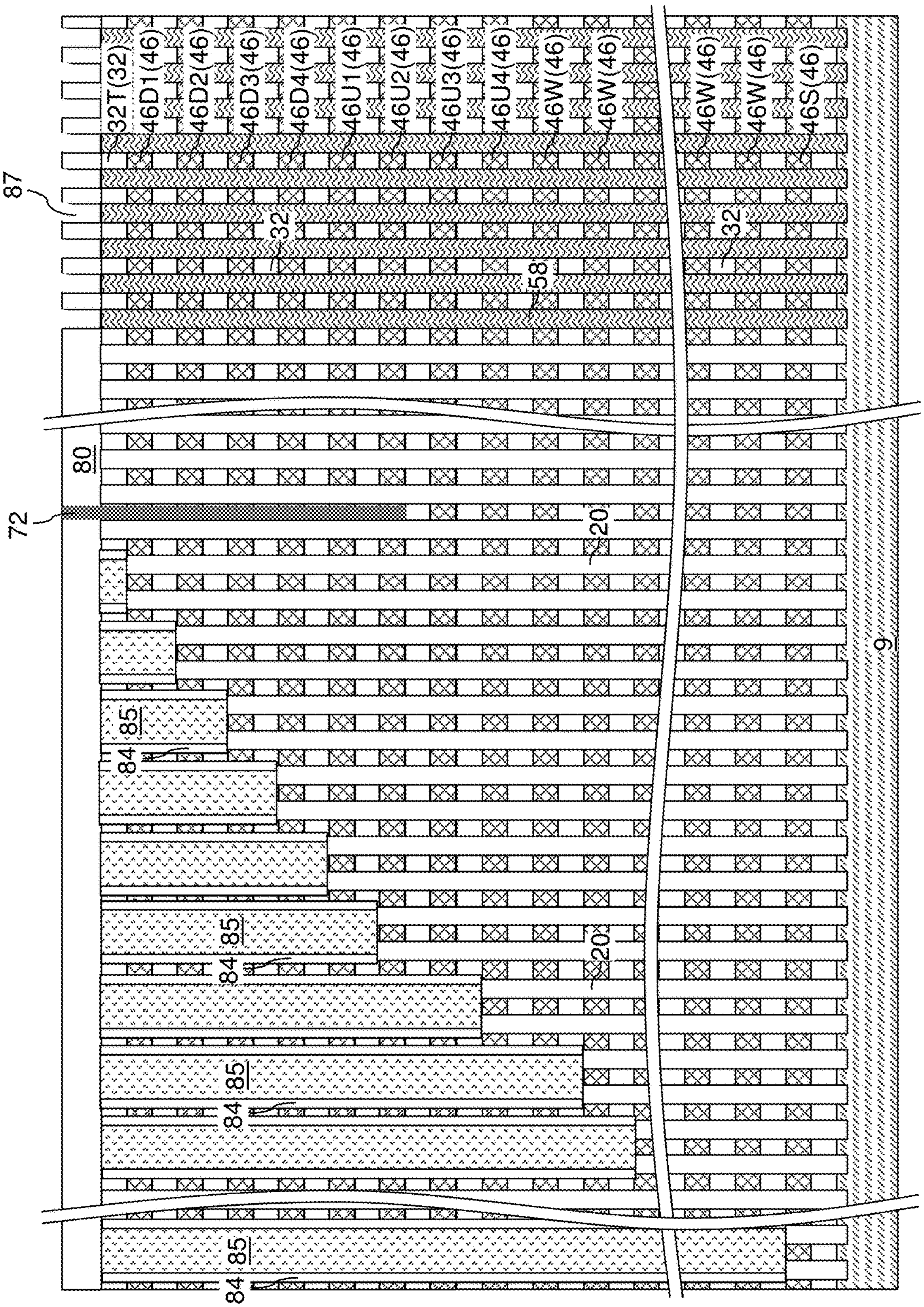
FIG. 19A is a vertical cross-sectional view of the exemplary structure after formation of drain contact via cavities according to an embodiment of the present disclosure.
Figure 19B:
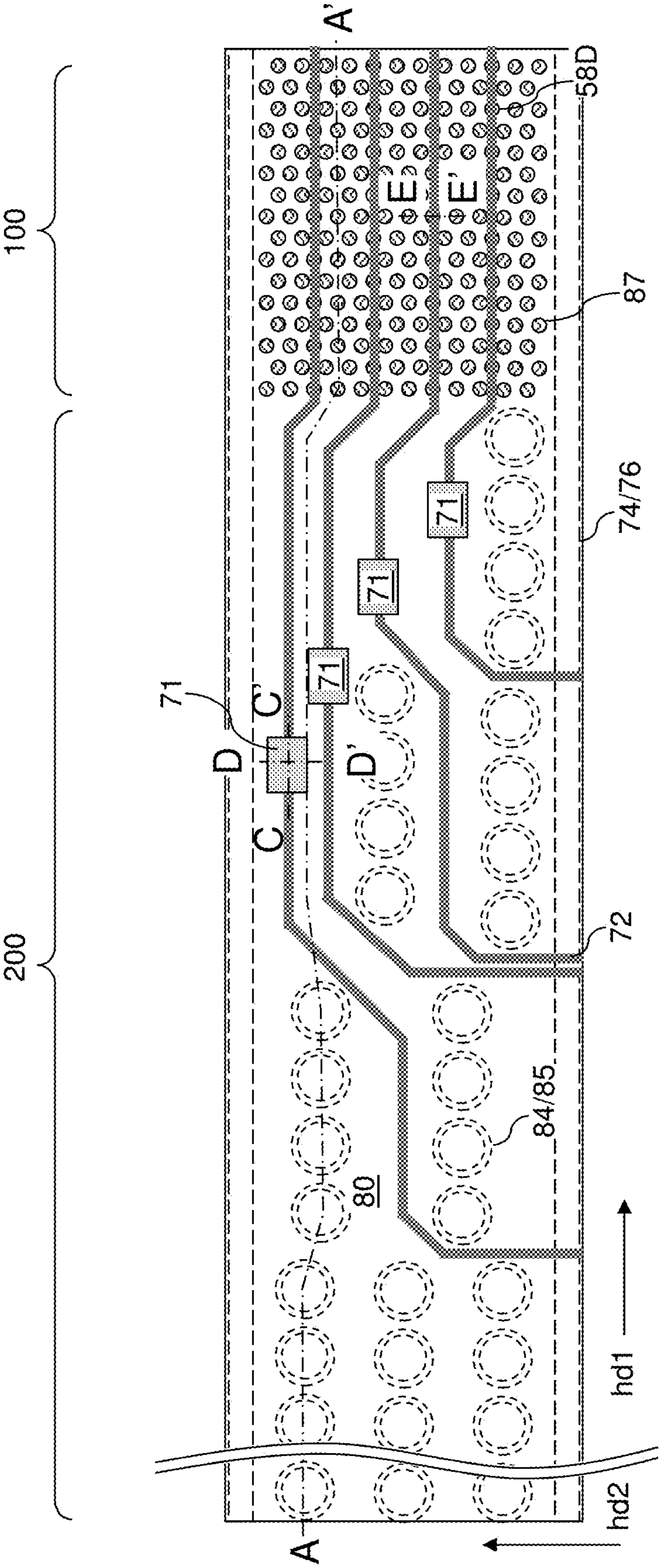
FIG. 19B is a top-down view of the exemplary structure of FIG. 19A. The vertical plane A-A' is the vertical cross-sectional plane of FIG. 19A.
Figure 19E:
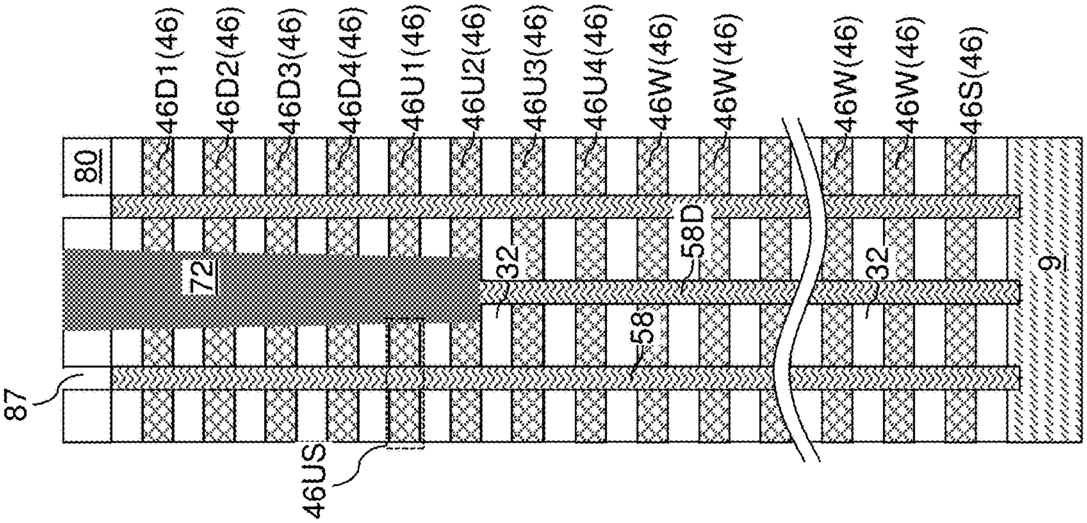
FIG. 19E is a vertical cross-sectional view of the exemplary structure along the vertical plane E-E' of FIG. 19B.
Figure 19D:
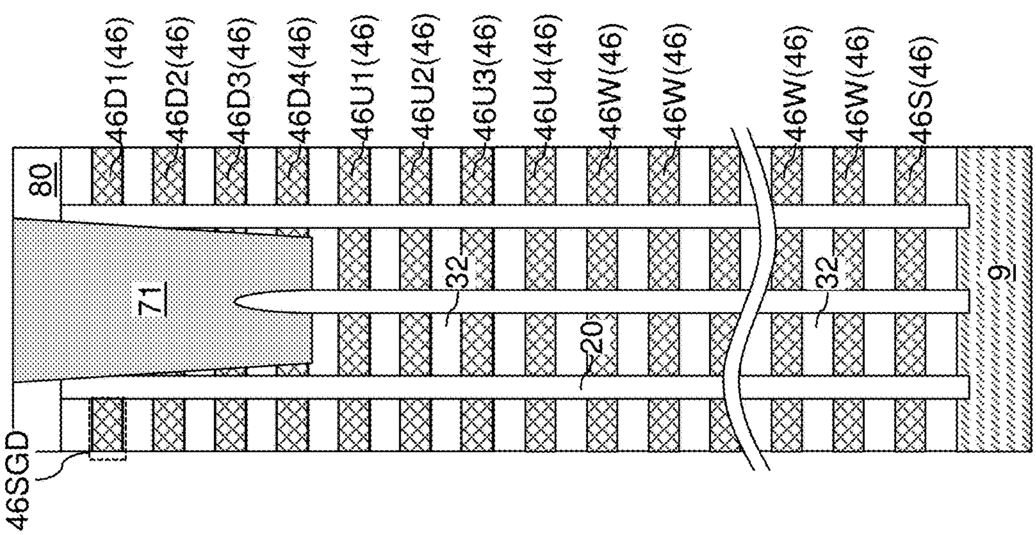
FIG. 19D is a vertical cross-sectional view of the exemplary structure along the vertical plane D-D' of FIG. 19B.
Figure 19C:
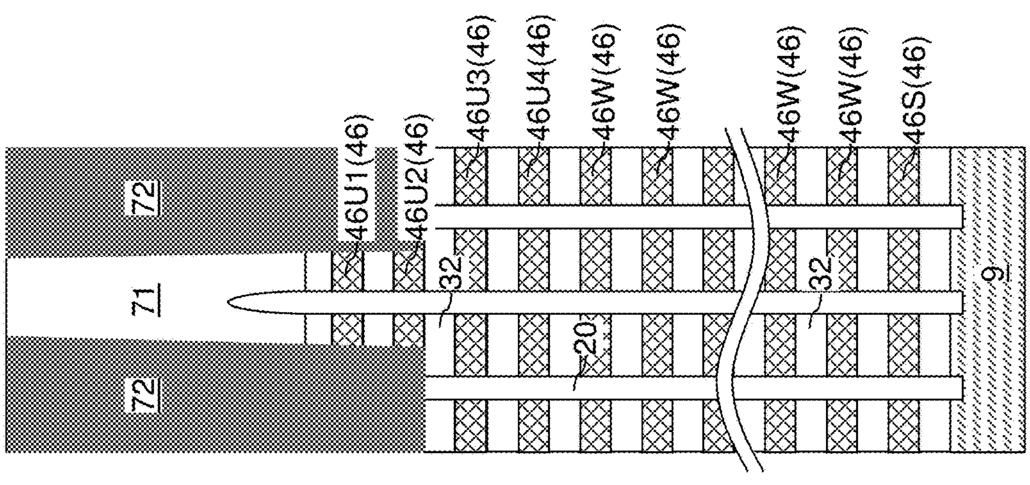
FIG. 19C is a vertical cross-sectional view of the exemplary structure along the vertical plane C-C' of FIG. 19B.
Figure 20A:
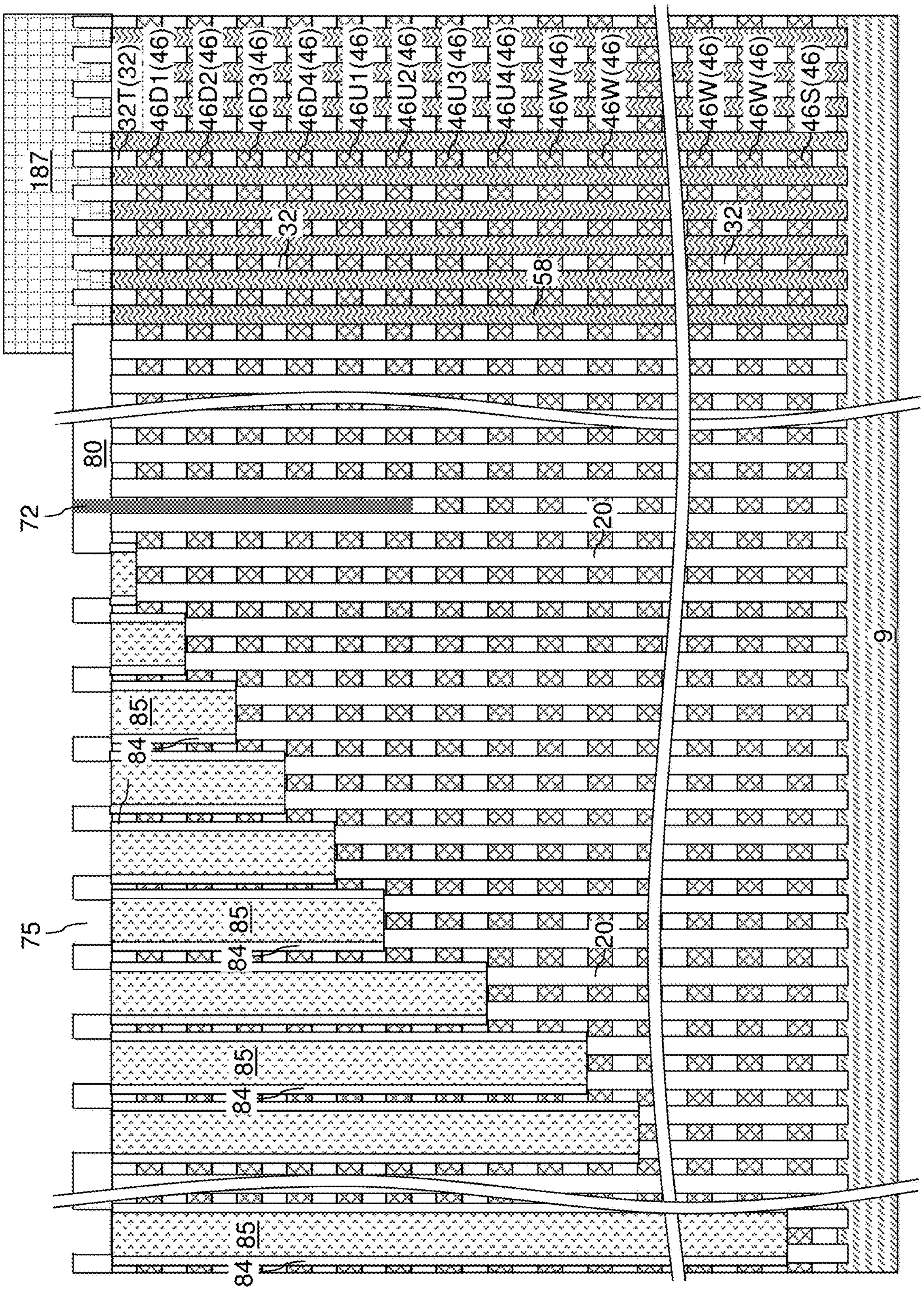
FIG. 20A is a vertical cross-sectional view of the exemplary structure after formation of connection via cavities according to an embodiment of the present disclosure.
Figure 20B:
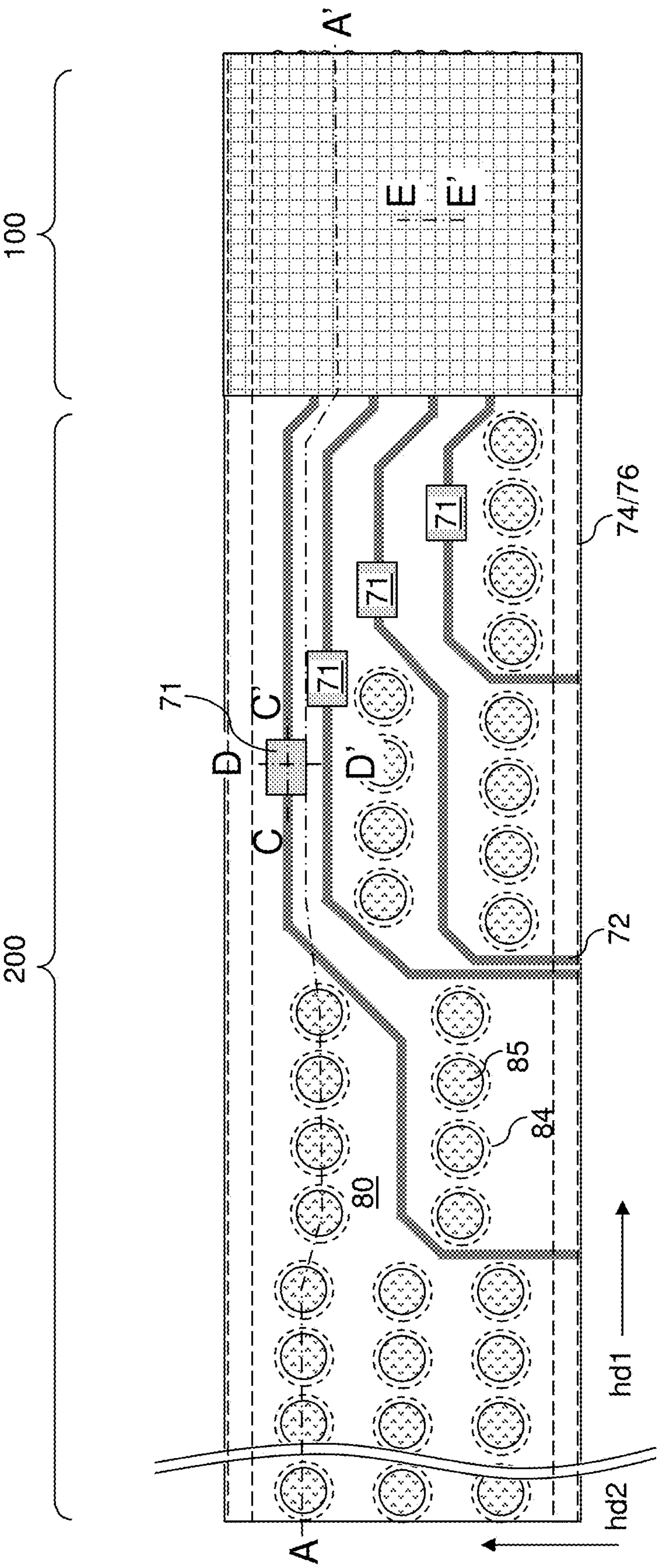
FIG. 20B is a top-down view of the exemplary structure of FIG. 20A. The vertical plane A-A' is the vertical cross-sectional plane of FIG. 20A.
Figure 20E:
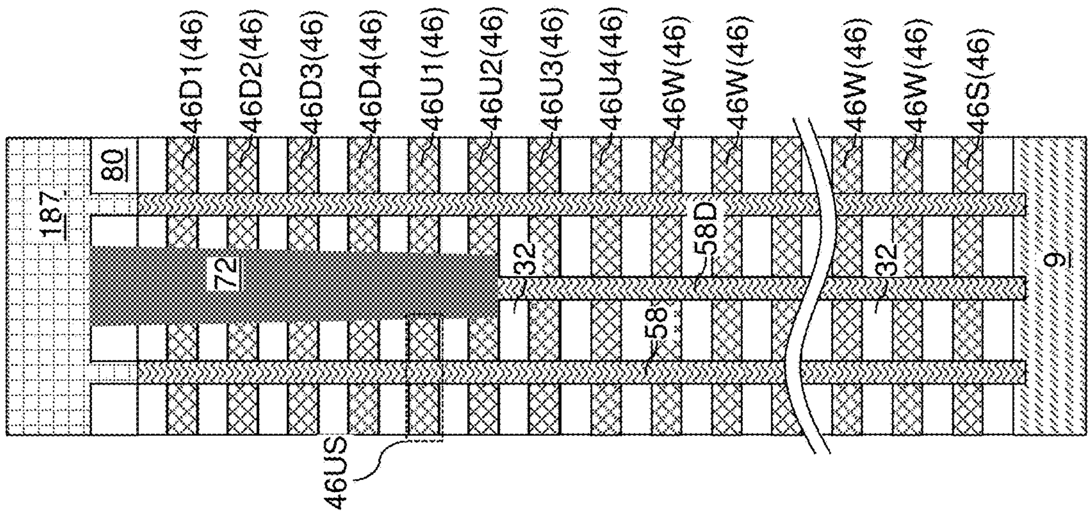
FIG. 20E is a vertical cross-sectional view of the exemplary structure along the vertical plane E-E' of FIG. 20B.
Figure 20D:
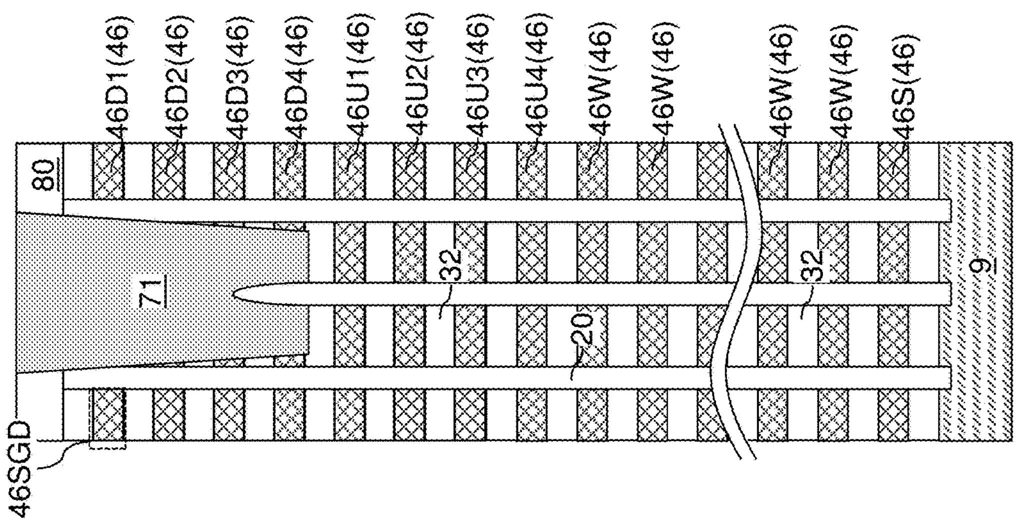
FIG. 20D is a vertical cross-sectional view of the exemplary structure along the vertical plane D-D' of FIG. 20B.
Figure 20C:
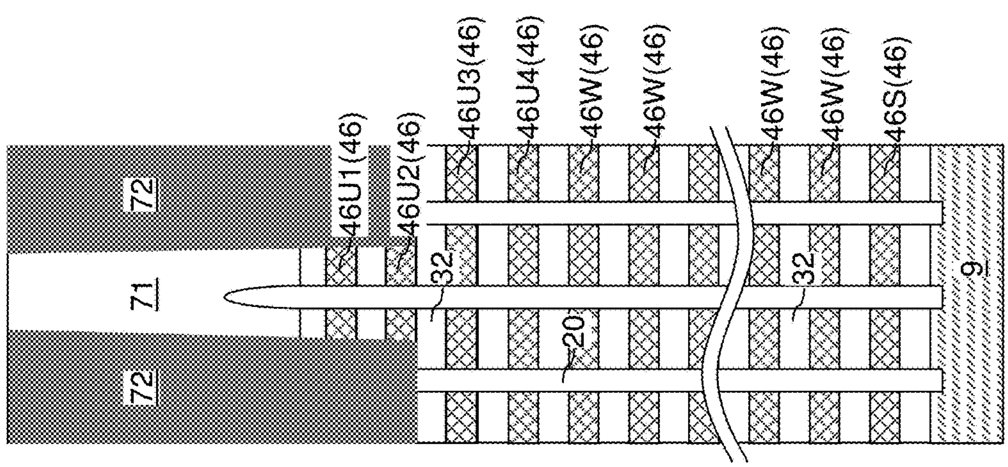
FIG. 20C is a vertical cross-sectional view of the exemplary structure along the vertical plane C-C' of FIG. 20B.

Referring to FIGS. 18A and 18B, a second dielectric fill material can be deposited in the second drain-select-level trenches 22. Excess portions of the second dielectric fill material can be removed from above the horizontal plane including the top surface of the contact-level dielectric layer 80 by a planarization process such as a chemical mechanical polishing process or a recess etch process. Remaining portions of the second dielectric fill material comprise second drain-select-level isolation material portions 72. The second dielectric fill material of the second drain-select-level isolation material portions 72 may comprise a doped silicate glass or an undoped silicate glass. The second dielectric fill material of the second drain-select-level isolation material portions 72 may be the same as or may be different from the first dielectric fill material of the first drain-select-level isolation material portions 71.

The second drain-select-level isolation material portions 72 are formed in the second drain-select-level trenches 22, which may have a shape of line cavities. Each contiguous combination of at least one first drain-select-level isolation material portion 71 and at least one second drain-select-level isolation material portions 72 (such as a plurality of second drain-select-level isolation material portions 72) constitutes a composite drain-select-level isolation structure (71, 72). In one embodiment, each of the composite drain-select-level isolation structures (71, 72) comprises a respective first drain-select-level isolation material portion 71 and a respective set of second drains-select-level isolation material portions 72. In one embodiment, each of the first drain-select-level isolation material portions 71 has a first width along the second horizontal direction hd2, the second drain-select-level isolation material portions 72 have a second width between a respective pair of lengthwise sidewalls, and the first width is greater than the second width.

In one alternative embodiment, the order of the first and second anisotropic etch processes may be reversed. Thus, the steps shown in FIGS. 17A-17E and 18A-18E may be performed prior to the steps shown in FIGS. 15A-15E and 16A-16E.

In one embodiment, each of the composite drain-select-level isolation structures (71, 72) comprises a respective first drain-select-level isolation material portion 71 vertically extending through each of the drain-select-level electrically conductive layers 46D and has a respective bottom surface above a horizontal plane including a top surface of a topmost dummy electrically conductive layer 46U of the dummy electrically conductive layers 46U, and a respective set of second drain-select-level isolation material portions 72 vertically extending through each of the drain-select-level electrically conductive layers 46D and at least the topmost dummy electrically conductive layer 46U.

In one embodiment, segments of the second drain-select-level isolation material portions 72 that adjoin a respective one of the first drain-select-level isolation material portions 71 have a pair of lengthwise sidewall segments that laterally extend along the first horizontal direction hd1. In one embodiment, each of the drain-select-level electrically conductive layers 46D is divided into a respective set of drain-select-level electrically conductive strips 46SGD that are laterally spaced and are electrically isolated from each other by the composite drain-select-level isolation structures (71, 72). In one embodiment, each dummy electrically conductive layer 46U through which the line trenches 22 are formed remains as a respective continuous material layer including a plurality of dummy electrically conductive strips 46US that are interconnected to each other through connecting portions 46C that underlie the first drain-select-level isolation material portions 71.

In one embodiment, each second drain-select-level isolation material portion 72 located in the memory array region 100 may contact top surfaces of a respective row of dummy memory opening fill structures 58D. Generally, each dummy memory opening fill structure 58 may be laterally surrounded by the memory opening fill structures 58 and may have a top surface that contacts a respective one of the second drain-select-level isolation material portions 72 within a horizontal plane including a bottommost surface of the one of the second drain-select-level isolation material portions 72.

In one embodiment, a support pillar structure 20 may vertically extend through each of the word-line-level electrically conductive layers 46W, and may have a top surface located below a horizontal plane including a bottom surface of a topmost dummy electrically conductive layer 46U of the dummy electrically conductive layers 46U. In one embodiment, a topmost surface of the second support pillar structure 20 contacts one of the second drain-select-level isolation material portions 72 within a horizontal plane including a bottommost surface of the one of the second drain-select-level isolation material portions 72.

Referring to FIGS. 19A-19E, a first photoresist layer (not shown) can be applied over the contact-level dielectric layer 80, and can be lithographically patterned to form openings in each area of the memory opening fill structures 58 in the memory array regions 100. An anisotropic etch process can be performed to form openings through the contact-level dielectric layer 80 within areas that are not masked by the photoresist layer. The memory opening fill structures 58. The photoresist layer can be subsequently removed, for example, by ashing. Cylindrical cavities are formed through the contact-level dielectric layer 80. The cylindrical cavities may comprise drain contact via cavities 87 vertically extending through the contact-level dielectric layer 80 down to a top surface of a respective drain region 63. The first photoresist layer can be subsequently removed, for example, by ashing.

Referring to FIGS. 20A-20E, a second photoresist layer 187 can be applied over the contact-level dielectric layer 80, and can be lithographically patterned to form openings in areas that overlap with the in-process process laterally-insulated contact via assemblies (84, 85). An anisotropic etch process can be performed to form openings through the contact-level dielectric layer 80 within areas that are not masked by the photoresist layer. Cylindrical cavities are formed through the contact-level dielectric layer 80 to form connection via cavities 75. A top surface of an in-process process laterally-insulated contact via assemblies (84, 85) is physically exposed at the bottom of each connection via cavity 75.

Alternatively, the drain contact via cavities 87 and the connection via cavities 75 may be formed during the same patterning and etching step using a single photoresist layer (e.g., layer 187). Thus, the separate step shown in FIGS. 19A-19E may be omitted.

Referring to FIGS. 21A-21E an etch process can be performed to remove the sacrificial via structures 85 selective to the materials of the contact-level dielectric layer 80, the tubular insulating spacers 84, and the electrically conductive layers 46. For example, a wet etch process can be performed to remove the sacrificial via structures 85. In an illustrative example, if the sacrificial via structures 85 comprise a semiconductor material such as silicon or a silicon-germanium alloy, a wet etch process employing hot trimethyl-2 hydroxyethyl ammonium hydroxide ("hot TMY") or tetramethyl ammonium hydroxide (TMAH) may be employed. If the sacrificial via structures 85 comprise borosilicate glass, a wet etch process employing dilute hydrofluoric acid may be employed. Alternatively, if the sacrificial via structures 85 comprise a carbon-based material such as amorphous carbon or diamond-like carbon, an ashing process may be employed to sacrificial via structures 85. In case backside blocking dielectric layers 44 are present around the electrically conductive layers 46, an isotropic etch process may be performed to remove physically exposed portions of the backside blocking dielectric layers 44 underneath each layer cavity formed by removal of the sacrificial via structures 85. Layer contact via cavities can be formed in each combination of a volume from which a sacrificial via structure 85 is removed and a volume of an overlying connection via cavity 75. A top surface of a word-line-level electrically conductive layer 46W can be physically exposed underneath each layer contact via cavity. The second photoresist layer 187 can be subsequently removed, for example, by ashing.

At least one metallic material can be deposited in the layer contact via cavities 75 and the drain contact via cavities 87. In one embodiment, the at least one metallic material may comprise a metallic barrier liner material such as TiN, TaN, WN, or MoN, and a metallic fill material such as W, Ti, Ta, Mo, Co, or Ru. Each of the metallic barrier liner material and the metallic fill material may be deposited by physical vapor deposition, chemical vapor deposition, or a combination thereof. The thickness of the metallic barrier material as measured at an interface with a respective underlying conductive material portion may be in a range from 2 nm to 40 nm, although lesser and greater thicknesses may also be employed. A predominant portion of the metallic fill material in the contact via cavities may be deposited employing a conformal deposition process such as a chemical vapor deposition process. Excess portions of the at least one metallic material can be removed from above the horizontal plane including the top surface of the contact-level dielectric layer 80.

Remaining portions of the at least one metallic material comprise contact via structures (88, 86). The contact via structures (88, 86) may comprise drain contact via structures 88 that are formed in the drain contact via cavities 87 directly on a top surface of a respective drain region 63 in a respective memory opening fill structure 58. The contact via structures (88, 86) may also comprise layer contact via structures 86 formed within a respective layer contact via cavity 75 and contacting a top surface of a respective one of the electrically conductive layers 46.

The layer contact via structures 86 may comprise at least one source-select-level contact via structure 86S contacting a top surface of the source-select-level electrically conductive layer(s) 46S, word-line-level contact via structures 86W contacting a top surface of a respective word-line-level electrically conductive layer 46W, dummy-level contact via structures 86U contacting a top surface of a respective dummy electrically conductive layer 46U, and drain-select-level contact via structures 86D contacting a top surface of a respective drain-select-level electrically conductive strip (i.e., drain side select gate electrode) 46SGD of a respective one of the drain-select-level electrically conductive layers 46D. The tubular insulating spacers 84 may comprise at least one source-select-level tubular insulating spacer 84S laterally surrounding the at least one source-select-level contact via structure 86S, word-line-level tubular insulating spacers 84W laterally surrounding a respective one of the word-line-level contact via structures 86W, dummy-level electrode tubular insulating spacer 84U laterally surrounding a respective one of the dummy-level contact via structures 86U, and drain-select-level tubular insulating spacers 84D laterally surrounding a respective one of the drain-select-level contact via structures 86D.

Each contiguous combination of a tubular insulating spacer 84 and a layer contact via structure 86 constitutes a laterally-insulated contact via assembly 8. Thus, the in-process laterally-insulated contact via assemblies (84, 85) are converted into laterally-insulated contact via assemblies 8 by replacing the sacrificial via structures 85 with layer contact via structures 86. The laterally-insulated contact via assemblies 8 include at least one source-select-level laterally-insulated contact via assembly 8S, word-line-level laterally-insulated contact via assemblies 8W, dummy-level laterally-insulated contact via assemblies 8U, and drain-select-level laterally-insulated contact via assemblies 8D. The at least one source-select-level laterally-insulated contact via assembly 8S includes a combination of a source-select-level tubular insulating spacer 84S and a source-select-electrode contact via structure 86S. The word-line-level laterally-insulated contact via assemblies 8W include a respective combination of a word-line-level tubular insulating spacer 84S and a respective word-line-level contact via structure 86W. The dummy-level laterally-insulated contact via assemblies 8U include a respective combination of a dummy-level tubular insulating spacer 84U and a respective dummy-level contact via structure 86U. The drain-select-level laterally-insulated contact via assemblies 8D include a respective combination of a drain-select-level tubular insulating spacer 84D and a respective drain-select-level contact via structure 86D.

Figure 21A:
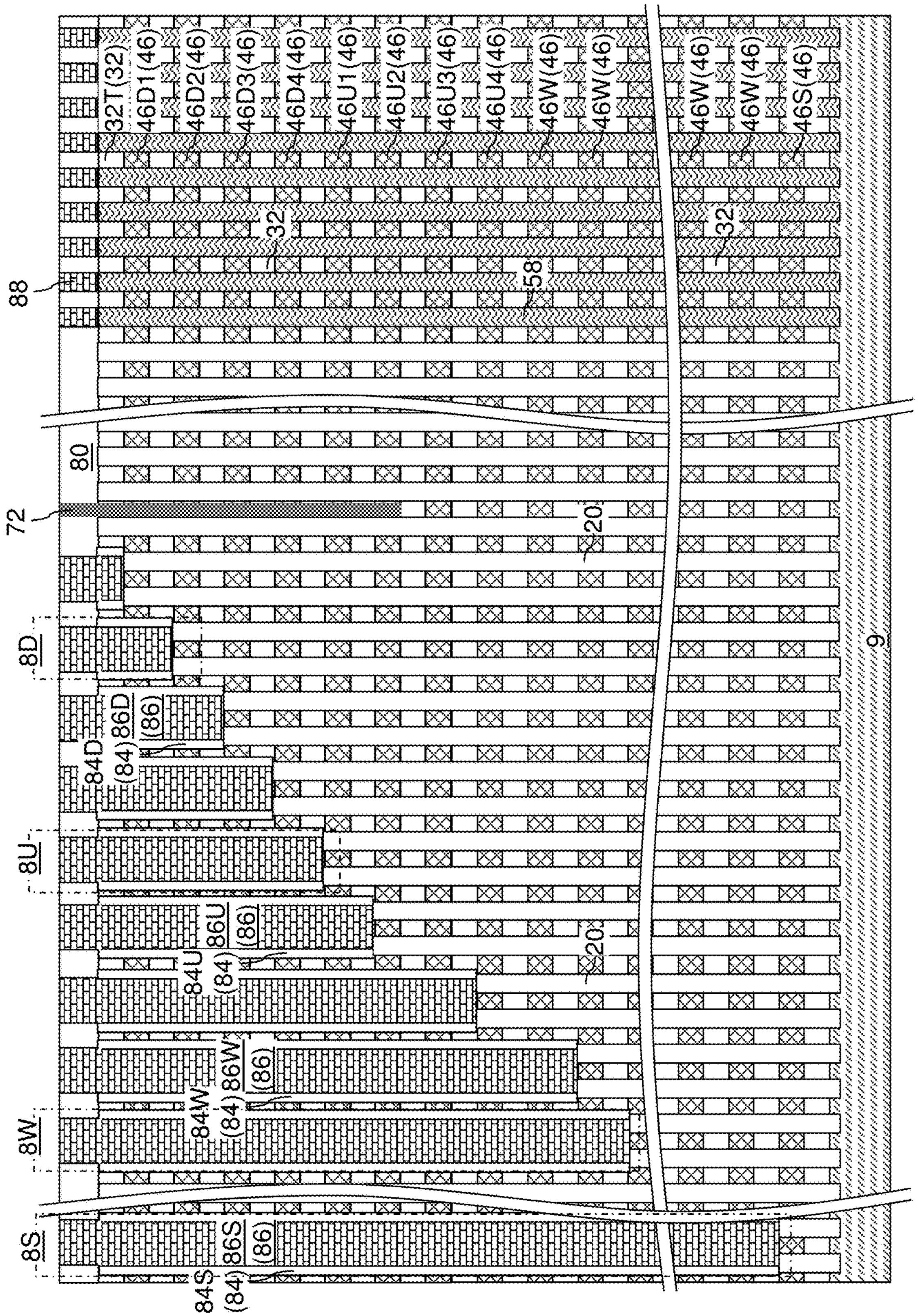
FIG. 21A is a vertical cross-sectional view of the exemplary structure after formation of various contact via structures according to an embodiment of the present disclosure.
Figure 21B:
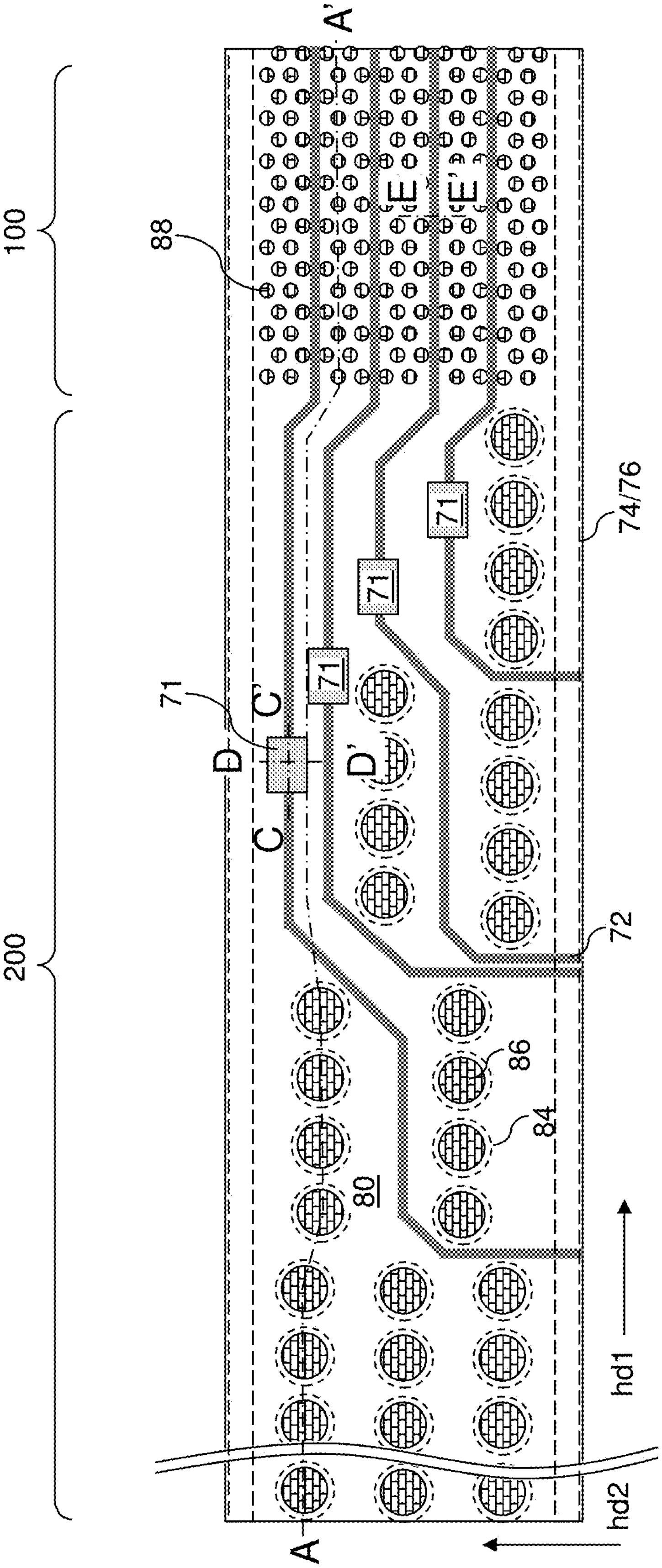
FIG. 21B is a top-down view of the exemplary structure of FIG. 21A. The vertical plane A-A' is the vertical cross-sectional plane of FIG. 21A.
Figure 21E:
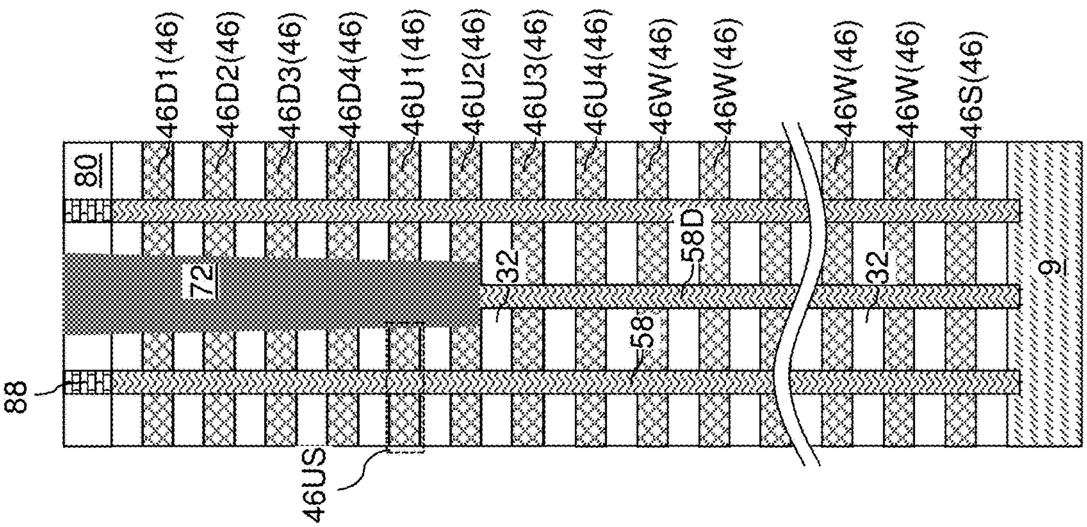
FIG. 21E is a vertical cross-sectional view of the exemplary structure along the vertical plane E-E' of FIG. 21B.
Figure 21D:
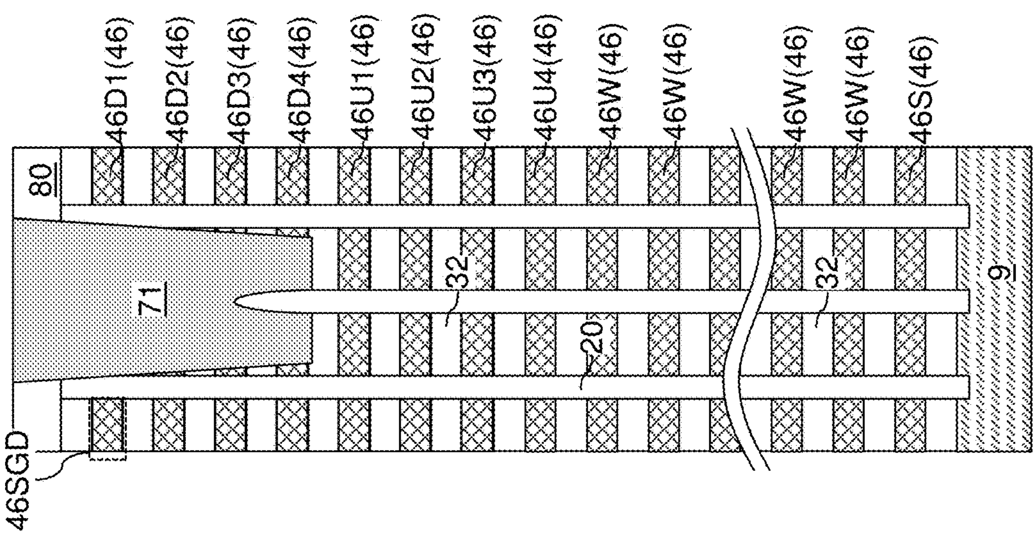
FIG. 21D is a vertical cross-sectional view of the exemplary structure along the vertical plane D-D' of FIG. 21B.
Figure 21C:
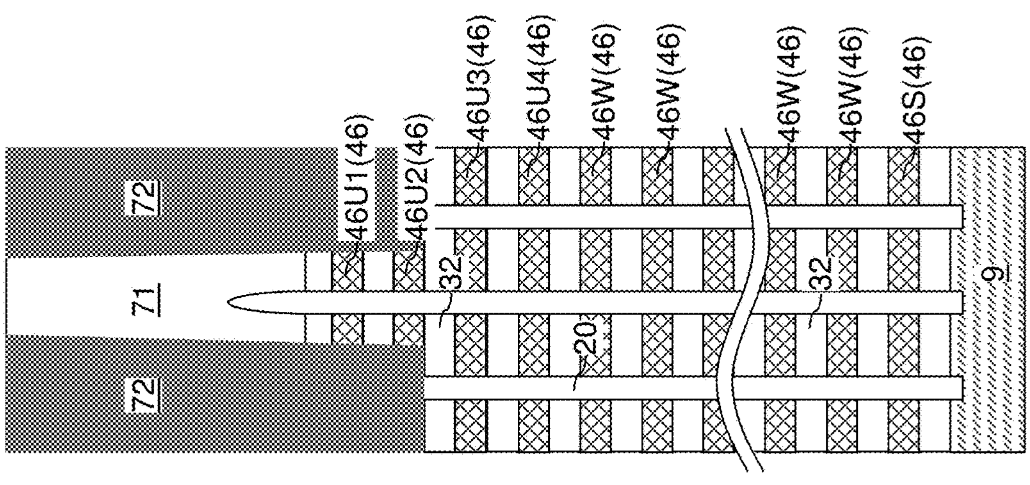
FIG. 21C is a vertical cross-sectional view of the exemplary structure along the vertical plane C-C' of FIG. 21B.
Figure 21G:
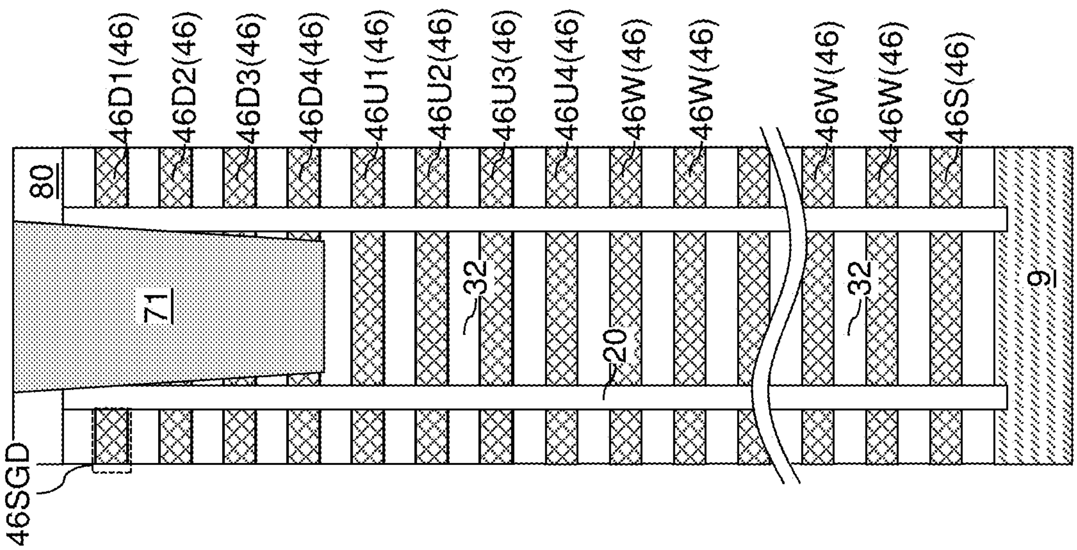
FIG. 21G is a vertical cross-sectional view of the alternative embodiment of the exemplary structure along the vertical plane D-D' of FIG. 21B.
Figure 21F:
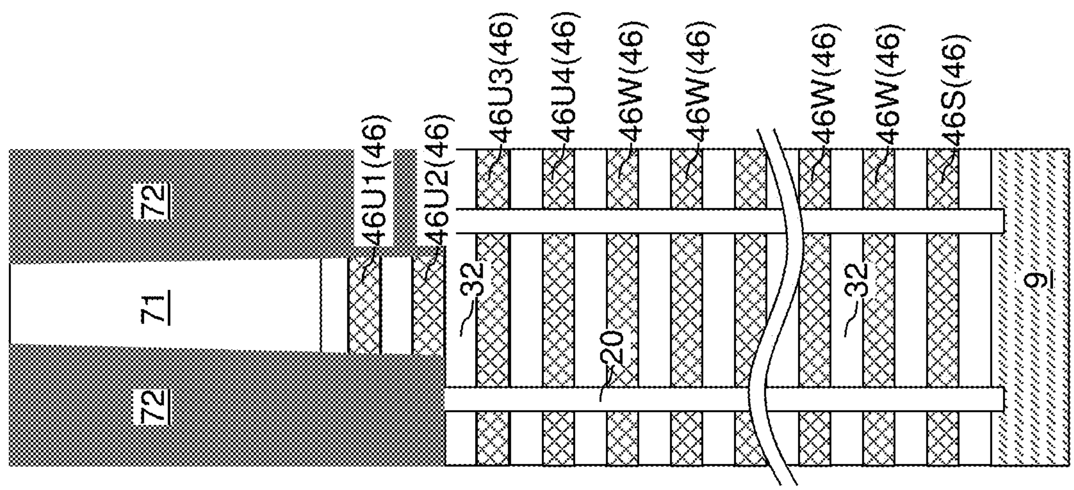
FIG. 21F is a vertical cross-sectional view of an alternative embodiment of the exemplary structure along the vertical plane C-C' of FIG. 21B.

In one alternative embodiment shown in FIGS. 21F and 21G, the first support pillar structures 20 located below first drain-select-level isolation material portions 71 are omitted to simplify the first etching process shown in FIGS. 15A-15E.

Figure 22:
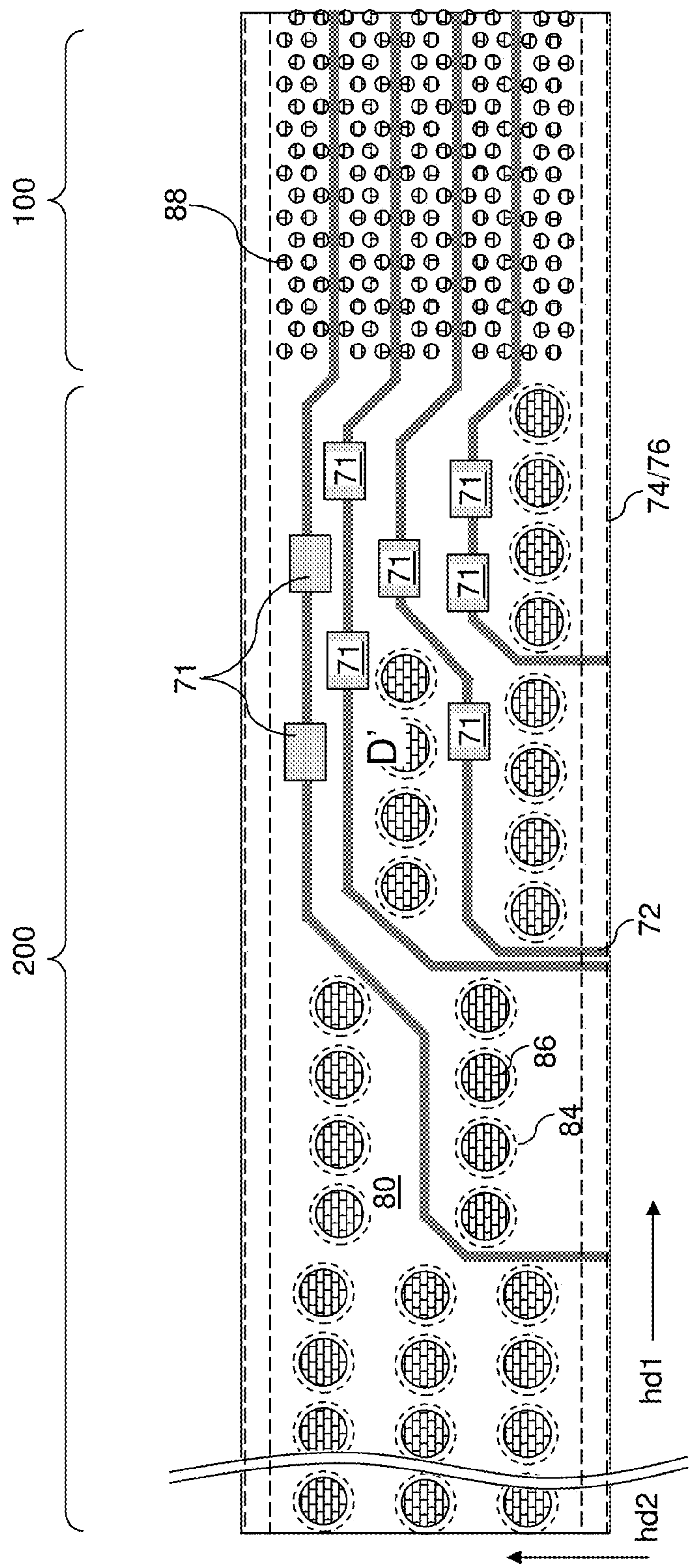
FIG. 22 is a top-down view of the exemplary structure of FIG. 21A according to another alternative embodiment.

In another alternative embodiment shown in FIG. 22, additional drain-select-level isolation material portions 71 are provided between segments of the second drain-select-level isolation material portions 72. Connection portions 46C of the dummy electrically conductive layers 46U underly each of the first drain-select-level isolation material portions 71. Thus, adjacent portions (e.g., 46US) of the dummy electrically conductive layers 46U are electrically connected by two or more connection portions 46C in this alternative embodiment.

Referring to all drawings and according to various embodiments of the present disclosure, a three-dimensional memory device is provided, which comprises: an alternating stack (32, 46) of insulating layers 32 and electrically conductive layers 46 that is laterally bounded by a first backside trench fill structure (74, 76) and a second backside trench fill structure (74, 76), wherein the electrically conductive layers 46 comprise, from bottom to top, word-line-level electrically conductive layers 46W, dummy electrically conductive layers 46U, and drain-select-level electrically conductive layers 46D comprising a respective plurality of drain-select-level electrically conductive strips that are laterally spaced apart by composite drain-select-level isolation structures (71, 72); memory openings 49 vertically extending through the alternating stack (32, 46); and memory opening fill structures 58 located within a respective one of the memory openings 49 and comprising a respective vertical semiconductor channel 60 and a respective vertical stack of memory elements, wherein each of the composite drain-select-level isolation structures (71, 72) comprises: a respective first drain-select-level isolation material portion 71 that vertically extends through each of the drain-select-level electrically conductive layers 46D and has a respective bottom surface above a horizontal plane including a top surface of a topmost dummy electrically conductive layer 46U among the dummy electrically conductive layers 46U; and a respective set of second drain-select-level isolation material portions 72 vertically extending through each of the drain-select-level electrically conductive layers 46D and at least the topmost dummy electrically conductive layer 46U.

In one embodiment, at least the topmost dummy electrically conductive layer 46U comprises dummy electrically conductive strips 46US that are laterally separated by the second drain-select-level isolation material portions 72 and that are interconnected to each other through at least one respective electrically conductive connecting portion 46C that underlies the respective first drain-select-level isolation material portion 71.

In one embodiment, the first backside trench fill structure (74, 76) and the second backside trench fill structure (74, 76) vertically extend from a bottommost layer of the alternating stack (32, 46) to a topmost layer of the alternating stack (32, 46), laterally extend along a first horizontal direction hd1, and are laterally spaced apart from each other along a second horizontal direction hd2. In one embodiment, these structures may be laterally spaced apart by a uniform lateral spacing.

In one embodiment, each of the first drain-select-level isolation material portions 71 has a first width along the second horizontal direction hd2; the second drain-select-level isolation material portions 72 have a second width between a respective pair of lengthwise sidewalls; and the first width is greater than the second width. In one embodiment, segments of the second drain-select-level isolation material portions 72 that adjoin a respective one of the first drain-select-level isolation material portions 71 have a pair of lengthwise sidewall segments that laterally extend along the first horizontal direction hd1.

In one embodiment, the memory opening fill structures 58 are arranged as rows of memory opening fill structures 58 arranged along a first horizontal direction hd1 that is parallel to a lengthwise direction of the first backside trench fill structure (74, 76) and the second backside trench fill structure (74, 76); and a subset of the second drain-select-level isolation material portions 72 laterally extends along the first horizontal direction hd1 between a respective neighboring pair of rows of memory opening fill structures 58. In one embodiment, each of the composite drain-select-level isolation structures (71, 72) comprises a plurality of laterally-extending portions that laterally-extend along the first horizontal direction hd1 and are laterally offset from each other along a second horizontal direction hd2 that is perpendicular to the first horizontal direction hd1.

In one embodiment, the memory opening fill structures 58 are located within a memory array region 100; and the second drain-select-level isolation structures 72 laterally extend through the memory array region 100 and into a contact region 200 which contains contact via structures 86 that contact a respective one of the electrically conductive layers 46. The second drain-select-level isolation material portions 72 are located only in the contact region 200 but not in the memory array region 100. In the memory array region 100, the second drain-select-level isolation material portions 72 only laterally extend straight along the first horizontal direction (e.g., word line direction) hd1. However, in the contact region 200, the second drain-select-level isolation material portions 72 laterally extend partially along the first horizontal direction hd1 and partially along a direction which is not parallel to the first horizontal direction hd1. In one embodiment, the second drain-select-level isolation material portions 72 may laterally extend along the second horizontal direction (e.g., bit line direction) h2 and/or along any direction between the first and the second horizontal directions to electrically isolate the drain side select gate electrodes in each NAND memory string “finger”.

In one embodiment, the three-dimensional memory device comprises a first support pillar structure 20 vertically extending through each of the word-line-level electrically conductive layers 46W and the dummy electrically conductive layers 46U and protruding into one of the first drain-select-level isolation material portions 71. In one embodiment, a topmost surface of the first support pillar structure 20 is located below a horizontal plane including top surfaces of the first drain-select-level isolation material portions 71 and above a horizontal plane including bottom surfaces of the first drain-select-level isolation material portions 71.

In one embodiment, the three-dimensional memory device comprises a second support pillar structure 20 vertically extending through each of the word-line-level electrically conductive layers 46W and having a top surface located below a horizontal plane including a bottom surface of a topmost dummy electrically conductive layer 46U among the dummy electrically conductive layers 46U. In one embodiment, a topmost surface of the second support pillar structure 20 contacts one of the second drain-select-level isolation material portions 72 within a horizontal plane including a bottommost surface of the one of the second drain-select-level isolation material portions 72. In one embodiment, the three-dimensional memory device comprises a dummy memory opening fill structure 58D that is laterally surrounded by the memory opening fill structures 58 and having a top surface that contacts one of the second drain-select-level isolation material portions 72 within a horizontal plane including a bottommost surface of the one of the second drain-select-level isolation material portions 72.

In one embodiment, the three-dimensional memory device comprises drain-select-level laterally-insulated contact via assemblies 8D comprising a respective drain-select-level contact via structure 86D that is laterally surrounded by a respective drain-select-level tubular insulating spacer 84D and contacts a top surface of a respective drain-select-level electrically conductive strip among the drain-select-level electrically conductive strips of the drain-select-level electrically conductive layers 46D. In one embodiment, the three-dimensional memory device comprises word-line-level laterally-insulated contact via assemblies 8W comprising a respective word-line-level contact via structure 86D that is laterally surrounded by a respective word-line-level tubular insulating spacer 84W and contacts a top surface of a respective word-line-level electrically conductive layer 46W among the word-line-level electrically conductive layers 46W.

The various embodiments of the present disclosure may be employed to provide composite drain-select-level isolation structures (71, 72) that can be formed with a narrow width in the memory array region 100 while ensuring that each of the dummy electrically conductive layers 46U is formed as a respective single continuous structure laterally extending throughout the memory block located between a pair of backside trench fill structures (74, 76). Each of the drain-select-level electrically conductive strips (i.e., the drain side select gate electrodes) 46SGD of the respective drain-select-level electrically conductive layer 46D may be formed as discrete structures that are electrically isolated from each other by the composite drain-select-level isolation structures (71, 72). The composite drain-select-level isolation structures (71, 72) are formed in dual-depth configurations in which the second drain-select-level isolation material portions 72 have a greater depth than the first drain-select-level isolation material portions 71. Connection portions 46C of the dummy electrically conductive layers 46U underlying the first drain-select-level isolation material portions 71 ensures that each of the dummy electrically conductive layers 46U is formed as a continuous structure in the memory block irrespective of the depth variations of the bottom surfaces of the second drain-select-level isolation material portions 72 in the composite drain-select-level isolation structures (71, 72). Thus, portions (e.g., 46US) of the dummy electrically conductive layers 46U are not left floating during operation of the memory device. Furthermore, the length of the contact regions 200 may be reduced by using the composite drain-select-level isolation structures (71, 72). This increases the device bit density (i.e., permits increased area for the memory array regions 100).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

an alternating stack of insulating layers and electrically conductive layers that is laterally bounded by a first backside trench fill structure and a second backside trench fill structure, wherein the electrically conductive layers comprise, from bottom to top, word-line-level electrically conductive layers, dummy electrically conductive layers, and drain-select-level electrically conductive layers comprising a respective plurality of drain-select-level electrically conductive strips that are laterally spaced apart by composite drain-select-level isolation structures;

memory openings vertically extending through the alternating stack; and memory opening fill structures located within a respective one of the memory openings and comprising a respective vertical semiconductor channel and a respective vertical stack of memory elements, wherein each of the composite drain-select-level isolation structures comprises:

a respective first drain-select-level isolation material portion that vertically extends through each of the drain-select-level electrically conductive layers and has a respective bottom surface above a horizontal plane including a top surface of a topmost dummy electrically conductive layer of the dummy electrically conductive layers; and a respective set of second drain-select-level isolation material portions vertically extending through each of the drain-select-level electrically conductive layers and through at least the topmost dummy electrically conductive layer; and wherein at least the topmost dummy electrically conductive layer comprises dummy electrically conductive strips that are laterally separated by the second drain-select-level isolation material portions and that are interconnected to each other through at least one respective electrically conductive connecting portion that underlies the respective first drain-select-level isolation material portion.

2. A three-dimensional memory device, comprising:

an alternating stack of insulating layers and electrically conductive layers that is laterally bounded by a first backside trench fill structure and a second backside trench fill structure, wherein the electrically conductive layers comprise, from bottom to top, word-line-level electrically conductive layers, dummy electrically conductive layers, and drain-select-level electrically conductive layers comprising a respective plurality of drain-select-level electrically conductive strips that are laterally spaced apart by composite drain-select-level isolation structures;

memory openings vertically extending through the alternating stack; and memory opening fill structures located within a respective one of the memory openings and comprising a respective vertical semiconductor channel and a respective vertical stack of memory elements, wherein each of the composite drain-select-level isolation structures comprises:

a respective first drain-select-level isolation material portion that vertically extends through each of the drain-select-level electrically conductive layers and has a respective bottom surface above a horizontal plane including a top surface of a topmost dummy electrically conductive layer of the dummy electrically conductive layers; and a respective set of second drain-select-level isolation material portions vertically extending through each of the drain-select-level electrically conductive layers and through at least the topmost dummy electrically conductive layer; and wherein:

the memory opening fill structures are located within a memory array region;

the second drain-select-level isolation material portions laterally extend through the memory array region and into a contact region which contains contact via structures that contact a respective one of the electrically conductive layers;

the first drain-select-level isolation material portions are located only in the contact region but not in the memory array region;

in the memory array region, the second drain-select-level isolation material portions only laterally extend straight along the first horizontal direction; and in the contact region, the second drain-select-level isolation material portions laterally extend partially along the first horizontal direction and partially along a direction which is not parallel to the first horizontal direction.

3. A three-dimensional memory device, comprising:

an alternating stack of insulating layers and electrically conductive layers that is laterally bounded by a first backside trench fill structure and a second backside trench fill structure, wherein the electrically conductive layers comprise, from bottom to top, word-line-level electrically conductive layers, dummy electrically conductive layers, and drain-select-level electrically conductive layers comprising a respective plurality of drain-select-level electrically conductive strips that are laterally spaced apart by composite drain-select-level isolation structures;

memory openings vertically extending through the alternating stack; and memory opening fill structures located within a respective one of the memory openings and comprising a respective vertical semiconductor channel and a respective vertical stack of memory elements, wherein each of the composite drain-select-level isolation structures comprises:

a respective first drain-select-level isolation material portion that vertically extends through each of the drain-select-level electrically conductive layers and has a respective bottom surface above a horizontal plane including a top surface of a topmost dummy electrically conductive layer of the dummy electrically conductive layers; and a respective set of second drain-select-level isolation material portions vertically extending through each of the drain-select-level electrically conductive layers and through at least the topmost dummy electrically conductive layer; and further comprising a first support pillar structure vertically extending through each of the word-line-level electrically conductive layers and the dummy electrically conductive layers and protruding into one of the first drain-select-level isolation material portions.

4. The three-dimensional memory device of claim 3, wherein a topmost surface of the first support pillar structure has a convex shape and is located below a horizontal plane including top surfaces of the first drain-select-level isolation material portions and above a horizontal plane including bottom surfaces of the first drain-select-level isolation material portions.

5. The three-dimensional memory device of claim 4, further comprising a second support pillar structure vertically extending through each of the word-line-level electrically conductive layers and having a top surface located below a horizontal plane including a bottom surface of a topmost dummy electrically conductive layer of the dummy electrically conductive layers.

6. The three-dimensional memory device of claim 5, wherein a topmost surface of the second support pillar structure contacts one of the second drain-select-level isolation material portions within a horizontal plane including a bottommost surface of the one of the second drain-select-level isolation material portions.

7. The three-dimensional memory device of claim 4, further comprising a dummy memory opening fill structure that is laterally surrounded by the memory opening fill structures and having a top surface that contacts one of the second drain-select-level isolation material portions within a horizontal plane including a bottommost surface of the one of the second drain-select-level isolation material portions.

* * * * *